(12) United States Patent
Anthony

(10) Patent No.: US 7,274,549 B2
(45) Date of Patent: Sep. 25, 2007

(54) ENERGY PATHWAY ARRANGEMENTS FOR ENERGY CONDITIONING

(75) Inventor: William M. Anthony, Erie, PA (US)

(73) Assignee: X2Y Attenuators, LLC, Erie, PA (US)

( * ) Notice: Subject to any disclaimer, the term of this patent is extended or adjusted under 35 U.S.C. 154(b) by 547 days.

(21) Appl. No.: 10/433,482

(22) PCT Filed: Dec. 17, 2001

(86) PCT No.: PCT/US01/48861

§ 371 (c)(1),
(2), (4) Date: Jun. 12, 2003

(87) PCT Pub. No.: WO02/065606

PCT Pub. Date: Aug. 22, 2002

(65) Prior Publication Data

US 2004/0130840 A1    Jul. 8, 2004

Related U.S. Application Data

(63) Continuation-in-part of application No. 09/996,355, filed on Nov. 29, 2001, now abandoned, which is a continuation-in-part of application No. 10/003,711, filed on Nov. 15, 2001, now abandoned, which is a continuation-in-part of application No. 09/982,553, filed on Oct. 17, 2001, now abandoned.

(60) Provisional application No. 60/310,962, filed on Aug. 8, 2001, provisional application No. 60/302,429, filed on Jul. 2, 2001, provisional application No. 60/280,819, filed on Apr. 2, 2001, provisional application No. 60/255,818, filed on Dec. 15, 2000.

(51) Int. Cl.
    *H02H 3/22* (2006.01)
(52) U.S. Cl. ............. 361/111; 361/56; 361/58; 361/118
(58) Field of Classification Search ............. 174/35 R; 361/111, 56, 58, 118
    See application file for complete search history.

(56) References Cited

U.S. PATENT DOCUMENTS 3,240,621 A    3/1966    Flower, Jr. et al.

(Continued)

FOREIGN PATENT DOCUMENTS

DE    197 28 692 A1    1/1999

(Continued)

OTHER PUBLICATIONS

Pending claims 1-40 and figures (3 pages) for U.S. Appl. No. 10/399,590, the specification is contained in WO 02/33798, filed Oct. 17, 2001, which is the published version of PCT/US01/32480, which is Neifeld Reference: X2Y A0015UPCT-US, which is reference F-063 in the Information Disclosure Statement filed Apr. 23, 2004.

(Continued)

*Primary Examiner*—Hung V. Ngo
(74) *Attorney, Agent, or Firm*—Neifeld IP Law, PC

(57) ABSTRACT

Compact and integral arrangements for an energy-conditioning arrangement having various predetermined energy pathways utilized in part for the purpose of conditioning energies of either one or multiple of circuitry. Some energy-conditioning arrangement variants can be operable to provide multiple, energy-conditioning operations.

25 Claims, 13 Drawing Sheets

U.S. PATENT DOCUMENTS

| | | |
|---|---|---|
| 3,343,034 A | 9/1967 | Ovshinsky |
| 3,573,677 A | 4/1971 | Detar |
| 3,742,420 A | 6/1973 | Harnden, Jr. |
| 3,790,858 A | 2/1974 | Brancaleone et al. |
| 3,842,374 A | 10/1974 | Schlicke |
| 4,023,071 A | 5/1977 | Fussell |
| 4,119,084 A * | 10/1978 | Eckels .................. 126/628 |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,612,140 A | 9/1986 | Mandai |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,712,540 A | 12/1987 | Takamine |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Okubo |
| 4,789,847 A | 12/1988 | Sakamoto et al. |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,378,407 A | 1/1995 | Chandler et al. |
| 5,382,928 A | 1/1995 | Davis et al. |
| 5,382,938 A | 1/1995 | Hansson et al. |
| 5,396,201 A | 3/1995 | Ishizaki et al. |
| 5,401,952 A | 3/1995 | Sugawa |
| 5,405,466 A | 4/1995 | Naito et al. |
| 5,414,393 A | 5/1995 | Rose et al. |
| 5,414,587 A | 5/1995 | Kiser et al. |
| 5,420,553 A | 5/1995 | Sakamoto et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,471,035 A | 11/1995 | Holmes |
| 5,477,933 A | 12/1995 | Nguyen |
| 5,481,238 A | 1/1996 | Carsten et al. |
| 5,483,407 A | 1/1996 | Anastasio et al. |
| 5,488,540 A | 1/1996 | Hatta |
| 5,491,299 A | 2/1996 | Naylor et al. |
| 5,493,260 A | 2/1996 | Park |
| 5,495,180 A | 2/1996 | Huang et al. |
| 5,500,629 A | 3/1996 | Meyer |
| 5,500,785 A | 3/1996 | Funada |

| Patent | Date | Inventor |
|---|---|---|
| 5,512,196 A | 4/1996 | Mantese et al. |
| 5,531,003 A | 7/1996 | Seifried et al. |
| 5,534,837 A | 7/1996 | Brandt |
| 5,535,101 A | 7/1996 | Miles et al. |
| 5,536,978 A | 7/1996 | Cooper et al. |
| 5,541,482 A | 7/1996 | Siao |
| 5,544,002 A | 8/1996 | Iwaya et al. |
| 5,546,058 A | 8/1996 | Azuma et al. |
| 5,548,255 A | 8/1996 | Spielman |
| 5,555,150 A | 9/1996 | Newman, Jr. |
| 5,568,348 A | 10/1996 | Foreman et al. |
| 5,570,278 A | 10/1996 | Cross |
| 5,583,359 A | 12/1996 | Ng et al. |
| 5,586,007 A | 12/1996 | Funada |
| 5,592,391 A | 1/1997 | Muyshondt et al. |
| 5,612,657 A | 3/1997 | Kledzik |
| 5,614,881 A | 3/1997 | Duggal et al. |
| 5,619,079 A | 4/1997 | Wiggins et al. |
| 5,624,592 A | 4/1997 | Paustian |
| 5,640,048 A | 6/1997 | Selna |
| 5,645,746 A | 7/1997 | Walsh |
| 5,647,766 A | 7/1997 | Nguyen |
| 5,668,511 A | 9/1997 | Furutani et al. |
| 5,682,303 A | 10/1997 | Goad |
| 5,700,167 A | 12/1997 | Pharney et al. |
| 5,708,553 A | 1/1998 | Hung |
| 5,719,450 A | 2/1998 | Vora |
| 5,719,477 A | 2/1998 | Tomihari |
| 5,719,750 A | 2/1998 | Iwane |
| 5,751,539 A | 5/1998 | Stevenson et al. |
| 5,767,446 A | 6/1998 | Ha et al. |
| 5,789,999 A | 8/1998 | Barnett et al. |
| 5,790,368 A | 8/1998 | Naito et al. |
| 5,796,568 A | 8/1998 | Baiatu |
| 5,796,595 A | 8/1998 | Cross |
| 5,797,770 A | 8/1998 | Davis et al. |
| 5,808,873 A | 9/1998 | Celaya et al. |
| 5,825,628 A | 10/1998 | Garbelli et al. |
| 5,828,093 A | 10/1998 | Naito et al. |
| 5,828,272 A | 10/1998 | Romerein et al. |
| 5,828,555 A | 10/1998 | Itoh |
| 5,831,489 A | 11/1998 | Wire |
| 5,834,992 A | 11/1998 | Kato et al. |
| 5,838,216 A | 11/1998 | White et al. |
| 5,867,361 A | 2/1999 | Wolf et al. |
| 5,870,272 A | 2/1999 | Seifried et al. |
| 5,875,099 A | 2/1999 | Maesaka et al. |
| 5,880,925 A | 3/1999 | DuPre et al. |
| 5,889,445 A | 3/1999 | Ritter et al. |
| 5,895,990 A | 4/1999 | Lau |
| 5,898,403 A | 4/1999 | Saitoh et al. |
| 5,898,562 A | 4/1999 | Cain et al. |
| 5,905,627 A | 5/1999 | Brendel et al. |
| 5,907,265 A | 5/1999 | Sakuragawa et al. |
| 5,908,151 A | 6/1999 | Elias |
| 5,909,155 A | 6/1999 | Anderson et al. |
| 5,909,350 A | 6/1999 | Anthony |
| 5,910,755 A | 6/1999 | Mishiro et al. |
| 5,912,809 A | 6/1999 | Steigerwald et al. |
| 5,917,388 A | 6/1999 | Tronche et al. |
| 5,926,377 A | 7/1999 | Nakao et al. |
| 5,928,076 A | 7/1999 | Clements et al. |
| 5,955,930 A | 9/1999 | Anderson et al. |
| 5,959,829 A | 9/1999 | Stevenson et al. |
| 5,959,846 A | 9/1999 | Noguchi et al. |
| 5,969,461 A | 10/1999 | Anderson et al. |
| 5,977,845 A | 11/1999 | Kitahara |
| 5,978,231 A | 11/1999 | Tohya et al. |
| 5,980,718 A | 11/1999 | Van Konynenburg et al. |
| 5,995,352 A | 11/1999 | Gumley |
| 5,999,067 A | 12/1999 | D'Ostilio |
| 5,999,398 A | 12/1999 | Makl et al. |
| 6,004,752 A | 12/1999 | Loewy et al. |
| 6,013,957 A | 1/2000 | Puzo et al. |
| 6,016,095 A | 1/2000 | Herbert |
| 6,018,448 A | 1/2000 | Anthony |
| 6,021,564 A | 2/2000 | Hanson |
| 6,023,406 A | 2/2000 | Kinoshita et al. |
| 6,031,710 A | 2/2000 | Wolf et al. |
| 6,034,576 A | 3/2000 | Kuth |
| 6,034,864 A | 3/2000 | Naito et al. |
| 6,037,846 A | 3/2000 | Oberhammer |
| 6,038,121 A | 3/2000 | Naito et al. |
| 6,046,898 A | 4/2000 | Seymour et al. |
| 6,052,038 A | 4/2000 | Savicki |
| 6,061,227 A | 5/2000 | Nogi |
| 6,064,286 A | 5/2000 | Ziegner et al. |
| 6,072,687 A | 6/2000 | Naito et al. |
| 6,075,211 A | 6/2000 | Tohya et al. |
| 6,078,117 A | 6/2000 | Perrin et al. |
| 6,078,229 A | 6/2000 | Funada et al. |
| 6,088,235 A | 7/2000 | Chiao et al. |
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A | 8/2000 | Anthony |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,231 B1 | 1/2001 | Bartilson |
| 6,183,685 B1 | 2/2001 | Cowman et al. |
| 6,185,091 B1 | 2/2001 | Tanahashi et al. |
| 6,188,565 B1 | 2/2001 | Naito et al. |
| 6,191,475 B1 | 2/2001 | Skinner et al. |
| 6,191,669 B1 | 2/2001 | Shigemura |
| 6,191,932 B1 | 2/2001 | Kuroda et al. |
| 6,195,269 B1 | 2/2001 | Hino |
| 6,198,123 B1 | 3/2001 | Linder et al. |
| 6,198,362 B1 | 3/2001 | Harada et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,078 B1 | 4/2001 | Hunt et al. |
| 6,215,647 B1 | 4/2001 | Naito et al. |
| 6,215,649 B1 | 4/2001 | Appelt et al. |
| 6,218,631 B1 | 4/2001 | Hetzel et al. |

| | | |
|---|---|---|
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 | 5/2001 | Akino et al. |
| 6,226,169 B1 | 5/2001 | Naito et al. |
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |
| 6,249,047 B1 | 6/2001 | Corisis |
| 6,249,439 B1 | 6/2001 | DeMore et al. |
| 6,252,161 B1 | 6/2001 | Hailey et al. |
| 6,262,895 B1 | 7/2001 | Forthun |
| 6,266,228 B1 | 7/2001 | Naito et al. |
| 6,266,229 B1 | 7/2001 | Naito et al. |
| 6,272,003 B1 | 8/2001 | Schaper |
| 6,282,074 B1 | 8/2001 | Anthony |
| 6,282,079 B1 | 8/2001 | Nagakari et al. |
| 6,285,109 B1 | 9/2001 | Katagiri et al. |
| 6,285,542 B1 | 9/2001 | Kennedy, III et al. |
| 6,292,350 B1 | 9/2001 | Naito et al. |
| 6,292,351 B1 | 9/2001 | Ahiko et al. |
| 6,309,245 B1 | 10/2001 | Sweeney |
| 6,310,286 B1 | 10/2001 | Troxel et al. |
| 6,313,584 B1 | 11/2001 | Johnson et al. |
| 6,320,547 B1 | 11/2001 | Fathy et al. |
| 6,324,047 B1 | 11/2001 | Hayworth |
| 6,324,048 B1 | 11/2001 | Liu |
| 6,325,672 B1 | 12/2001 | Belopolsky et al. |
| 6,327,134 B1 | 12/2001 | Kuroda et al. |
| 6,327,137 B1 | 12/2001 | Yamamoto et al. |
| 6,331,926 B1 | 12/2001 | Anthony |
| 6,331,930 B1 | 12/2001 | Kuroda |
| 6,342,681 B1 | 1/2002 | Goldberger et al. |
| 6,373,673 B1 | 4/2002 | Anthony |
| 6,388,856 B1 | 5/2002 | Anthony |
| 6,395,996 B1 | 5/2002 | Tsai et al. |
| 6,448,873 B1 | 9/2002 | Mostov |
| 6,456,481 B1 | 9/2002 | Stevenson |
| 6,469,595 B2 | 10/2002 | Anthony et al. |
| 6,498,710 B1 | 12/2002 | Anthony |
| 6,504,451 B1 | 1/2003 | Yamaguchi |
| 6,509,807 B1 | 1/2003 | Anthony et al. |
| 6,510,038 B1 | 1/2003 | Satou et al. |
| 6,522,516 B2 | 2/2003 | Anthony |
| 6,549,389 B2 | 4/2003 | Anthony et al. |
| 6,563,688 B2 | 5/2003 | Anthony et al. |
| 6,580,595 B2 | 6/2003 | Anthony et al. |
| 6,594,128 B2 | 7/2003 | Anthony |
| 6,603,646 B2 | 8/2003 | Anthony et al. |
| 6,606,011 B2 | 8/2003 | Anthony et al. |
| 6,606,237 B1 | 8/2003 | Naito et al. |
| 6,618,268 B2 | 9/2003 | Dibene, II et al. |
| 6,636,406 B1 | 10/2003 | Anthony |
| 6,650,525 B2 | 11/2003 | Anthony |
| 6,687,108 B1 | 2/2004 | Anthony et al. |
| 6,696,952 B2 | 2/2004 | Zirbes |
| 6,717,301 B2 | 4/2004 | De Daran et al. |
| 6,738,249 B1 | 5/2004 | Anthony et al. |
| 6,806,806 B2 | 10/2004 | Anthony |
| 6,873,513 B2 | 3/2005 | Anthony |
| 6,894,884 B2 | 5/2005 | Anthony, Jr. et al. |
| 6,950,293 B2 | 9/2005 | Anthony |
| 6,954,346 B2 | 10/2005 | Anthony |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fujii |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |
| 2002/0000895 A1 | 1/2002 | Takahashi et al. |
| 2002/0003454 A1 | 1/2002 | Sweeney et al. |
| 2002/0005880 A1 | 1/2002 | Ashe et al. |
| 2002/0024787 A1 | 2/2002 | Anthony |
| 2002/0027263 A1 | 3/2002 | Anthony et al. |
| 2002/0027760 A1 | 3/2002 | Anthony |
| 2002/0044401 A1 | 4/2002 | Anthony et al. |
| 2002/0075096 A1 | 6/2002 | Anthony |
| 2002/0079116 A1 | 6/2002 | Anthony |
| 2002/0089812 A1 | 7/2002 | Anthony et al. |
| 2002/0113663 A1 | 8/2002 | Anthony et al. |
| 2002/0122286 A1 | 9/2002 | Anthony |
| 2002/0131231 A1 | 9/2002 | Anthony |
| 2002/0149900 A1 | 10/2002 | Anthony |
| 2002/0158515 A1 | 10/2002 | Anthony Jr. et al. |
| 2002/0186100 A1 | 12/2002 | Anthony et al. |
| 2003/0029632 A1 | 2/2003 | Anthony Jr. et al. |
| 2003/0029635 A1 | 2/2003 | Anthony Jr. et al. |
| 2003/0048029 A1 | 3/2003 | DeDaran et al. |
| 2003/0067730 A1 | 4/2003 | Anthony et al. |
| 2003/0161086 A1 | 8/2003 | Anthony |
| 2003/0202312 A1 | 10/2003 | Anthony et al. |
| 2003/0206388 A9 | 11/2003 | Anthony et al. |
| 2003/0210125 A1 | 11/2003 | Anthony |
| 2003/0231451 A1 | 12/2003 | Anthony |

| | | |
|---|---|---|
| 2003/0231456 A1 | 12/2003 | Anthony et al. |
| 2004/0004802 A1 | 1/2004 | Anthony et al. |
| 2004/0008466 A1 | 1/2004 | Anthony et al. |
| 2004/0027771 A1 | 2/2004 | Anthony |
| 2004/0032304 A1 | 2/2004 | Anthony et al. |
| 2004/0054426 A1 | 3/2004 | Anthony |
| 2004/0085699 A1 | 5/2004 | Anthony |
| 2004/0105205 A1 | 6/2004 | Anthony et al. |
| 2004/0124949 A1 | 7/2004 | Anthony et al. |
| 2004/0130840 A1 | 7/2004 | Anthony |
| 2004/0218332 A1 | 11/2004 | Anthony et al. |
| 2004/0226733 A1 | 11/2004 | Anthony et al. |
| 2005/0016761 A9 | 1/2005 | Anthony Jr. et al. |
| 2005/0018374 A1 | 1/2005 | Anthony |
| 2005/0063127 A1 | 3/2005 | Anthony |

FOREIGN PATENT DOCUMENTS

| | | |
|---|---|---|
| DE | 198 57 043 C1 | 3/2000 |
| EP | 0933871 | 8/1999 |
| EP | 1022751 | 7/2000 |
| EP | 1024507 | 8/2000 |
| EP | 1061535 | 12/2000 |
| FR | 2765417 | 12/1998 |
| FR | 2808135 | 10/2001 |
| GB | 2217136 | 4/1988 |
| JP | 63-269509 | 11/1988 |
| JP | 1-27251 | 1/1989 |
| JP | 02-267879 | 11/1990 |
| JP | 03-018112 | 1/1991 |
| JP | 03-018122 | 1/1991 |
| JP | 5-283284 | 10/1993 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-151014 | 5/1994 |
| JP | 06-151244 | 5/1994 |
| JP | 06-151245 | 5/1994 |
| JP | 06-325977 | 11/1994 |
| JP | 07-235406 | 9/1995 |
| JP | 07-235852 | 9/1995 |
| JP | 07-240651 | 9/1995 |
| JP | 08-124795 | 5/1996 |
| JP | 08-163122 | 6/1996 |
| JP | 08-172025 | 7/1996 |
| JP | 09-284077 | 10/1997 |
| JP | 09-284078 | 10/1997 |
| JP | 9-294041 | 11/1997 |
| JP | 11-21456 | 8/1999 |
| JP | 11-214256 | 8/1999 |
| JP | 11-223396 | 8/1999 |
| JP | 11-294908 | 10/1999 |
| JP | 11-305302 | 11/1999 |
| JP | 11-319222 | 11/1999 |
| JP | 11-345273 | 12/1999 |
| WO | WO 91/15046 | 10/1991 |
| WO | WO91/15046 | 10/1991 |
| WO | WO98/45921 | 10/1998 |
| WO | WO 98/45921 | 10/1998 |
| WO | WO99/19982 | 4/1999 |
| WO | WO 99/19982 | 4/1999 |
| WO | WO 99/37008 | 7/1999 |
| WO | WO99/37008 | 7/1999 |
| WO | WO 99/52210 | 10/1999 |
| WO | WO99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/33798 | 4/2002 |
| WO | WO 02/122779 | 4/2002 |
| WO | WO 02/1227794 | 4/2002 |
| WO | WO 02/45233 | 6/2002 |
| WO | WO 02/65606 | 8/2002 |
| WO | WO 02/080330 | 10/2002 |
| WO | WO 03/005541 | 1/2003 |
| WO | WO 2004/70905 | 8/2004 |
| WO | WO 2005/02018 | 1/2005 |
| WO | WO 2005/15719 | 2/2005 |
| WO | WO 2005/65097 | 7/2005 |

OTHER PUBLICATIONS

Oct. 1, 2002, PCT International Search Report for PCT/US01/48861.
Jan. 2, 2003, PCT International Search Report for PCT/US01/44681.
Jan. 1, 1994, Greb, "An Intuitive Approach to EM Fields," EMC Test & Design, Jan. 1991, pp. 30-33.
Dec. 1, 1993, Greb, "An Intuitive Approach to EM Coupling," EMC Test & Design, Dec. 1993, pp. 20-25.
Jun. 1, 1986, Sakamoto, "Noisepro of Power Supplies: What's Important in EMI Filters?" JEE, Jun. 1986, pp. 80-85.
Jan. 1, 1999, Montrose, "Analysis on Loop Area Trace Radiated Emissions from Decoupling Capacitor Placement on Printed Circuit Boards," IEEE, 1999, pp. 423-428.
Jan. 1, 1999, Miyoshi, "Surface Mounted Distributed Constant Type Noise Filter," IEEE, 1999, pp. 157-160.
Jan. 1, 1999, Shigeta et al., "Improved EMI Performance by Use of a Three-Terminal-Capacitor Applied to an IC Power Line," IEEE, 1999, pp. 161-164.
Jul. 19, 1999, PCT International Search Report for PCT/US99/07653.
Oct. 13, 1999, IPER for PCT/US99/07653.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792, Claims 1-41 from Preliminary Amendment filed Oct. 28, 2003.
Aug. 19, 1998, PCT International Search Report for PCT/US98/06962.
Apr. 19, 1999, PCT International Search Report for PCT/US99/01040.
Sep. 18, 2000, PCT International Search Report for PCT/US00/11409.
Sep. 13, 2000, PCT International Search Report for PCT/US00/14626.
Nov. 8, 2000, PCT International Search Report for PCT/US00/16518.
Dec. 28, 2000, PCT International Search Report for PCT/US00/21178.
Fang et al., "Conductive Polymers Prolong Circuit Life," Design News, date unknown, 3 pages.
Sep. 1, 1996, Carpenter, Jr. et al., "A New Approach to TVSS Design," Power Quality Assurance' Sep./Oct. 1996 p. 60-63.
Jan. 1, 1996, Rayche M, "Polyswitch Resettable Fuses," Circuit Protection Databook, Jan. 1996, pp. 11-18.
Dec. 28, 2001, PCT International Search Report for PCT/US01/41720.
Jun. 13, 2001, PCT International Search Report for PCT/US01/09185.

Jul. 1, 2000, Polka et al., "Package-Level Interconnect Design for Optimum Electrical Performance," Intel Technology Journal Q3, 2000, pp. 1-17.
May 10, 2002, PCT International Search Report for PCT/US01/43418.
Mar. 13, 2002, PCT International Search Report for PCT/US01/32480.
Aug. 19, 2002, PCT International Search Report for PCT/US02/10302.
Feb. 28, 2003, PCT International Search Report for PCT/US02/21238.
Mar. 18, 2002, PCT International Search Report for PCT/US01/13911.
Jul. 16, 1991, PCT International Search Report for PCT/US91/02150.
Jun. 28, 2001, PCT International Search Report for PCT/US01/03792.
Dec. 16, 1998, "Johanson Dielectrics , Inc. Licenses X2Y Circuit Conditioning Technology," Press Release, Dec. 16, 1998, 1 page.
Mar. 1, 1997, Beyne et al., "PSGA—an innovative IC package for single and multichip designs," Components, Mar. 1997, pp. 6-9.
Sep. 15, 1997, "EMC Design for Brush Commutated DC Electric Motors," Sep. 15, 1997, pp. 1-2.
Apr. 1, 1996, "Tomorrow's Capacitors," Components, 1996, No. 4, p. 3.
Mar. 30, 1998, Mason, "Valor—Understanding Common Mode Noise," Mar. 30, 1998, pp. 1-7.
Anthony Anthony et al., Pending specification, claims, figures for U.S. Appl. No. 10/237,079, Claims 21-81; filed Sep. 9, 2002.
David Anthony et al., Pending specification, claims figures for U.S. Appl. No. 10/766,000, Claims 1-63; filed Jan. 29, 2004.
William Anthony, Pending specification, claims, figures for U.S. Appl. No. 10/399,630, Claims 1-35; filed Aug. 27, 2003.
Anthony Anthony et al., Pending specification, claims, figures for U.S. Appl. No. 10/432,840, Claims 1-39; filed May 28, 2003.
William Anthony, Pending specification, claims, figures for U.S. Appl. No. 10/443,482, Claims 1-25; filed Jun. 12, 2003.
Anthony Anthony et al., Pending specification, claims, figures for U.S. Appl. No. 10/435,199, Claims 1-32; filed May 12, 2003.
Anthony Anthony et al., Pending specification, claims, figures for U.S. Appl. No. 10/115,159, Claims 1-31; filed Apr. 2, 2002.
Anthony Anthony et al., Pending specification, claims, figures for U.S. Appl. No. 10/89,338, Claims 1-39; filed Jul. 2, 2002.
Anthony Anthony et al., Pending specification, claims, figures for U.S. Appl. No. 10/189,339, Claims 1-41; filed Jul. 2, 2002.
Anthony Anthony et al., Pending specification, claims, figures for U.S. Appl. No. 10/479,506, Claims 1-46; filed Dec. 10, 2003.
Anthony Anthony, Pending specification, claims, figures for U.S. Appl. No. 10/443,764, Claims 26-40; filed Sep. 16, 2003.
Anthony Anthony, Pending specification, claims, figures for U.S. Appl. No. 10/443,792, Claims 1-41; filed May 23, 2003.
Anthony Anthony, Pending specification, claims, figures for U.S. Appl. No. 10/443,788, Claims 1; 21-45; filed May 23, 2003.
Anthony Anthony et al., Pending specification, claims, figures for U.S. Appl. No. 10/443,778, Claims 1; 21-59; filed May 23, 2003.
Anthony Anthony et al., Pending specification, claims, figures for U.S. Appl. No. 10/460,361, Claims 1-16, filed Jun. 13, 2003.
Anthony Anthony et al., Pending specification, claims, figures for U.S. Appl. No. 10/705,962, Claims 1-18; filed Nov. 13, 2003.
Anthony Anthony, Pending specification, claims figures for U.S. Appl. No. 10/369,335, Claims 1-20; Feb. 18, 2003.
Anthony Anthony et al., Pending specification, claims, figures for U.S. Appl. No. 09/647,648, Claims 1-48; filed Nov. 17, 2000.
Anthony Anthony, Pending specification, claims, figures for U.S. Appl. No. 10/328,942, Claims 1-20, filed Dec. 23, 2002.
Anthony Anthony et al., Pending specification, claims, figures for U.S. Appl. No. 09/632,048, Claims 1-20; filed Aug. 3, 2000.
Anthony Anthony et al., Pending specification, claims, figures for U.S. Appl. No. 09/996,355, Claims 1-73; filed Nov. 29, 2001.
Willian Anthony, Pending specification, claims, figures for U.S. Appl. No. 10/023,467, Claims 1-20; filed Dec. 17, 2001.
PCT International Search Report for PCT/US01/48861, Oct. 1, 2002.
PCT International Search Report for PCT/US01/44681, Jan. 2, 2003.
Greb, "An Intuitive Approach to EM Fields," EMC Test & Design, Jan. 1991, pp. 30-33, Jan. 1, 1994.
Greb, "An Intuitive Approach to EM Coupling," EMC Test & Design, Dec. 1993, pp. 20-25, Dec. 1, 1993.
Sakamoto, "Noiseproof Power Supplies: What's Important in EMI Removal Filters?" JEE, Jun. 1986, pp. 80-85, Jun. 1, 1986.
Montrose, "Analysis on Loop Area Trace Radiated Emissions from Decoupling Capacitor Placement on Printed Circuit Boards," IEEE, 1999, pp. 423-428, Jan. 1, 1999.
Miyoshi, "Surface Mounted Distributed Constant Type Noise Filter," IEEE, 1999, pp. 157-160, Jan. 1, 1999.
Shigeta et al., "Improved EMI Performance by Use of a Three-Terminal-Capacitor Applied to an IC Power Line," IEEE, 1999, pp. 161-164, Jan. 1, 1999.
PCT International Search Report for PCT/US99/07653, Jul. 19, 1999.
IPER for PCT/US99/07653, Oct. 13, 1999.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792,Claims 1-41 from Preliminary Amendment filed Oct. 28, 2003.
PCT International Search Report for PCT/US98/06962, Aug. 19, 1998.
PCT International Search Report for PCT/US99/01040, Apr. 19, 1999.
PCT International Search Report for PCT/US00/11409, Sep. 18, 2000.
PCT International Search Report for PCT/US00/14626, Sep. 13, 2000.
PCT International Search Report for PCT/US00/16518, Nov. 8, 2000.
PCT International Search Report for PCT/US00/21178, Dec. 28, 2000.
Fang et al., "Conductive Polymers Prolong Circuit Life," Design News, date unknown, 3 pages.
Carpenter, Jr. et al., "A New Approach to TVSS Design," Power Quality Assurance, Sep./Oct. 1996 pp. 60-63, Sep. 1, 1996.
Raychem, "Polyswitch Resettable Fuses," Circuit Protection Databook, Jan. 1996, pp. 11-18, Jan. 1, 1996.
PCT International Search Report for PCT/US01/41720, Dec. 28, 2001.
PCT International Search Report for PCT/US01/09185, Jun. 13, 2001.
Polka et al., "Package-Level Interconnect Design for Optimum Electrical Performance," Intel Technology Journal Q3, 2000, pp. 1-17, Jul. 1, 2000.
PCT International Search Report for PCT/US01/43418, May 10, 2002.
PCT International Search Report for PCT/US01/32480, Mar. 13, 2002.
PCT International Search Report for PCT/US02/10302, Aug. 19, 2002.
PCT International Search Report for PCT/US02/21238, Feb. 28, 2003.
PCT International Search Report for PCT/US01/13911, Mar. 18, 2002.
PCT International Search Report for PCT/US91/02150, Jul. 16, 1991.
PCT International Search Report for PCT/US01/03792, Jun. 28, 2001.
"Johanson Dielectrics, Inc. Licenses X2Y Circuit Conditioning Technology," Press Release, Dec. 16, 1998, 1 page, Dec. 16, 1998.
Beyne et al., "PSGA-an innovative IC package for single and multichip designs," Components, Mar. 1997, pp. 6-9, Mar. 1, 1997.
"EMC Design for Brush Commutated DC Electric Motors," Sep. 15, 1997, pp. 1-2, Sep. 15, 1997.
"Tomorrow's Capacitors," Components, 1996, No. 4, p. 3, Apr. 1, 1996.

Mason, "Valor-Understanding Common Mode Noise," Mar. 30, 1998, pp. 1-7, Mar. 30, 1998.

Pending specification, claims, figures for U.S. Appl. No. 10/237,079, Claimes 21-81; filed Sep. 9, 2002, Anthony Anthony et al.

Pending specification, claims, figures for U.S. Appl. No. 10/766,000, Claims 1-63; filed Jan. 29, 2004, David Anthony et al.

Pending specification, claims, figures for U.S. Appl. No. 10/399,630, Claims 1-35; filed Aug. 27, 2003, William Anthony.

Pending specification claims, figures for U.S. Appl. No. 10/432,840, Claims 1-39; filed May 28, 2003, Anthony Anthony et al.

Pending specification, claims, figures for U.S. Appl. No. 10/443,482, Claims 1-25; filed Jun. 12, 2003, William Anthony.

Pending specification, claims, figures for U.S. Appl. No. 10/435,199, Claims 1-32; filed May 12, 2003, Anthony Anthony et al.

Pending specification, claims, figures for U.S. Appl. No. 10/115,159, Claims 1-31; filed Apr. 2, 2002, Anthony Anthony et al.

Pending specification, claims, figures for U.S. Appl. No. 10/189,338, Claims 1-69; filed Jul. 2, 2002, Anthony Anthony et al.

Pending specification, claims, figures for U.S. Appl. No. 10/189,339, Claims 1-41; filed Jul. 2, 2002, Anthony Anthony et al.

Pending specification, claims, figures for U.S. Appl. No. 10/479,506, Claims 1-46; filed Dec. 10, 2003, Anthony Anthony et al.

Pending specification, claims, figures for U.S. Appl No. 10/443,764, Claims 26-40; filed Sep. 16, 2003, Anthony Anthony.

Pending specification, claims, figures for U.S. Appl. No. 10/443,792, Claims 1-41; May 23, 2003, Anthony Anthony.

Pending specification, claims, figures for U.S. Appl. No. 10/443,788, Claims 1; 21-45; filed May 23, 2003, Anthony Anthony.

Pending specification, claims, figures for U.S. Appl. No. 10/443,778, Claims 1; 21-59; filed May 23, 2003, Anthony Anthony et al.

Pending specification, claims, figures for U.S. Appl. No. 10/460,361, Claims 1-16; filed Jun. 13, 2003, Anthony Anthony et al.

Pending specification, claims, figures for U.S. Appl. No. 10/705,962, Claims 1-18; filed Nov. 13, 2003, Anthony Anthony et al.

Pending specification, claims, figures for U.S. Appl. No. 10/369,335, Claims 1-20; Feb. 18, 2003, Anthony Anthony.

Pending specification, claims, figures for U.S. Appl. No. 09/647,648, Claims 1-48; filed Nov. 17, 2000, Anthony Anthony et al.

Pending specification, claims, figures for U.S. Appl. No. 10/328,942, Claims 1-20; filed Dec. 23, 2002, Anthony Anthony.

Pending specification, claims, figures for U.S. Appl. No. 09/632,048, Claims 1-20; filed Aug. 3, 2000, Anthony Anthony et al.

Pending specification, claims, figures for U.S. Appl. No. 09/996,355, Claims 1-73; filed Nov. 29, 2001, Anthony Anthony et al.

Pending specification, claims, figures for U.S. Appl. No. 10/023,467, Claims 1-20; filed Dec. 17, 2001, William Anthony.

Weir, et al., "DesignCon 2005, High Performance FPGA Bypass Networks", Jan. 1, 2005.

Pending claims 1-40 and figures (3 pages) for U.S. Appl. No. 10/339,590; the specification is contained in WO 02/23798, filed Oct. 17, 2001, which is the published version of PCT/US01/32480, which is Neifeld Reference: X2YA0015UPCT-US, which is reference F-063 in the Information Disclosure Statement filed Apr. 23, 2004, Apr. 25, 2002.

PCT International Search Report for PCT/US04/00218, Feb. 11, 2005.

PCT International Search Report for PCT/US04/14539, Feb. 18, 2005.

Australian Patent Office Examination Report for SG 200303041-8; Neifeld Ref: X2YA0025UPCT-SG, Mar. 24, 2005.

PCT International Search Report for PCT/US04/18938, Apr. 11, 2005.

Muccioli, "EMC Society Seattle and Oregon Chapters-New X2Y Filter Technology Emerges as Singles Component Solution for Noise Suppression", Nov. 2000.

PCT Corrected IPER for PCT/US04/00218, Sep. 27, 2005.

* cited by examiner

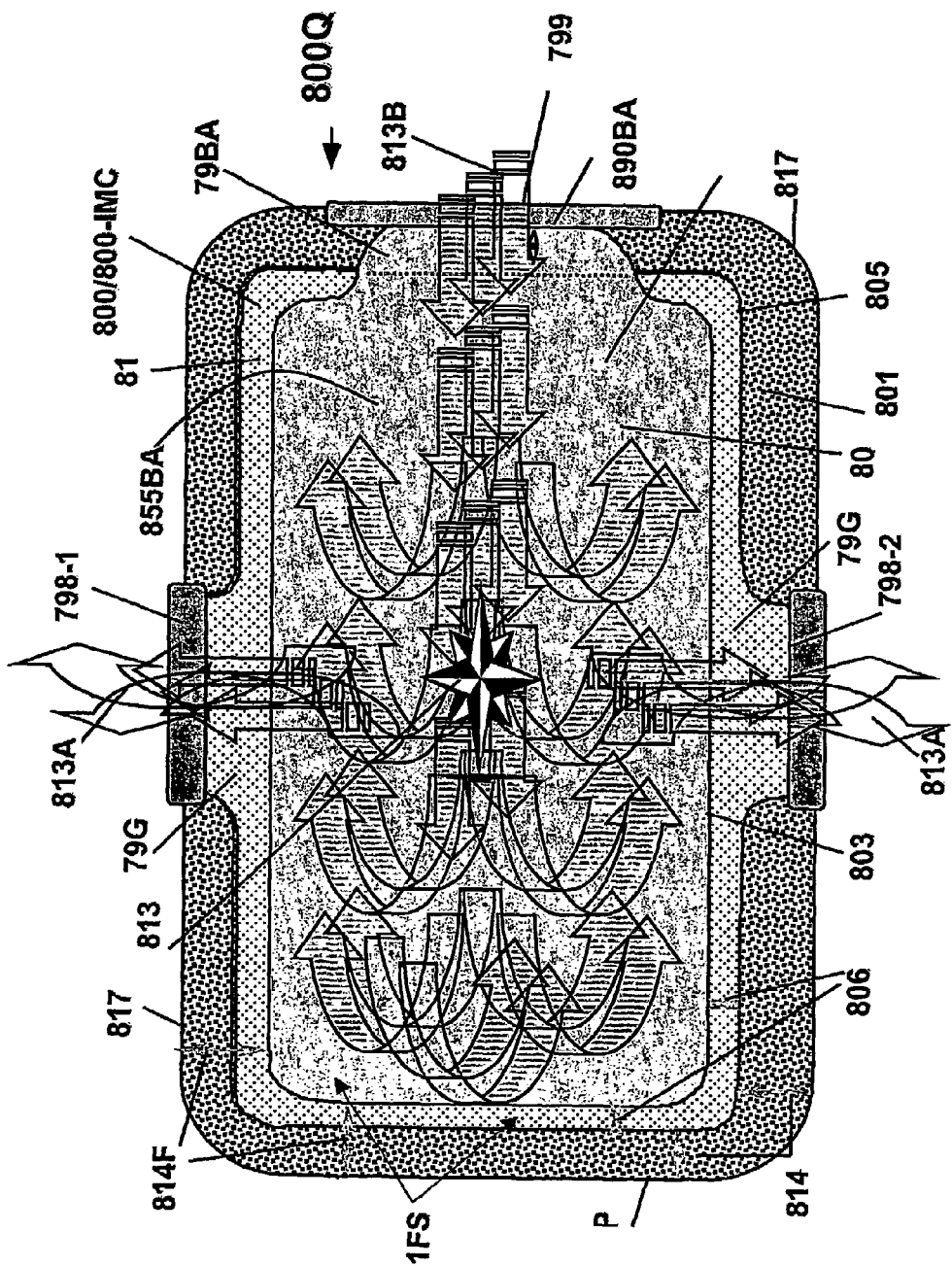

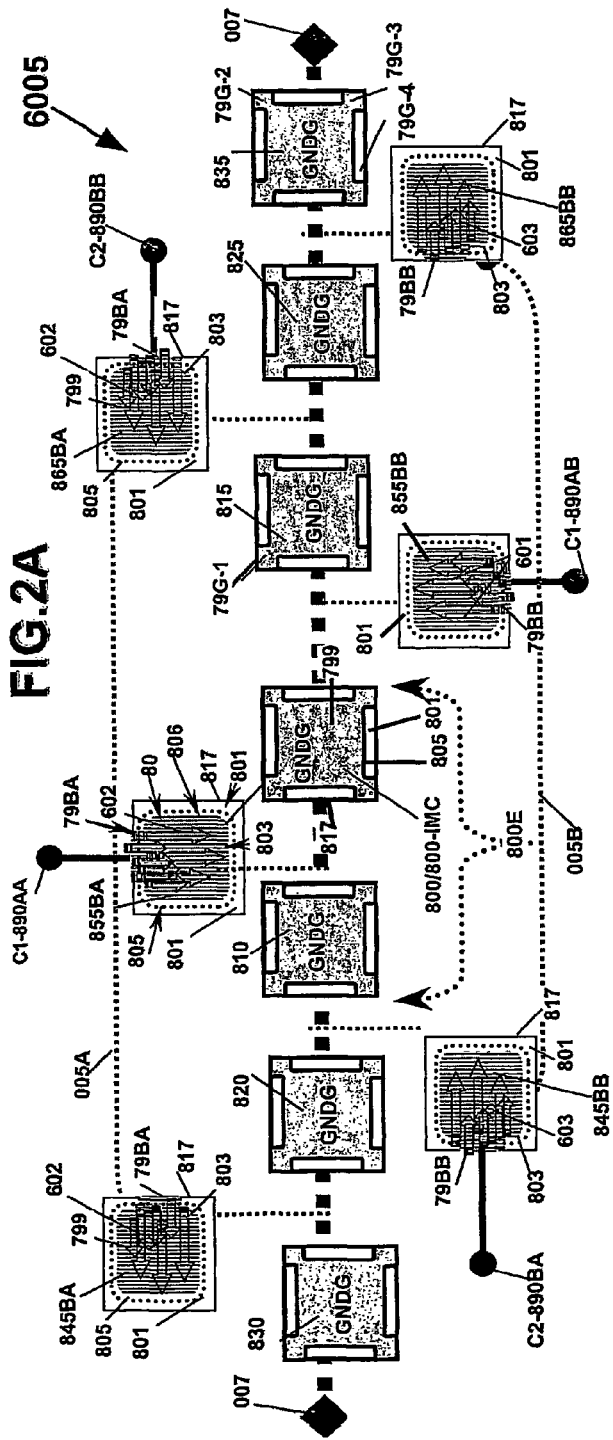
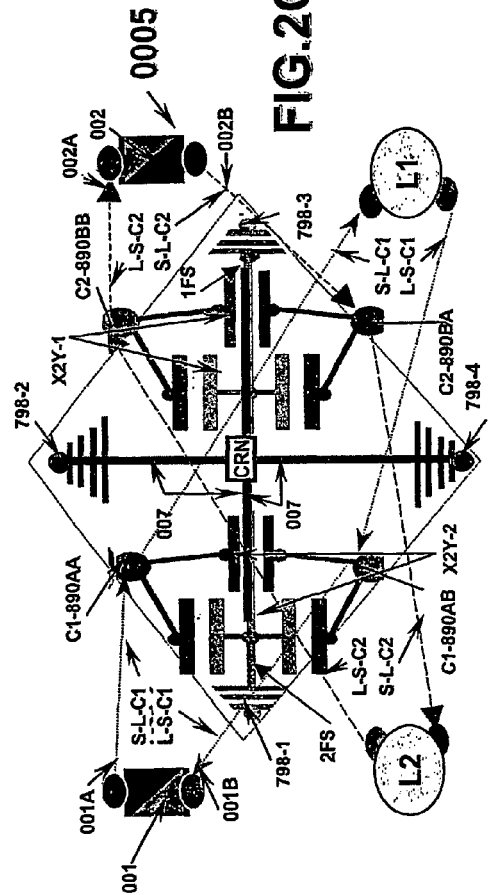
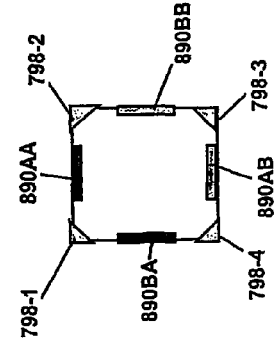

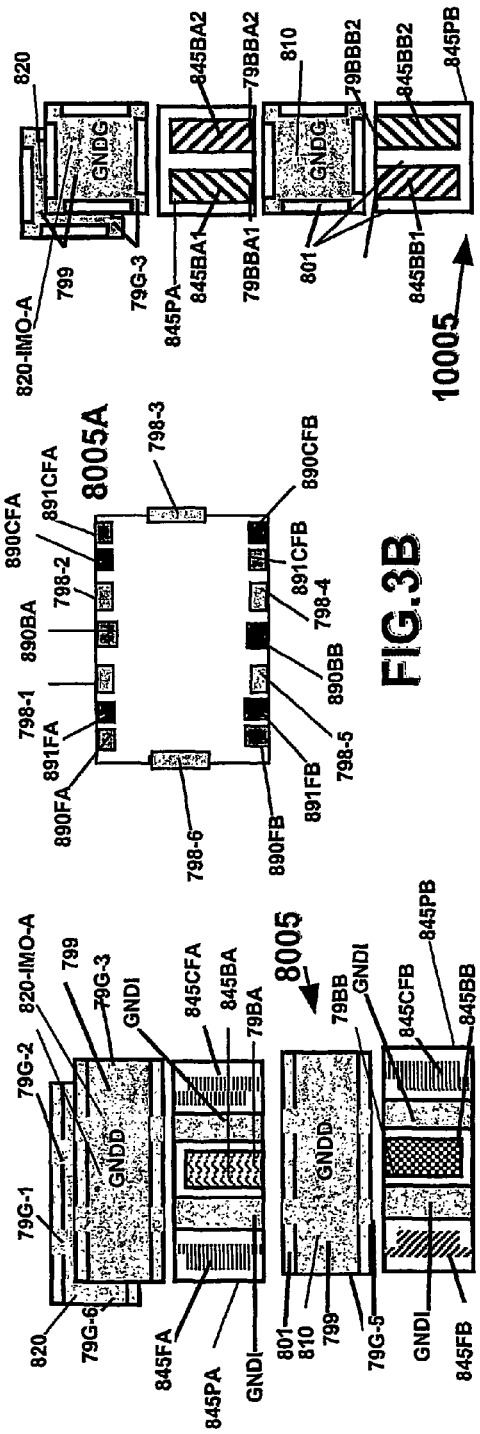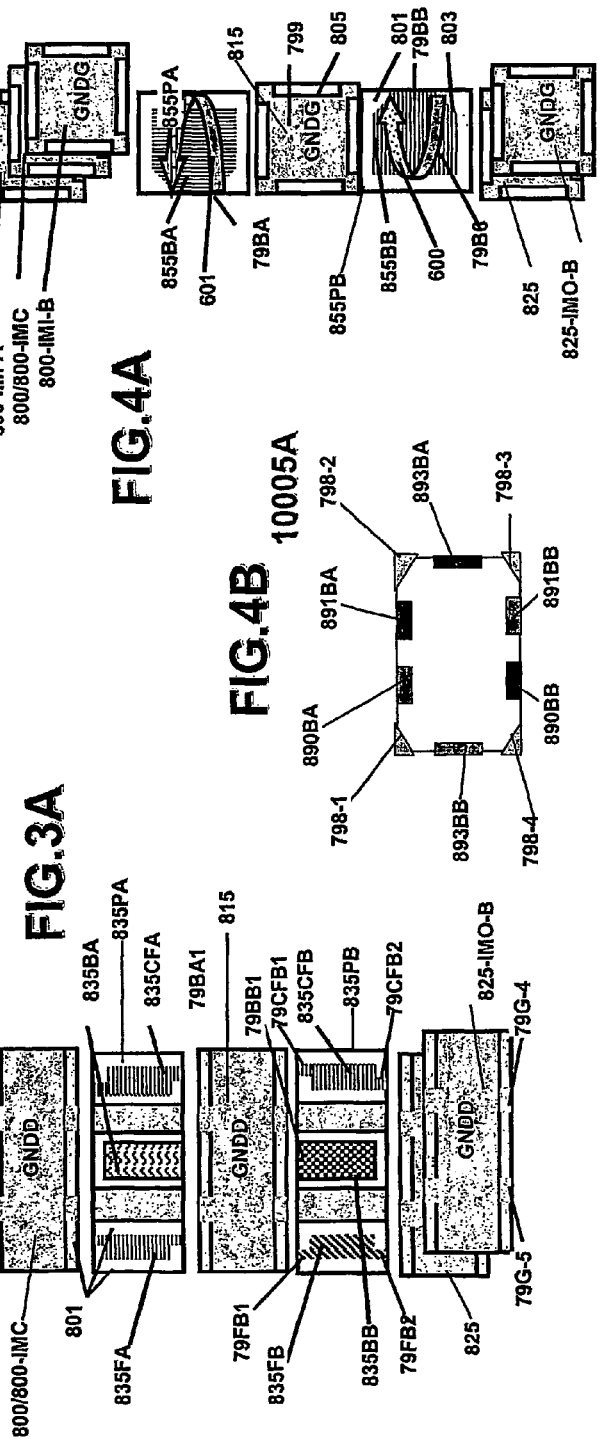

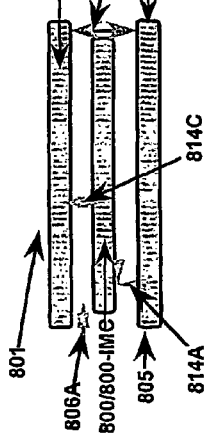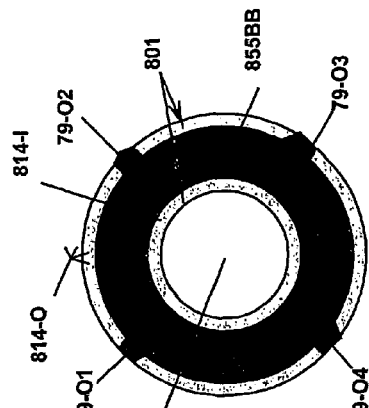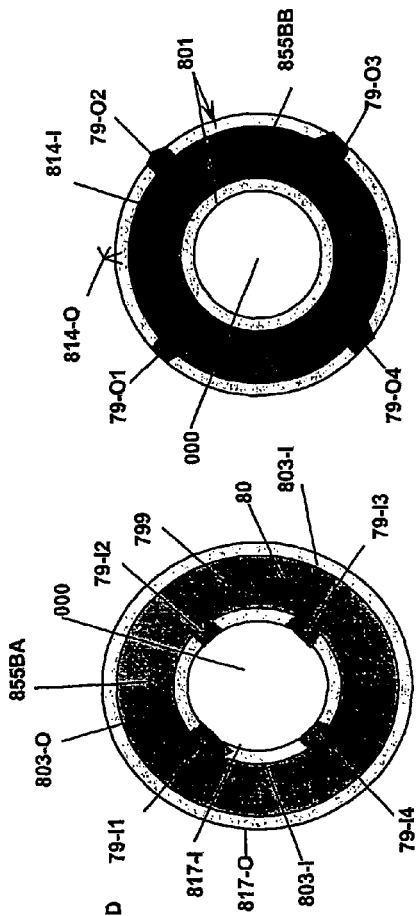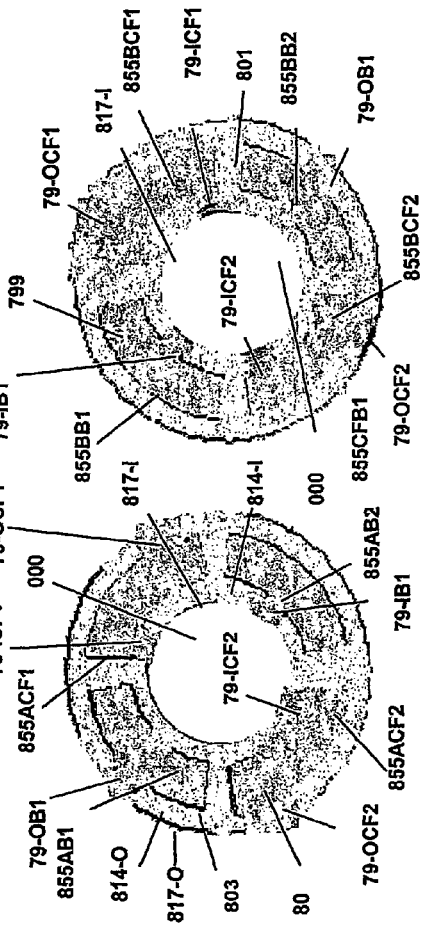

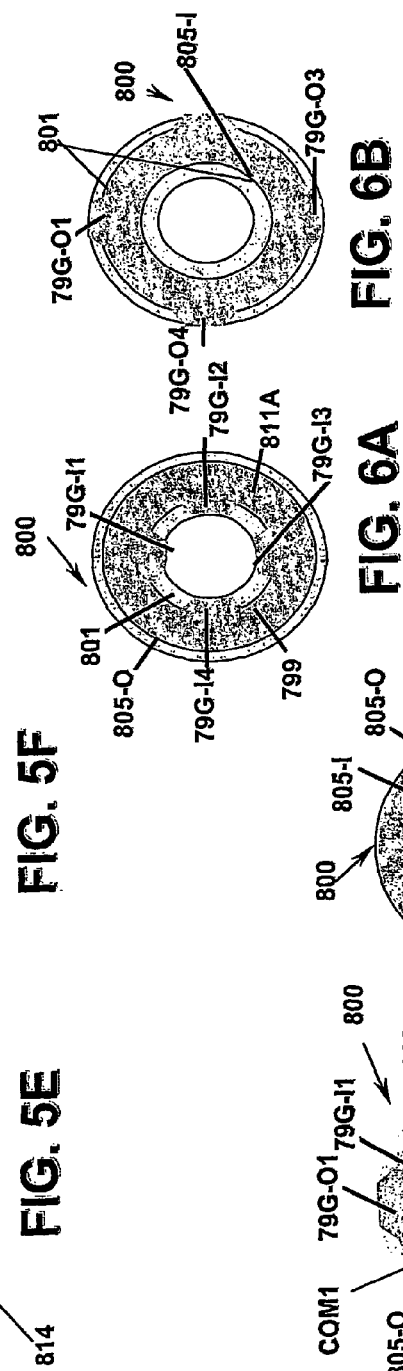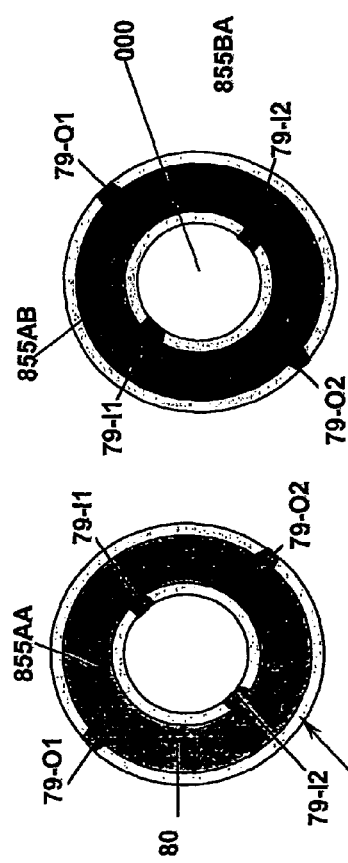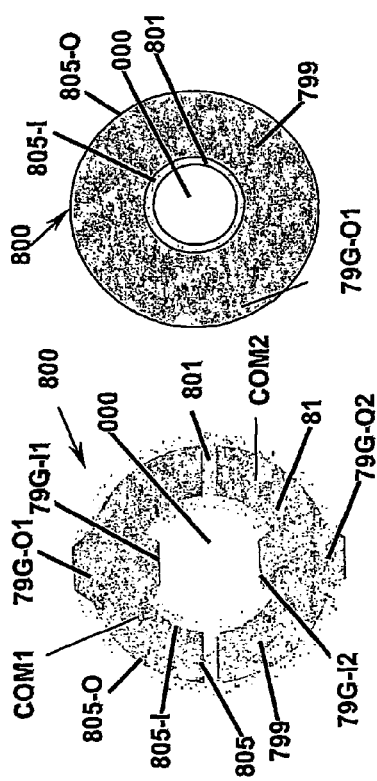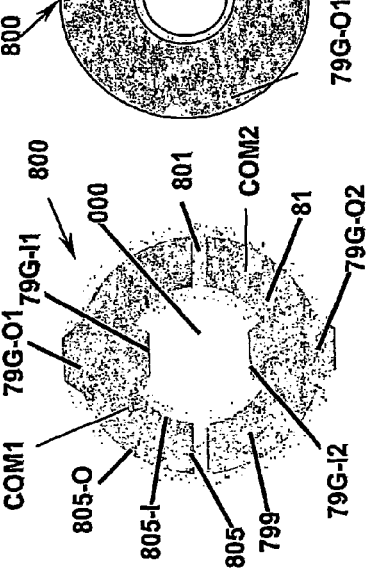
FIG. 5E  FIG. 5F  FIG. 6A  FIG. 6B  FIG. 6C  FIG. 6D

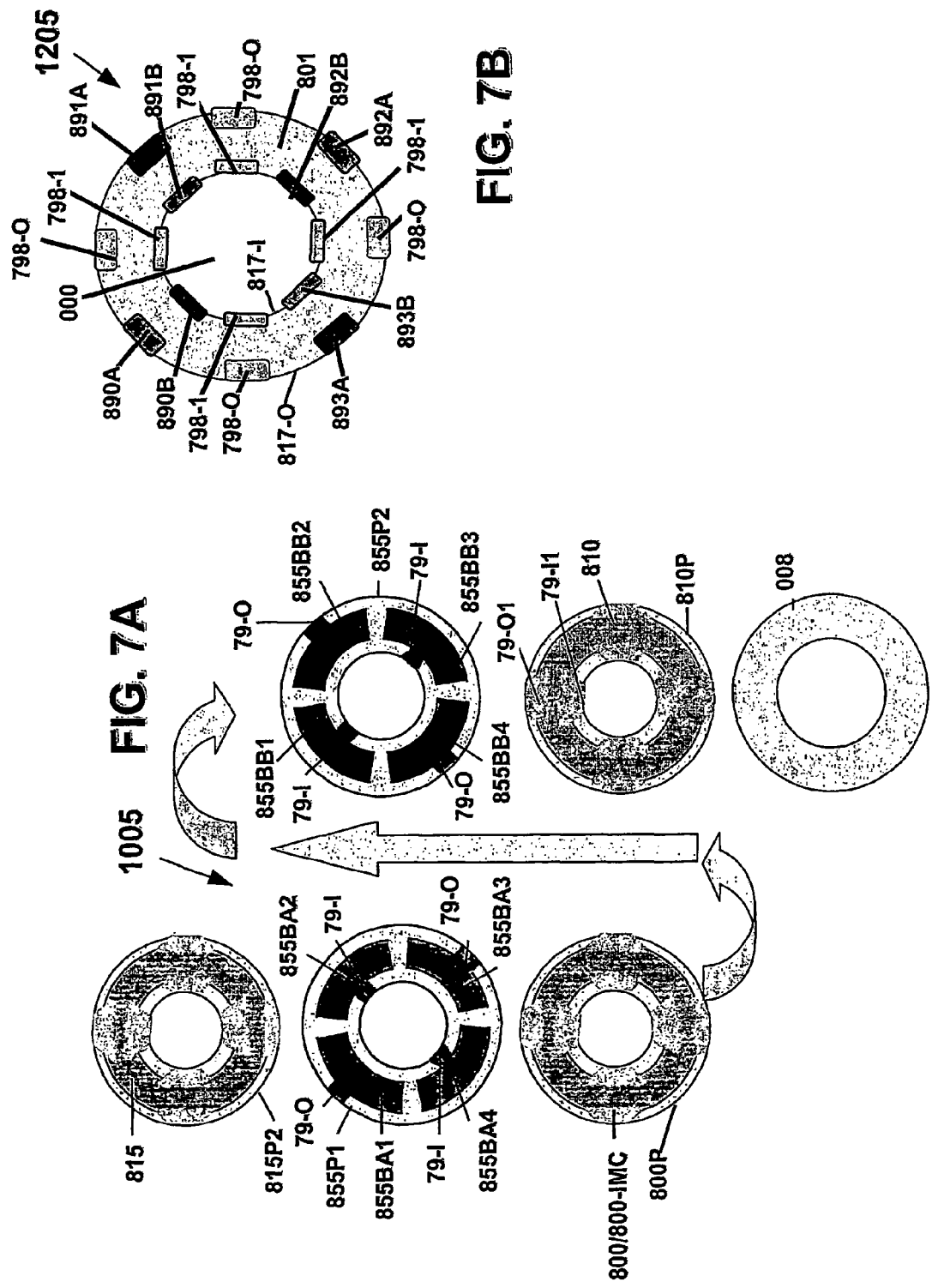

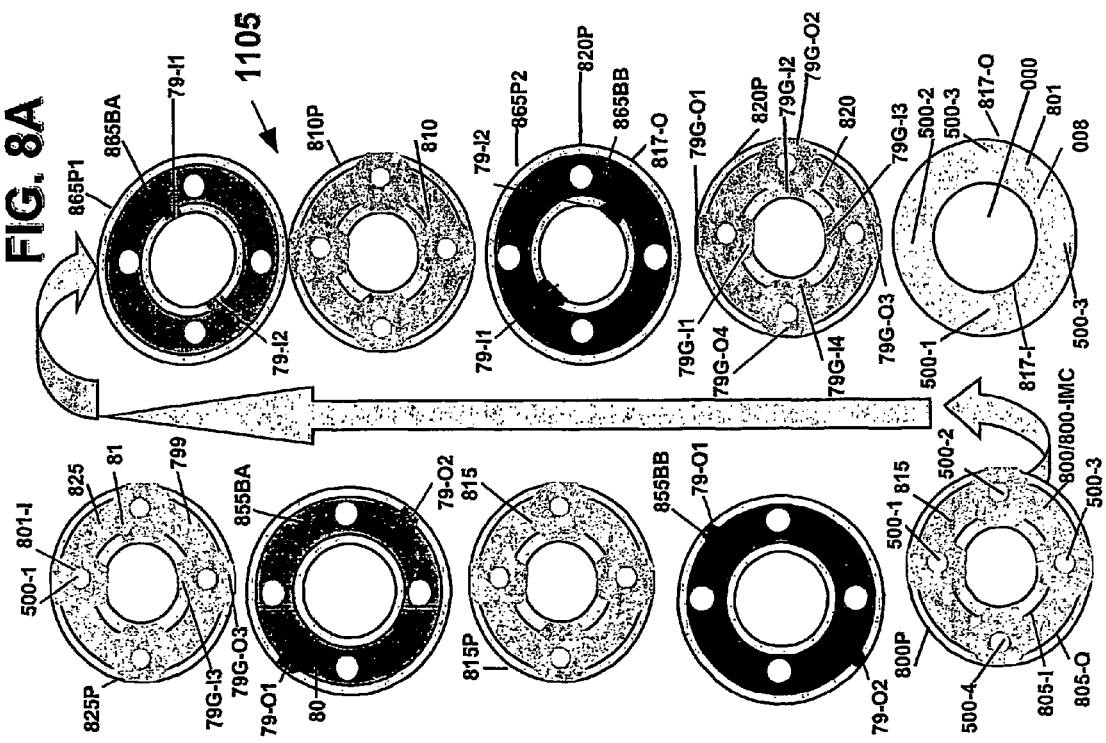
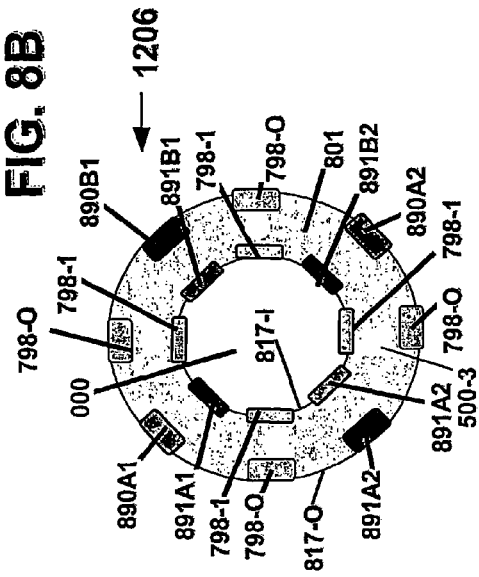

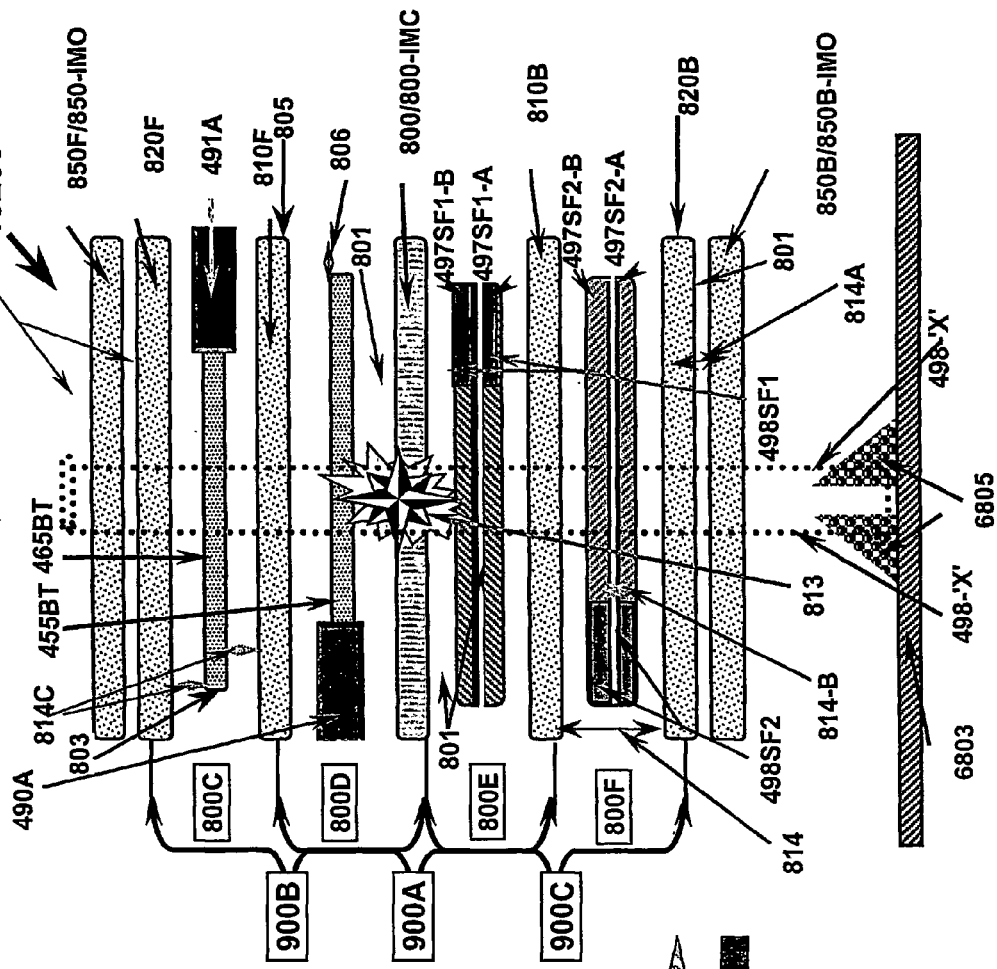
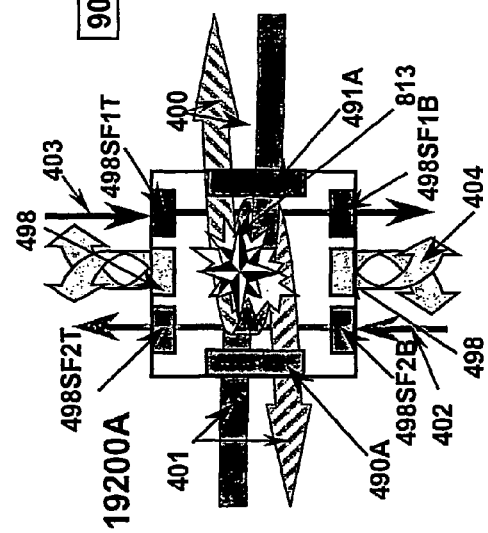

ENERGY PATHWAY ARRANGEMENTS FOR ENERGY CONDITIONING

This 10/433,482 application is the National Stage entry of PCT/US01/48861, filed Dec. 17, 2001; and PCT/US01/48861 is continuation of U.S. application Ser. No. 10/003,711, filed Nov. 15, 2001, U.S. application Ser. No. 09/982,553, filed Oct. 17, 2001, and claims benefit of U.S. Provisional Application No. 60/255,818, filed Dec. 15, 2000, U.S. Provisional Application No. 60/280,819, filed Apr. 2, 2001, U.S. Provisional Application No. 60/302,429, filed Jul. 2, 2001, and U.S. Provisional Application No. 60/310,962, filed Aug. 8, 2001; this 10/433,482 application is a continuation-in-part of U.S. application Ser. No. 09/996,355, filed Nov. 29, 2001, and a continuation-in-part of U.S. application Ser. No. 10/432,840, which is a national stage entry of PCT/US01/44681, filed Nov. 29, 2001;

and U.S. application Ser. No. 09/996,355, filed Nov. 29, 2001, is a continuation-in-part of co-pending application Ser. No. 10/003,711 filed Nov. 15, 2001, which is a continuation-in-part of co-pending application Ser. No. 09/982,553, filed Oct. 17, 2001, and application Ser. No. 09/996,355 filed Nov. 29, 2001 also claims the benefit of U.S. Provisional Application No. 60/253,793, filed Nov. 29, 2000, U.S. Provisional Application Ser. No. 60/255,818, filed Dec. 15, 2000, U.S. Provisional Application No. 60/280,819, filed Apr. 2, 2001, U.S. Provisional Application No. 60/302,429, filed Jul. 2, 2001, and U.S. Provisional Application No. 60/310,962, filed Aug. 8, 2001;

and U.S. application Ser. No. 10/003,711, filed Nov. 15, 2001, is a continuation-in-part of co-pending application Ser. No. 09/982,553, filed Oct. 17, 2001, and U.S. application Ser. No. 10/003,711, filed Nov. 15, 2001 also claims benefit of U.S. provisional application 60/248,914, filed Nov. 15, 2000, U.S. provisional application No. 60/252,766, filed Nov. 22, 2000, U.S. provisional application No. 60/253,793, filed Nov. 29, 2000, U.S. provisional application No. 60/255,818, filed Dec. 15, 2000, U.S. provisional application No. 60/280,819, filed Apr. 2, 2001, U.S. provisional application No. 60/302,429, filed Jul. 2, 2001, and U.S. provisional application No. 60/310,962, filed Aug. 8, 2001;

and U.S. application Ser. No. 09/982,553, filed Oct. 17, 2001 claims benefit of provisional application No. 60/241,128, filed Oct. 17, 2000;

and U.S. application Ser. No. 10/432,840, is a national stage entry of PCT/US01/44681, filed Nov. 29, 2001; and PCT/US01/44681 is a continuation-in-part of U.S. application Ser. No. 10/003,711, filed Nov. 15, 2001, which is a continuation-in-part of U.S. application Ser. No. 09/982,553, filed Oct. 17, 2001; and PCT/US01/44681 claims benefit of U.S. provisional application No. 60/253,793, filed Nov. 29, 2000, U.S. provisional application No. 60/255,818 filed Dec. 15, 2000, U.S. provisional application No. 60/280,819, filed Apr. 2, 2001, U.S. provisional application No. 60/302,429, filed Jul. 2, 2001, U.S. provisional application No. 60/310,962, filed Aug. 8, 2001.

TECHNICAL FIELD

The present disclosure relates to compact and integral energy pathway arrangements comprising energy-conditioning arrangements of various elements that include complementary energy pathways practicable as single-set or multiple-set, complementary paired portions of separate and isolated electronic circuitry combined with coupled and shielding, energy pathways. These energy pathway arrangement amalgams provide not only simultaneous energy-conditioning of portions of propagating energies, but also provide compact, integrated isolation and conditioning functions for desired energy portions relative to internally and/or externally created energy portions that would otherwise detrimentally effect circuitry systems operating in conjunction with a new, typical energy pathway arrangement. Other energy-conditioning arrangement variants can be simultaneously operable to provide not only single common voltage reference functions to single-set circuit systems, but provide either multiple-set circuit systems, isolated common voltage reference functions systems simultaneously while practicable for performing multiple, dynamic energy-conditioning operations.

BACKGROUND OF TH ART

Today, as the density of electronics within system applications in the world increases, an unwanted noise byproduct from such configurations can limit the performance of both, critical and non-critical electronic circuitry, alike. Consequently, the avoidance to the effects of unwanted noise by either isolation or immunization of circuit portions against the effects of undesirable energy or noise is an important consideration for most circuit arrangements and circuit design.

Differential and common mode noise energy can be generated and will usually propagate along and/or around energy pathways, cables, circuit board tracks or traces, high-speed transmission lines and/or bus line pathways. In many cases, these types of energy conductors act as an antenna radiating energy fields that aggravate the problem even more such that at these high frequencies, propagating energy portions utilizing prior art passive devices have led to increased levels of this energy parasitic interference in the form of various capacitive and/or inductive parasitics. These increases are due in part to the combination of required operable placement constraints of these functionally and/or structurally limited, prior art solutions coupled with their inherent manufacturing imbalances and/or performance deficiencies that are carried forward into the application and that inherently create or induce an operability highly conducive to creating unwanted interference energy that couples into the associated electrical circuitry, which makes shielding from EMI desirable.

Consequently, for today's high frequency operating environments, the solution involves or comprises a combination of simultaneous filtration of both input and output lines along with careful systems layout, various grounding arrangements and/or techniques as well as extensive isolating, electrostatic and/or magnetic shielding.

Thus, a self-contained, energy-conditioning arrangement utilizing simple predetermined arrangements of energy pathways and other predetermined elements that when amalgamated into an operable component (whether discreet, and/or non-discreet or of a variant in-between discrete and/or non-discrete) can be utilized in almost any single and/or multi-circuit application for providing effective and/or sustainable noise suppression function, physical shielding function, electrostatic shielding function with energization in predetermined configurations, decoupling function, transient suppression function, cancellation function, noise energy blocking or immunization noise energy as needed, is highly desired.

BRIEF DESCRIPTION OF THE DRAWINGS

FIG. 1 shows a plan view of a portion of a conductive shielding, energy pathway and a complementary shielded, energy pathway from a stacking sequence and/or positioning that could be of an example of a typical variant embodiment portion in accordance with typical configurations presented, among others;

FIG. 2A shows an exploded plan view of an embodiment 6005, which is an energy-conditioning arrangement in accordance with typical configurations presented, among others;

FIG. 2B shows a top view of a portion of a discrete component 6005 version of FIG. 2A in accordance with typical configurations presented, among others;

FIG. 2C shows a view of a multi-circuit arrangement 0005 utilizing embodiment 6005 in one a many possible circuit system configuration(s) in accordance with typical configurations presented, among others;

FIG. 3A shows an exploded plan view of an embodiment 8005, which is a multi-circuit common mode and differential mode energy conditioner comprising at least three separate complementary energy pathway pairs, including, but not limited to any pairings shown, such as (1) cross-over feedthru pairing, (1) straight feedthru paring and (1) bypass paring with co-planar shielding for example, however it an example that is In accordance with typical configurations presented, among others;

FIG. 3B shows a top view of a portion of a component 8005 of FIG. 3A in accordance with typical configurations presented, among others;

FIG. 4A shows an exploded plan view of a embodiment 10005, which is a multi-circuit common mode and differential mode energy conditioner comprising three separate complementary bypass energy pathway pairs, of which (2) pairings are co-planar for example, however it an example that is in accordance with typical configurations presented, among others;

FIG. 4B shows a top view of a portion of a component utilizing 10005 of FIG. 4A in accordance with typical configurations presented, among others;

FIG. 4C shows a cross-section view of a portion of a shield layering in accordance with typical configurations presented, among others;

FIG. 5A shows a top view of a portion of a component layering in accordance with typical configurations presented, among others;

FIG. 5B shows a top view of a portion of a component layering in accordance with typical configurations presented, among others;

FIG. 5C shows a top view of a portion of a component layering in accordance with typical configurations presented, among others;

FIG. 5D shows a top view of a portion of a component layering In accordance with typical configurations presented, among others;

FIG. 5E shows a top view of a portion of a component layering in accordance with typical configurations presented, among others;

FIG. 5F shows a top view of a portion of a component layering in accordance with typical configurations presented, among others;

FIG. 6A shows a top view of a portion of a component layering in accordance with typical configurations presented, among others;

FIG. 6B shows a top view of a portion of a component layering in accordance with typical configurations presented, among others;

FIG. 6C shows a top view of a portion of a component layering in accordance with typical configurations presented, among others;

FIG. 6D shows a top view of a portion of a component layering in accordance with typical configurations presented, among others;

FIG. 7A shows an exploded plan view of a energy pathway embodiment example 1005, which is but one of many possible configurations in accordance with typical configurations presented, among others;

FIG. 7B shows an top plan view of a multi-circuit arrangement like that of FIG. 7A, for example, now utilizing embodiment 1205 in one a many possible configurations in accordance with typical configurations presented, among others;

FIG. 8A shows an exploded plan view of a energy pathway embodiment example 1105, which is but one of many possible configurations in accordance with typical configurations presented, among others;

FIG. 8B shows an top plan view of a multi-circuit arrangement like that of FIG. 8A, for example, now utilizing embodiment 1207 in one a many possible configurations in accordance with typical configurations presented, among others;

FIG. 9 shows a top view of a portion of a component having an arrangement embodiment like 19200 of FIG. 10 for example, in accordance with typical configurations presented, among others;

FIG. 10 shows an cross-section view of an arrangement embodiment 19200, which is but one of many possible configurations in accordance with typical configurations presented, among others;

DETAILED DESCRIPTIONS

Figure 12:
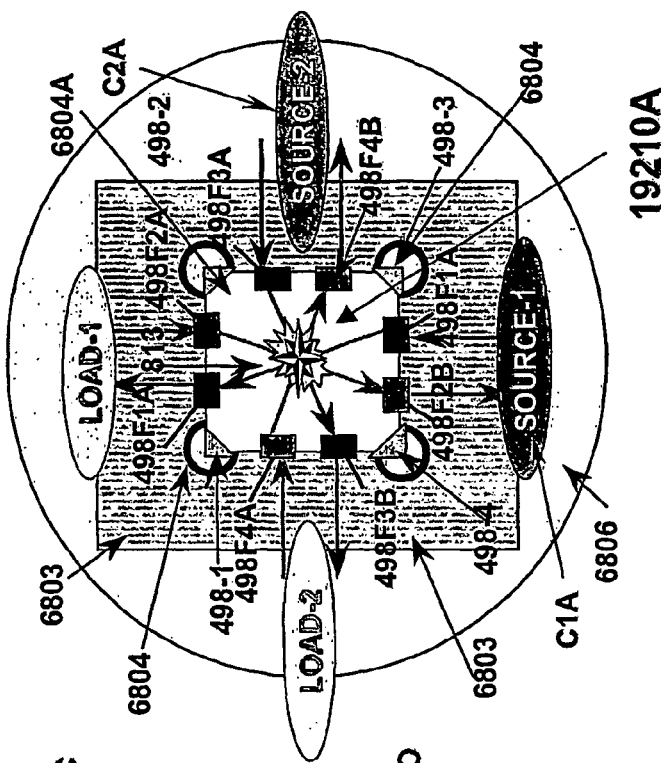
FIG. 12 shows an top plan and schematic view of a multi-circuit arrangement 19210A utilizing embodiment 19210 of FIG. 11, for example, in one a many possible configurations in accordance with typical configurations presented, among others.

This application is a continuation-in-part of co-pending application Ser. No. 09/996,355 filed Nov. 29, 2001, which is a continuation-in-part of co-pending application Ser. No. 10/003,711 filed Nov. 15, 2001, which is a continuation-in-part of co-pending application Ser. No. 09/982,553 filed Oct. 17, 2001, portions of which are incorporated herein. This application also claims the benefit of U.S. Provisional Application No. 60/255,818, filed Dec. 15, 2000, U.S. Provisional Application No. 60/280,819, filed Apr. 2, 2001, U.S. Provisional Application No. 60/302,429, filed Jul. 2, 2001, and U.S. Provisional Application No. 60/310,962, filed Aug. 8, 2001, portions of which are incorporated, herein.

One approach disclosed, among others, is to provide an energy-conditioning arrangement and/or energy-conditioning arrangement that are integral, in functional ability, as well as physical make-up, allowing for physically close in-position, multiple groupings of energy pathways or electrodes that can operate dynamically in close electrical proximity to one another while sharing a common energy reference node, CRN, simultaneously. This function, among others, occurs when facilitated by at least an electrode or energy pathway shielding structure found along with other elements in one arrangement amalgam or energy conditioner, among others.

The following will attempt to set forth detailed descriptions of a universal arrangement, among others, or embodiment that is but one of a vast number of possible adaptable form variants of such an arrangement that is ubiquitous to the possible application potential operable for its use. This arrangement description is intended to be illustrative of only a few of the possible universally adaptable forms of the energy-conditioning arrangement and should not be taken at all to be limiting due to the possible variants but only so to spare more of the precious time of the examiner. A vast spectrum of the many variations, modifications, additions, and improvements may fall within the scope of the universally adaptable form of the energy-conditioning arrangement as defined, among others, in at least one or more than one, of the many claims that follow.

For brevity, the word as used throughout the entire disclosure will be the term 'amalgam' as defined by a posing in the dictionary with clarification help provided herein as what the applicant means. The word 'amalgam' may be interchangeable with the phrase energy conditioner meaning a "general combination of elements that comprise and/or are characterized by among others, elements arranged in harmonious combination or amalgamation that may include, among others a mixture of single and/or grouped, conductive, semi-conductive and non-conductive material elements of various material compositions and formats, formed or made into an practicable energy-conditioning embodiment that is utilizing both relative and non-relative, single and/or grouped dimensional relationships, size relationships, space-apart, spaced-near, contiguous, non-contiguous relationship arrangements and positioning with either or in combination of non-alignments, alignments, complementary pairings, superposing, off-setting space or spaced alignments that include 3-dimensional relationships all amalgamated together into a form of a discrete or non-discrete embodiment in an un-energized state that is practicable to be operable for a dynamic use and/or state". Word 'amalgam', if used, is not, "any of various alloys of mercury with other metals" such as what one can generally find as first definition listing of amalgam in a dictionary. Thus, amalgam will also be used for disclosure purposes herein to further encompass 'various typical amalgam (energy conditioner) and/or energy-conditioning arrangements that can include coupled to energy pathways and coupling elements, locations and attachment configurations as described, among other methods possible that also aid in allowing at least one energized circuit system to utilize a disclosed embodiment, among others, in a specific or generalized manner.'

Therefore, at the very least, a technology foundation is laid or attempted herein as It is limited or constrain to these possible embodiments or the possible forms as only a detailed guide to clearly and quickly aid the reader into the direction of enlightenment as to these disclosed and on to many of the other possible arrangements available, among others, that are not necessarily disclosed, but are obvious in their form to those skilled in the art. Therefore, due to the limitations of time constraints, particularly inherent to the work of the examiner and the applicant, alike is a sampling of the technology possibilities presented.

In addition, as used herein, the acronym term "AOC" for the words "a predetermined area portion operable for energy portion convergences that is practicable for shielded, complementary energy portion interactions". An AOC 813 is found in either, a discrete or non-discrete version of the amalgam or energy-conditioning arrangements. AOC 813 is also the generally accepted relative boundaries of shielded influence for shielded energy conditioning as described for portions of propagating circuit system energies. A typical AOC can also include a physical or imaginary aligned boundary of a portion of a manufactured-together (or not) amalgam or a manufactured-together (or not) energy-conditioning arrangements' elements that will allow shielded portions of propagating circuit system energies utilizing embodiment elements, as disclosed, to interact with one another in one or more than one, predetermined manners or functions (e.g. mutual cancellation of opposing h-field energies). For example a portion or a element-filled space meted out by superposed alignment of 805 perimeter electrode edges of combined, conductively coupled shielding electrodes' main-body electrode portion 81's is an excellent grouping of elements to be used to define an AOC 813.

Please note that many words can be used to describe the term 'energy pathways' as used in the lexicon. The applicant has used several terms herein to describe portions that can be generically described as 'energy pathways'. These alternative terms may be more appropriate when talking about a specific embodiment or a specific function of the energy pathway and include the terms; conductive material portions, electrode, conductor, shielding energy pathway, shielded energy pathway, conductive pathway, shielded pathway, shielding pathway. It is to be understood that such variations are intended to fall within the scope of the claimed invention and that the subject invention is not to be limited by the specific apparatus or method of operation described and/or depicted by the drawings nor is the invention to be limited by the specific materials and mechanical components identified and described herein. These words have been selected and designated merely to provide a demonstration of operability and the selection of mechanically equivalent arrangements is not deemed a departure from the spirit of the invention.

Combined and coupled together, shielding electrodes' main-body electrode portion 81's of a typical, new embodiment not only immure and shield the collective, complementary electrodes' main-body electrode portion 80s in almost any typical, new embodiment, this arrangement would be considered as at least partially defining an AOC (813). Also, to further help clarify, the term 'outer' or 'external' as used herein will be generally, but not always, considered almost any location found up to and/or beyond a typical AOCs' effective energy-conditioning range or influence, spacing or area, as defined herein. This does not mean anything labeled 'outer' or 'external', herein must be separate of a typical embodiment or can not be contiguously apart of other elements comprising an arrangement and an AOC 813, as to be disclosed or not. It is just that the terms, as generally used herein, such as 'outer' or 'external' could apply to all or a majority of 79'X' extension portion's location respective of an AOC 813 and it's 'parent' complementary electrode, as a whole, and despite its' contiguously relationship to it's' (79"X"'s) larger, main-body electrode portion 80, which itself is within an AOC 813 boundary of a typical embodiment.

Present amalgam and/or energy-conditioning arrangement also relates to both discreet and non-discrete versions of an electrode arrangement having an operability for multiple-circuit operations simultaneously and comprising a conductively coupled, multi-electrode shielding arrangement architecture that will almost totally envelope various paired and/or complementary-paired, electrodes operable for 'electrically complementary' operations (that meaning is the condition or state is practicable or operable for opposing electrical operations to occur, relative to the other).

An amalgam or energy conditioner can comprise and/or can be characterized by various uniform and/or heterogeneously mixed energy portion propagation modes such as bypass and/or feedthru modes or operations that simultaneously shield and smooth energy-conditioning operations for one circuit or a plurality of circuits. A new, typical amalgam or energy conditioner has been found to facilitate multiple energy-conditioning functions operable upon various energy portions that are propagating along portions of a new, typical embodiments' multiple complementary electrodes and/or single or multiple circuitry portions and while utilizing a common reference node function supplied by the conductively 'grounded' plurality of first electrodes or plurality of shield electrodes.

As for most embodiments of a typical amalgam or energy conditioner and/or energy-conditioning arrangement, the applicant contemplates a manufacturer having the option for combining a wide variety and wide range of possible materials that could be selected and combined into the final make-up of a specific embodiment, among others while still maintaining most of the desired degrees of energy-conditioning functions within a typical amalgam or energy conditioner and/or energy-conditioning arrangement after it is normally manufactured and placed into a set of circuits and energized.

A material with predetermined properties 801 is normally interposed and non-conductively coupled substantially to most all points surrounding the various electrodes of the arrangement to provide not only a spacing or spaced-apart function between the various energy pathways or electrodes, (with the exception of predetermined locations normally found with each of the various spaced-apart electrodes of an arrangement of which these locals are utilized for facilitating conductive coupling between conductive portions).

Substances and/or a material with predetermined properties 801 will offer both energy insulation functions for the various electrodes of the arrangement, as well as providing for a casement and/or structural support; the proper spaced-apart distances (similar to what was just stated, above) required between the various shielded and shield electrodes of the arrangement.

These 801 material element(s) for the most part, are oriented in a generally enveloping and adjoining relationship with respect to the electrodes that are extending into and thru either in a singularly and/or grouped, predetermined pairings, and/or groups of electrode pathway elements that will include many of the various combinations.

It should also be noted that portions of material having predetermined properties 801, and/or planar-shaped portions of material 801 having only a single range or single property-type of predetermined electrical properties is not essential. In other versions of the amalgam or energy conditioner or energy-conditioning arrangement, embodiments of various types of spacing-apart mediums, insulators, material having predetermined properties 801, capacitive materials, and/or inductive, Ferro-magnetic, ferrite, varistor materials that can comprise a material 801, as well as compounds or combinations of materials having individually or almost any combination of properties of insulators, material having predetermined properties 801, capacitive materials, varistor, metal-oxide varistor-type material, Ferro-magnetic material, ferrite materials and/or almost any combination thereof could be used for spacing apart energy pathways of an embodiment, among others and among others are fully contemplated by the applicant.

Term '801 material independent', or 'dielectric independent', among others, allows interchangeability for a user for almost any possible 801 material or medium having some degree of insulating property(ies) to be used. 801 material, again is used for among other uses as a material for spacing apart energy pathways, or for supporting energy pathways in an amalgam or energy conditioner disclosed, among others not disclosed, which are fully acceptable for use for helping to produce multiple operable energy-conditioning functions to occur to some degree relative to a simple materials having predetermined properties 801 such as what similar functions an X7R 801 material yields a user, as the possible functions as found with non-X7R material 801 that will occur to some degree in almost any other 801 material make-up.

For example, amalgam or energy conditioner and/or energy-conditioning arrangements comprising a material 801 having ferrite properties and/or almost any combination of ferrites would provide an inductive characteristic that would add to the electrode's already inherent resistive characteristic.

In addition to at least some sort of spacing function normally filled by a material having predetermined properties 801, a non-conductive, and/or a semi-conductive mediums, a dielectric type of material, material with predetermined electrical properties 801 and/or a medium with predetermined properties as used can also be referred to as simply insulators, and/or even a non-conductive material portions 801. Other types of plates of and/or portions of material 801, material 801 combinations and/or laminates of material 801 that are not practicable for receiving electrode material deposits such as a self-supporting electrode may allow material 801 to be material that was either processed and/or chemically 'doped' where another spacing matter such as air and/or almost any other spacing is used instead.

In more detail, materials for composition of an embodiment, among others such as materials 801 for example, can comprise one and/or more than one, layers of material elements compatible with available processing technology and is normally not limited to almost any possible material having predetermined properties 801. These materials may be a semiconductor material such as silicon, germanium, gallium-arsenate, gallium arsenide, and/or a semi-insulating and/or insulating material and the like such as, but not limited to any K, high K and low K dielectrics and the like, but an embodiment, among others is normally not limited to any material having a specific dielectric constant, K.

It should be noted that even a form of an electrically conductive 'semi-dielectric' material 801"SD" (not shown) having a specific electrical resistance that includes a negative temperature coefficient. As this electrically conductive 'semi-dielectric' material 801"SD" relates to a method for producing a new, typical amalgam or energy conditioner component and to the use of the same, as it is contemplated by the applicant, such materials and material processes are amply disclosed in International Patent Application Publication, WO 01/82314 filed Apr. 25, 2000 and published world-wide on Nov. 1, 2001 and are hereby incorporated by reference. Electrically conductive 'semi-dielectric' layers 801 "SD" (not shown) can be produced from green 'semi-dielectric' films or materials and sintered together with the either, the various shielding electrodes and/or shielded electrodes as it suits the user, or combined with other materials 801 to allow the process to be done to one species of electrode and not the other. Electrode lead portions 79'X' can be conductively coupled to coupling electrode portion(s) or extension portions 798'X' as is normally done. These electrode lead portions 79'X' are positioned in relative, complementary paired relationships found to differing side portions sides of the amalgam or energy conditioner body as they are each conductively isolated (within the pairing) and separate and/or isolated from the other by a larger shielding electrode 8"XX".

One and/or more than one, of a plurality of materials like 801 and/or a combination of such, having different electrical characteristics from one another, can also be maintained between the shield electrodes and/or shielding electrode pathways and the shielded electrodes and shielded electrodes of the arrangement. Small versions of specific embodiment architecture and variants that are a few microns or even millimeters thick or less can embody many alternate electrode and material with predetermined properties such as a material with dielectric properties comprised of layers, up to 1,000 and/or more. Thus, the smaller-sized amalgams, amalgam, or energy-conditioning sub-circuit assemblies can just as well utilize elements comprising the spacing material 801 used by the nano-sized electrodes such as ferromagnetic materials and/or ferromagnetic-like dielectric portions or layerings, inductive-ferrite dielectric derivative materials. Although these materials also provide structural support in most cases of the various predetermined electrode pathway(s) within a typical embodiment, these materials with predetermined properties also aid the overall embodiment and circuits that are energized in maintaining and/or by aiding the simultaneously and constant and uninterrupted energy portion propagations that are moving along the predetermined and structurally supported, various predetermined electrode pathway(s) as these conductors are actually a portion of a circuit network and/or network of circuits.

Electrode and/or conductive materials suitable for electrode and/and/or electrode pathways may be selected from a group consisting of Ag, Ag/Pd, Cu, Ni, Pt, Au, Pd and/or other such metals. A combination these metal materials of resistor materials are suitable for this purpose may include an appropriate metal oxide (such as ruthenium oxide) which, depending on the exigencies of a particular application, may be diluted with a suitable metal. Other electrode portions, on the other hand, may be formed of a substantially non-resistive conductive material. Electrodes themselves can also use almost any substances or portions of materials, material combinations, films, printed circuit board materials along with almost any processes that can create electrode pathways from formally non-conductive and/or semi-conductive material portions; almost any substances and/or processes that can create conductive portions such as, but not limited to, doped polysilicon, sintered polycrystalline(s), metals, and/or polysilicon silicates, polysilicate silicate, etc. are contemplated by the applicant.

To reiterate, a typical embodiment, among others is normally not limited to just certain material portions of any type as long as a portion of one or more energy conditioning functions are operable at energization using almost any predetermined circuit coupling. This also includes utilizing additional electrode structural elements comprising either straight portions of or mixed portions conductive, conductive-resistive materials, semi-conductive and/or nonconductive elements, and/or multiple electrode pathways of different conductive material portion compositions, conductive magnetic field-influencing material hybrids, and/or conductive polymer sheets, various processed conductive and non-conductive laminates, straight conductive deposits, multiple shielding, relative, electrode pathways utilizing various types of magnetic material shields and selective shielding, doped (where a conductive or non-conductive portion(s) of a typical, new energy conditioner is/or are made by a doping process), and/or are conductively deposited on the materials and conductive solder and the like, together, with various combinations of material and structural elements to provide the user with a host and variety of energy-conditioning options when utilizing either discrete and/or non-discrete typical amalgam or energy conditioner and/or energy-conditioning arrangements and/or configurations that is normally predetermined before manufacturing and/or placement into an electrical system(s) for energization.

Expensive, non-commonly used, specialized, dielectric materials are no longer needed for many delicate bypass and/or energy decoupling operations in an attempt to maintain a energy conditioning and/or voltage balance between at least two balanced and opposing pairs of separate system circuit conductive energy pathways, as well as giving energy pathway arrangement and/or energy pathway arrangement circuit assembly users the opportunity to utilize these features in a single, materially and electrically balanced arrangement architecture that is normally homogeneous or in some cases heterogeneous with respect to other, various material make-up(s) found within a typical variant of an embodiment, among others.

Various hybrid polymer films comprising a polymer film, a plasma-treated surface, a vacuum-deposited, radiation-curable acrylate polymer with a plasma-treated surface as disclosed in U.S. Pat. No. 6,214,422 and incorporated by reference are some other of the various materials that are expected to find a variety of uses with this arrangement architecture for creating thin film metalized and foil passive conditioners along with other energy pathway arrangement and/or energy pathway arrangement circuit assembly applications that could utilize films such as PP and PET for passive devices herein. Other elements of a typical variant of an energy pathway arrangement and/or energy pathway arrangement circuit assembly are oriented in a generally parallel relationship with respect to one another and yet some can be in a generally perpendicular relationship with other elements of a typical energy pathway arrangement and/or energy pathway arrangement circuit assembly embodiment variations.

A typical variant of an energy pathway arrangement and/or energy pathway arrangement circuit assembly as a whole, does not necessarily have to be positioned in a parallel manner with respect to the earths' horizon; rather, the applicant contemplates not only horizontal positioning of the various, shielded, energy pathway(s) that are found almost totally contained within shielding, energy pathway structure, but also a vertical positioning of the various relative, energy pathway(s) and paired, shielded, energy pathway(s) that are s) that are almost totally contained within a typical new shielding, energy pathway structure that itself comprises part of one and/or more electrical circuits and/or circuit system portion(s).

Small versions of the energy pathway arrangement and/or energy pathway arrangement circuit assembly arrangement architecture and variants that are a from a few microns to a few millimeters thick and/or less can be embodied for many alternate, energy pathway arrangements and any material 801 with predetermined properties such as mentioned above. The result is an energy conditioner that is effective at up to 1000 Volts (V) with a capacitance in the nanoFarad (nF) to 1-farad (F) range, depending, of course, upon overall size and the number of energy pathway pairs that are disposed between the various shielding energy pathways. The material with dielectric prosperities space apart and separate the energy pathway portions, which, as described above, are interleaved in stacked electrically isolated relation relative to a complementary, positioned mate.

Fabrication of the thin film passives specifically with predetermined materials utilized that are somewhat related, though the end product is different, is described in U.S. Pat. Nos. 5,018,048, 5,097,800, and 6,214,422. Although not shown or specifically described in U.S. Pat. Nos. 5,018,048, 5,097,800 and 6,214,422, fabrication of the thin film passives using the unique energy pathway arrangement architecture(s) as disclosed or suggested, along with any other operable methods for fabricating multilayer passive components using the unique energy pathway arrangement architecture(s) within or as disclosed and/or suggested such as those having energy densities of at least 0.5 J/cm.sup.3 and/or more when amalgamated can be done using almost any possible manufacturing methodology that is operable for this type of result more and should not be considered novel or unique relative to any resulting, static embodiment arrangement utilizing the unique energy pathway arrangement architecture as is disclosed herein or not.

For example, one possible manufacturing methodology used could allow for at least three pluralities of interleaved, vacuum-deposited metal energy pathway layers with each energy pathway layer separated by a deposited and/or a vacuum-deposited, cured and/or a radiation-cured polymer dielectric portions that define the energy pathway active region. These interleaved metal energy pathway layer pluralities can be terminated at each respective outer perimeter edge portions by single layer and/or multilayer sputtered, solder material portion and/or conductive material coated termination energy pathway and/or portion. Forming a multilayer passive component and/or energy pathway arrangement comprising at least three pluralities of alternating metal layers and polymer dielectric portions and/or layers can be done on a substrate in a continuous, one-step process in a vacuum for example and each energy pathway is formed by metal evaporation.

The polymer dielectric portions and/or layers can be formed by first depositing a monomer layer an energy pathway of one of the pluralities for example and with a radiation-curing the monomer layer helps form the polymer dielectric portion and/or layer. Forming the metal layer on the polymer layer can be repeated many times to form the various pluralities of interleaved, vacuum-deposited metal energy pathways that are separated by the vacuum-deposited, radiation-cured polymer dielectric portions and/or layers.

The next step would then be a cutting of the multilayer passive components and/or energy pathway arrangements into a plurality of multilayer passive components and/or energy pathway arrangement strips along a first direction to that will form a single passive energy conditioning strip that can then be cut into individual passive energy conditioning components, energy pathway arrangement strips, and/or even passive conditioners and/or even inductors along a second direction that will be orthogonal to the first direction.

By following the cutting the of individual passive energy conditioning components, energy pathway arrangement strips, and/or even passive conditioners and/or even inductors into the plurality of portions, the metal energy pathways and/or energy pathway layers can be set into and/or recessed into the polymer layers along edges orthogonal to an opposite end not be set into and/or recessed into the polymer layers, thus creating a non-conducting portion and/or region that will help prevent arcing and/and/or leakage current between the metal energy pathway layers along the orthogonal edges and/or perimeter portions.

A typical arrangement will have normal industry excepted manufacturing tolerances for all of its elements, including but not limited to shielding, energy pathways, shielded, complementary energy pathways, materials having properties 801, as well as for the static the capacitive balances found between a commonly shared, central electrode pathway of a portion of a typical amalgam or energy conditioner or electrode arrangement, among others, as well as capacitive or magnetic balance levels that originated at the factory during manufacturing of the energy-conditioning arrangement, even with the use of common non-specialized dielectrics and/or electrode conductive material portions such as X7R, which are widely and commonly specified among prior art passives.

Because an amalgam or energy conditioner is designed to operate in electrically complementary operations simultaneously at A-line to A-line couplings as well as at least (2) A-line to C-line and B-Line to C-Line (C-Line being a conductive portion), C-line, in many cases a GnD, conductive portion serving as a circuit GnD potential or conductive portion serving as a voltage reference potential that is mutually shared by portions of circuitry as a result. Therefore, complementary, capacitive balance and/or tolerance balancing characteristic from each of the pair of A-line to C-lines for this type of energy circuit due to element positioning on opposite respective sides of C-line, the size of their separations (loop area or portion) as well as microns close relative positioning allow an electrode arrangement that is normally, manufactured at >0–25% capacitive tolerance internally, for example, will generally pass on to an energized circuit that capacitive tolerance which can be maintained and correlated to the original >0–25% capacitive tolerance internally for example, between an electrically and/or charge opposing and paired complementary energy pathways within a typical amalgam or energy conditioner or electrode arrangement, among others with respect to the energy dividing shielding electrode structures when placed into a system. (This is an example, only, and not an axiom.)

When a specific predetermined arrangement is normally manufactured, it can be shaped, buried within, enveloped, and/or inserted into various energy systems or other subsystems to perform various types of line conditioning, decoupling, or modifying of a propagation of energy to a desired energy form or electrical shape, depending upon attachment scheme.

A specific predetermined arrangement, among others, will allow an energy-conditioning arrangement configuration to utilize the voltage dividing and energy balancing mechanisms of opposing pressures found internally among the grouped, adjacent amalgam or energy conditioner and/or energy-conditioning arrangement elements, allowing for a minimized hysteresis and piezoelectric effect overall, through out the elements comprising a specific predetermined arrangement, among others. Internally, unbalanced, circuits portion arrangements of non-owned, prior art energy conditioners are normally operating with environments that can normally produce wide degrees of hysteresis effect, material memory effect, angular stresses, expansion due to thermal stressing various materials, such as having a different temperature coefficient of expansion and like, and are all reduced in terms of their effective operating efficiency and energy conditioning inefficiencies.

In contrast, a typical new embodiment is operable for a minimized hysteresis effect, i.e. hysteresis effect that is reduced closer to zero within an embodiment and/or AOC portion in a dynamic operation, due to complementary energy forces placed upon the various materials in a manner such that as portions of propagating energies are arriving in a complementary and symmetrical manner, simultaneously, and thus portions of propagating energies are doing so in a symmetrical and/or balanced manner to opposite sides of a given material area(s) or portion(s) that would normally expected to have significant hysteresis effect.

Through interpositioning of interposed shielding, energy pathways as well as, other elements such as material 801, portions for example, elements located between complementary and symmetrical energy pathways and/or pairings will be operating in a relative complementary energy propagation scheme to one another. Thus, the energy stress-handling capabilities of a new embodiment it is stated are substantially efficient and very difficult to duplicate with any non-owned, single device, prior art componentry.

One possible arrangement, among others translates into dynamic operations utilizing a typical new voltage dividing, energy pathway arrangement and a circuitry coupling scheme of a typical new circuit arrangement embodiment to substantially minimize and reduce the effect of a typical embodiments' various material elements' hysteresis and/or piezoelectric characteristics or attributed and/or hysteresis and/or piezoelectric characteristics inefficiency effects upon critical circuit energy portions preventing these inefficiencies from developing to effect critical circuit energy portions within the AOC 813 of a typical amalgam or energy conditioner and/or energy-conditioning arrangement, among others. Thus, much more energy is available for delivery to almost any active load or load component utilizing conditioned critical energy portions or energies than would otherwise be possible due to a typical embodiment having a complementary energy pathway arrangement and utilizing predetermined circuitry coupling scheme of a typical new circuit arrangement embodiment in combination with the shielding energy pathways of the complementary and symmetrical energy pathway arrangement portions, as just described.

Another arrangement for example that would benefit from the new embodiments would be various active components in dynamic operation, undergoing a switching response under various internal load conditions requiring switching time constraints which are designed to need instantaneous energy to allow such an energy-utilizing load (that would be coupled to an amalgam and/or energy conditioning arrangement circuit arrangement) to operate with an uninterrupted and/or harmonious energy supply to accommodate efficient energy-utilizing load operations that are performed.

An uninterrupted and/or harmonious energy supply to a energy-utilizing load is facilitated by the amalgams equally sized and oppositely arranged, paired complementary electrode pathways which can actually be considered a portion of a respective circuit system that resides within portions of the total amalgam or energy conditioner's AOC 813 so to be located both electrically and/or physically on the opposite sides of the same, positioned and shared shielding, electrode(s) and/or common shielding, electrode(s), Therefore, this effect of the interposition and/or interspersing of shielded circuit portions among the various numbers of shared shielding, common electrode(s) and/or a conductive coupled grouping of such also creates a voltage dividing function that actually divides various circuit voltage utilizations or energies approximately in half per paired line of a circuit system and provides each equally-sized conductor of at least a pair of two oppositely paired complementary conductors (per a multi-circuit arrangement), a grouping of (2) one half portions of the voltage energy from a circuitry (per circuit).

In dynamic operation, because the complementary paired and shielded, equally-sized electrodes are opposing one another physically and/or electrically in a charge-opposing manner between an interpositioned shielding relative, conductors or electrodes pathways (not of the complementary pathways) can one recognize that a voltage dividing relationship exists within an energized circuitry. Energized circuitry comprising complementary conductors within a typical amalgam or electrode arrangement, among others are normally balanced as a whole, electrically and/or in a charge-opposing manner, internally, and with respect to a centrally positioned shielding, common and shared pathway electrode(s) relative to each circuit system member and/or portion is of an amalgam and/or energy-conditioning arrangement.

Each common circuit system member and/or portion comprising an energy conditioner and/or energy-conditioning arrangement is normally attached or coupled (conductively) to a common area or portion and/or common electrode to provide an outer common zero voltage for what is termed a "0" reference circuit node of a typical energy conditioner, among others and/or energy-conditioning assemblies for energy relationships with various portions of propagating energies found within each of the at least multiple circuitries comprising at least a portion of an AOC 813 of a typical energy conditioner and/or energy-conditioning arrangement.

As earlier described, a properly coupled energy conditioner and/or energy-conditioning arrangement, among others, whether it be discrete and/or non-discrete, will generally aid in achieving an ability to perform multiple and distinct energy-conditioning functions simultaneously, such as decoupling, filtering, voltage balancing utilizing various parallel positioning principals for a pair of circuit portions or pluralities of paired circuit portions that comprise and/or can be characterized by from separate and/or distinct circuits, which are relative to a respective energy source, respective paired energy pathways, the respective energy utilizing load and the respective energy pathways returning back to the respective energy source to complete the respective circuit.

Thus, internally, balanced circuit portions of a typical energy conditioner while operating with opposing or nulled dynamics that would otherwise produce wide degrees of hysteresis effect, material memory effect, angular stresses, expansion due to thermal stressing various materials in single line, prior art devices, and like, will be operable to divide these same effects and/or stresses by the utilization of the interposing shielding energy pathways which now divide symmetrically these forces into opposing and complementary effects and/or stresses relative to one another, respectively. Therefore, opposing, yet balanced and symmetrically complementary energy portions and/or forces generally cancel one another or null out to one another, internally, within the AOC 813, to complement a typical energy conditioner's voltage dividing ability of a typical energy conditioner configuration, as it would operate in a mutually opposing, energy-portion propagation state or dynamic operation.

By the opposing, but electrically canceling and complementary positioning of portions of propagated energy acting along the complementary paired, internal electrodes in a balanced manner from opposite sides of shielding energy pathway set, a "b 0" Voltage reference function is created simultaneously, by the same, predetermined positioned and shared, shielding, electrodes that are conductively coupled electrically common to one another.

Piezoelectric effect is also minimized for the materials that make up portions of an embodiment, Therefore, energy portions are not detoured or inefficiently utilized internally within the AOC 813 and are thus available for use by the energy-utilizing load in a largely dramatic increase in the ability of standard and/or common materials having predetermined properties 801 to perform functions as they were designed for within the AOC 813 and the circuitry in a broader, less restrictive use, thus, reducing costs.

A typical energy conditioner and/or energy-conditioning arrangement, among others allow what appears to be an increased performance of the 801 materials (what ever is used) over performance levels normally observed when used with prior art devices in an energized state. However, this increased performance of the 801 materials is only an observation of what ideally should be, all the result of the energy pathway arrangements allowing energy portion propagations to symmetrically and complementary interact with one another is such an efficient manner that what is observed is the 801 materials operating in an "un-governed" or wide-open state of performance, much closer to an ideal performance envelope to which these materials have been conceived, designed, and/or utilized to produce.

Therefore, a typical conditioning arrangement as a whole, when in dynamic operation reduces or minimizes observed physical inefficiencies that prior art devices have add to constrain the true attributes of any of the possible the 801 materials when they have been (prior art devices) used in a typical circuit system.

Use of a properly coupled, typical energy-conditioning arrangement, among others in the same circuit generally allows for a balanced, proportional symmetry of energy portions interaction scheme to be achieved by way of complementary energy portion propagations that are occurring within an AOC 813 of a typical-conditioning arrangement or amalgam.

Therefore, a typical conditioning arrangement or amalgam as a whole, allows 801 materials to produce or yield an energy-conditioning function substantially closer to an ideal state of material 801 designed for performance that was normally masked (by prior art) as these 801 materials were functioning for a give circuit system.

A possible result, among others, is that in some cases, an observation can be made as to a simultaneously minimization upon portions of a typical 801 material's hysteresis along with control of 801 material's piezoelectric effects as a result of the absence of the un-balanced energies or parasitics that would otherwise be observed or normally found in a comparable circuit using prior art.

A simultaneously minimization of typical 801 material's hysteresis along with control of 801 material's piezoelectric effects occurs generally within the AOC 813 that would otherwise be observed. This simultaneously minimization of both hysteresis and piezoelectric effects is an ability that translates or equals to an increase energy-conditioning performance levels for such applications as SSO states, decoupling power systems, quicker utilization of the passive component by the active component(s) which is also achieved directly attributed to these stress reductions and the balanced manner in which propagated energy is allowed to utilize a typical embodiment configuration.

This situation allows a typical arrangement to appear as an apparent open energy flow simultaneously on both electrical sides of a common energy reference (the first plurality of electrodes or the shielding, energy pathways) along both energy-in and energy-out pathways (the energy-in and energy-out pathways being relative to a energy-utilizing load and energy source, not necessarily to the embodiment, which in many cases in placed parallel to the energy-utilizing load and energy source in bypass configurations as opposed to direct feedthru arrangements.) that are connecting and/or coupling from an energy source to a respective energy-utilizing load and from the energy-utilizing load back to the energy source for the return.

It should be noted that a feedthru electrode could also be in bypass arrangement when the circuit pathway is not solely thru the AOC 813, but is allowed at least the availability to not only go thru an embodiment but to also bypass a portion of circuitry that would otherwise bring all of the energies thru the AOC 813.

This is a parallel energy distribution scheme that allows the material make up of most all of the manufactured energy conditioner and/or energy-conditioning arrangement elements to operate or function together more effectively and/or efficiently with the energy-utilizing load and/or the Energy source pathways located as part of an overall a circuit system. Therefore, the embodiments are also functioning, overall as an integrated, complementary energy-conditioning network.

A typical energy-conditioning arrangement, among others, can be an electrode arrangement with other predetermined elements in a predetermined coupled circuit arrangement combination utilizing the nature of a typical energy conditioner's electrode arrangement's architecture, which is the physical and energy dividing structure created.

Conductive coupling and/or conductive attachment of the odd integer numbered plurality of electrodes that are shielding to an outer conductive area or portion (isolated or not from the complementary circuit portions) as well as almost any complementary electrodes or complementary energy pathways not of the shielding pathways can include, among others, various standard industry attachment/coupling materials and/or attachment methodologies that are used to make these materials operable for a conductive coupling, such as soldering, resistive fit, reflux soldering, conductive adhesives, etc. that are normally standard industry accepted materials and/or processes used to accomplish standard conductive couplings and/or couplings.

Conductive coupling and/or conductive attachment techniques and/or methods of a specific embodiment or a specific embodiment in circuit arrangements, among others to an outer energy pathway can easily be adapted and/or simply applied in most cases, readily and/or without almost any additional constraints imposed upon the user. Conductive coupling of electrodes either together or as a group to an outer common area or portion and/or pathway allows optimal energy-conditioning functionality to be provided in most cases by a typical energy conditioner and/or energy-conditioning arrangement, among others to be operable. These energy-conditioning functions include but are not limited to mutual cancellation of induction, mutual minimization of energy parasitics operable from opposing conductors while providing passive component characteristics.

It should be noted that there are at least three shielding functions that generally occur within typical energy conditioner or electrode arrangement, among others because of the amalgamated plurality of electrodes when conductively coupled to one another are used for shielding, some functions dependant upon other variables, more than others are. First, a physical shielding function such as RFI shielding which is normally the classical "metallic barrier" against most sorts of electromagnetic fields and is normally what most people believe shielding actually is, however this metallic barrier appears as general contributor to the overall performance of the three shielding functions used.

Another shielding function used in a typical embodiment, among others is can be broken into a predetermined positioning or manner of the relative positional relationship and/or a relative sizing relationship both between the shielding, electrodes respective of are relative to the predetermined positioning or manner of the relative positional relationship and/or a relative sizing relationships of the contained and oppositely positioned, complementary electrode pathway pair(s).

These oppositely paired complementary electrode pathways are operable inset of the shielding, electrodes' conductive area or portion relative to the conductive portion of each of the paired complementary electrode pathways' conductive portion as they are each normally positioned sandwiched between at least two shielding electrodes in a reverse mirroring sandwiching against its paired complementary electrode pathway mate that is normally the same shape and size in their respective compositions as general manufacturing tolerances will allow.

A physical shielding of paired, electrically opposing and adjacent complementary electrode pathways portion of the second shielding function is accomplished by the size of the common electrode pathways in relationship to the size of the complementarily electrode pathway/electrodes and by the energized, electrostatic suppression and/or minimization of parasitics originating from the sandwiched complementary conductors, as well as, preventing outer parasitics not original to the contained complementary pathways from conversely attempting to couple on to the shielded complementary pathways, sometimes referred to among others as parasitic coupling.

Parasitic coupling is normally known as electric field ("E") coupling and this shielding function amounts to primarily shielding the various shielded electrodes electrostatically, against electric field parasitics. Parasitic coupling involving the passage of interfering propagating energies because of mutual and/or stray parasitic energies that originate from the complementary conductor pathways is normally suppressed within a new, typical electrode arrangement. A typical energy conditioner or electrode arrangement, among others blocks capacitive coupling by almost completely enveloping the oppositely phased conductors within universal shielding structure with conductive hierarchy progression that provide an electrostatic and/or Faraday shielding effect and with the positioning of the layering and/or pre-determined layering position both arranged, and/or co-planar (inter-mingling).

Coupling to an outer common conductive portion not conductively coupled to the complementary electrode pathways can also include portions such as commonly described as an inherent common conductive portion such as within a conductive motor shell, is not necessarily attached and/or coupled (conductively) to a conductive chassis and/or earth energy pathway and/or conductor, for example, a circuit system energy return, chassis energy pathway and/or conductor, and/or PCB energy pathway and/or conductor, and/or earth ground. A utilization of the sets of Internally located common electrodes will be described as portions of energy propagating along paired complementary electrode pathways, these energy portions undergo influence by a typical energy conditioner, among others and/or energy-conditioning assemblies' AOC 813 and can subsequently continue to move out onto at least one common externally located conductive portion which is not of the complementary electrode pathways pluralities and therefore, be able to utilize this non-complementary energy pathway as the energy pathway of low impedance for dumping and/or suppressing, as well as blocking the return of unwanted EMI noise and/or energies from returning back into each of the respective energized circuits.

Finally, there is a third type of shielding that is normally more of a energy conductor positioning 'shielding technique' which is normally a combination of physical and/or dynamic shielding that is used against inductive energy and/or "H-Field" and/or simply, 'energy field coupling' and is normally also known as mutual inductive cancellation and/or minimization of portions of "H-Field" and/or simply, 'energy field' energy portions that are propagating along separate and opposing electrode pathways. However by physically shielding energy while simultaneously utilizing a complementary pairing of electrode pathways with a predetermined positioning manner allows for the insetting of the contained and paired complementary electrode pathways within an area or portion size as that is normally constructed as close as possible in size to yield a another type of shield and/or a 'shielding technique' called an enhanced electrostatic and/or cage-like effects against inductive "H-Field" coupling combining with mutual cancellation also means controlling the dimensions of the "H-Field" current loops in a portion of the internally position circuit comprising various portions of propagating energies.

Use of a specific embodiment, among others can allow each respective, but separate circuits operating within a specific embodiment, among others to utilize the common low impedance pathway developed as its own voltage reference, simultaneously, but in a sharing manner while each utilizing circuit is potentially maintained and balanced within in its own relative energy reference point while maintaining minimal parasitic contribution and/or disruptive energy parasitics 'given back' into almost any of the circuit systems contained within a specific embodiment, among others as it is normally passively operated, within a larger circuit system to the other circuits operating simultaneously but separately from one another.

A typical electrode shielding arrangement or structure will within the same time, portions of propagating circuit energies will be provided with a diode-like, energy blocking function of high impedance in one instant for complementary portions of opposing and shielded energies that are propagating contained within portions of the AOC 813 with respect to the same common reference image, while in the very same instant a energy void or a function of low impedance for energy portions opposite the instantaneous high impedance for energy portions is operable in an instantaneous, high-low impedance switching state, that is occurring instantaneously and a symmetrically correspondingly, manner straddling opposite sides of the central, shielding, energy pathway, among others, in a dynamic manner, at the same instant of time, all relative for the portions of complementary energies located opposite to one another in a balanced, symmetrically correspondingly manner of the same, shared shielding arrangement structure, as a whole, in an electrically, harmonious manner.

Sets of internally located common electrodes are conductively coupled to the same common externally located conductive portion not of the complementary electrode pathways to allow most circuit systems to utilize this non-complementary energy pathway as the energy pathway of low impedance simultaneously relative to each operating circuit system for dumping and/or suppressing, as well as blocking the return of unwanted EMI noise and/or energies from returning back into each of the respective energized circuit systems.

Because of a simultaneous suppression of energy parasitics attributed to the enveloping shielding electrode structure in combination with the cancellation of mutually opposing energy "H" fields attributed to the electrically opposing shielded electrodes, the portions of propagating energies along the various circuit pathways come together within the AOC 813 of a specific embodiment, among others to undergo a conditioning effect that takes place upon the propagating energies in the form of minimizing harmful effects of H-field energies and/or E-field energies (E-field energies also called near-field energy fluxes) through simultaneous functions as described within the AOC 813 of each and/or almost any typical embodiments or a specific embodiment in circuit arrangements, among others that also contains and/or maintains a relatively defined area of constant and/or dynamic simultaneous low and high impedance energy pathways that are respectively switching yet are also located instantaneously, but on opposite sides of one another with respect to the utilization by portions of energies found along paired, yet divided and shielded, complementary electrode pathways' propagation potential routings.

It should be noted, that although not shown, (with the exception of FIGS. 10 and 11, for example where this is shown), various embodiment energy pathway layerings shown or not, are fully contemplated to have either 'split' energy pathway configurations in uniform or non-uniform size/shape combinations with various types of non-'split' energy pathway configurations. A split energy pathway functions similar to a non-'split' energy pathway, but in an improved manner to that of a non-split energy pathway. This will be explained further in FIG. 10, however, it should be noted that similarly, that all energy pathways shielded or shielding electrode can comprise and/or can be characterized by a corresponding superposed, closely spaced pair of thin conductive, and/or conductive-resistive materials that are simply separated by a portion of a non-conductive material or an insulating (to what ever degree necessary to prevent full contact and/or non-separation) portion or an insulating material portion that is normally thinner or found in less volume (designated 814B) than a spacing 814 or even 814A that is utilizing portions(s) of a non-conductive material or an insulating (to what ever degree necessary to prevent full contact and/or non-separation) element(s) or an insulating material portion(s) from conductive and/or electrical contact of their (the two portions comprising a 'split' portion, respective of each main-body portions 80 (or 81,) which ever is the case) that comprise a whole, 'split' energy pathway elements(s), (a whole, 'split' energy pathway would include any extensions if found).

'Split' energy pathways can be beneficial in some configurations as this allows for an increase to the point of doubling, a total energy pathway(s) surface area when utilizing a split pathway configuration. Common, shielding pathway structure elements that comprise a larger universal shielding, structure, arrangement will also be able to increase or better handle energy propagation pathway functions in some configurations.

While 'split'-pathway energy pathway construction can substantially increase the relative current carrying ability over that of one single, 'non-split' energy pathway, this feature will also allow a voltage dividing function of almost any typical, new embodiment, among others, like to further take advantage of the energy pathway architecture's symmetry and complementary balance to increase a typical, new embodiments' own overall current handling ability while performing such functions as voltage dividing, among others, while also allowing for a reduction in what would be a (a non-split energy pathway now being substituted with a split configuration) overall size of a normally non-split energy that would not be expected for such an embodiment, as it is able to still maintain a relatively less stressful energy-conditioning environment for the various pathway material elements like 799/499 for example, can also comprise the various types of possible new embodiments. Due to the interest of time, the various combinations of 'split' and 'non-split' energy pathway configurations have been omitted in this disclosure for specific drawings other than in FIG. 10.

Now turning to FIG. 1, which shows a portion of a shielding electrode 800/800-IMC, which is showing a portion of a sandwiching unit 800Q comprising a predetermined, positioned central shared, shielding, electrode 800/ 800-IMC arranged upon a structure material portion 800-P which comprises a portion of material 801 having predetermined properties.

In FIG. 2, the shielded electrodes 845BA, 845BB, 855BA, 855BB, 865BA, 865BB are generally shown as the smaller sized electrodes of the two sets of electrodes of the second plurality of electrodes. In this configuration, the smaller sized, main-body electrode portion 80 is being utilized by energy portion propagations 813B while the larger sized, main-body electrode portion 81 of the shielding electrode 800/800-IMC similar to that of FIG. 1 and/or similar, but not identical of the type of single shielding structure (not shown) that would be handling the energy portion propagations 813A moving outward from the center portion of the shielding electrode and the AOC 813 portion of influence similar to that depicted in FIG. 1.

Referring again to FIG. 1, moving away, in both directions, from a centrally positioned shielding, electrode 800/ 800-IMC, are electrodes and/or electrode pathways 855BB and 855BT (not shown), respectively, that both simultaneously sandwich in a predetermined manner, center shielding electrode 800/800-IMC. It is important to note that the main-body electrode portion 81 of each shielding electrode of the plurality of shield electrodes is larger than a sandwiching main-body electrode portion 80 of any corresponding sandwiched shielded electrode of the plurality of shielded electrodes. A plurality of shielded electrodes are normally configured as being shielded as bypass electrodes, as described herein and/or not, however shielded feedthru electrodes can be configured, as well, upon the need.

A manufacturer's positioning of conductive material 799 as electrode 855BA creates an inset portion 806 and/or distance 806, and/or spacing portion 806, which is relative to the position of the shield electrodes 800 relative to the shielded electrodes 855BA. This insetting relationship is normally better seen and/or defined as the relative inset spacing resulting from a sizing differential between two main-body electrode portions 80 and 81, with main-body electrode portion 81 being the larger of the two. This relative sizing is in conjunction as well as with a placement arrangement of various body electrode portions 80 and 81 and their respective contiguous electrode portion extensions designated as either 79G and/or 79'X' herein, most of which are positioned and/or arranged during the manufacturing process of sequential layering of the conductive material 799 and/or 799'X' that in turn will form and/or result with the insetting relationship and/or appearance found between electrode perimeter edges designated 803 of a respective electrode main-body portion 80 and the electrode perimeter edges designated 805 of the larger respective electrode main-body portion 81, respectively.

In most versions of a typical energy conditioner or electrode arrangement, among others, main-body electrode 80/81s can be normally defined by two major, surface portions, but shaped to a desired perimeter to form a electrode main-body portion 80 and/or 81 of each respective electrode element's material 799 used and to which, normally a general portion size of material 799 can be ordered. These electrode main-body portion 80s and/or 81 will not include any electrode portion considered to be of the 79G and/or 79"XZ" or 79"XX" lead electrode and/or electrode extension portion(s) contiguously coupled as defining a size of a typical main-body electrode 80/81.

It should be noted, that the size of most electrode main-body portion 80s and/or the size of most electrode main-body portion 81s' material 799 for almost any of the respective electrodes can be of the same shape per grouping (80 or 81), respectively (as manufacturing tolerances allow) within almost any typical energy conditioner and/or energy-conditioning arrangement (or can be mixed per individual sub-circuit arrangement relative to another sub-circuit arrangement electrode set) and insetting positioning relationships can be optional.

Positional arrangements of a complementary pathway and/or complementary pathway pairings are made to allow benefit of simultaneous, energy portion suppression and/or energy portion shielding to and/or from, various, portions of parasitic energy, by superposed (but, separated) positioning or the inset, superposed, positioning of a majority of the conductive areas of a typical complementary electrode/ energy pathway and/or pairing(s).

Complementary pathway and/or complementary pathway pairings normally find within an AOC, a substantial portion of electrode area of each energy pathway of the pairing (having and/or not having an electrode main-body portion 80, respectively) that facilitate these energy-conditioning functions as they occur. These arrangements comprise a superposed alignments of at least three, larger-sized, shield electrodes/shielding energy pathways for a pairing (with each shielding energy pathway of the three pathways having and/or not having an electrode main-body portion 81, respectively) being utilized.

Such shielding or immuring arrangement(s) of (a) substantial portion(s) of a complementary energy pathway area(s) within a typical AOC portion of a typical new embodiment is/or are found to be an almost enveloping arrangement manner that utilizes or comprises a 'non-direct contact sandwiching' of the conductively coupled, shielding electrode pairing or shielding energy pathway pairing(s) that are conductively coupled to one another that allows for a typical AOC to be comprising and/or operable for not only a static shielding of a smaller-sized complementary energy pathway pairing, but operable for dynamic shielding and/or dynamic suppression function(s) of energy portions that Is and/or are at least operable within the superposed alignment of the shielding, energy pathways, as noted.

Immuring or insetting portions of complementary electrodes with/or without main-body portion 80s within the footprint of the larger electrode main-body portion 81s' allows enhancement of an overall, larger, shielding conductive structure's effectiveness for dynamic shielding (electrostatic shielding) of energies as compared to configurations utilizing an arrangement that does not use 806 insetting of uniform, smaller electrode main-body portion 80s within at least uniform, larger-sized (relative to uniform, smaller-sized electrode main-body portion 80s or electrodes) electrode main-body portion 81s of two larger, shielding electrodes.

An insetting distance 806 can be defined using an objective or subjective distance multiplier and/or a subjective and/or relative distance multiplier that can be at least greater than zero, respective of an inset distance 806 being relative to a multiplier chosen of the spaced-apart distance relationship found between an electrode main-body portion 80 and an adjacent electrode or electrode main-body portion 81 of an electrode(s) that can comprise a typical new energy pathway or electrode arrangement.

A multiplier can be used that gauges a relative, spaced-apart thickness measurement or spacing of a material with predetermined properties 801 found separating and/or maintaining separation between two typical adjacent electrode main-body portion 80s and an electrode main-body portion 81 within an embodiment that can also be used as an inset, range determinant.

For example, electrode main-body portion 80 of 855BB can be stated as being 1 to 20+ (or more) times the distance and/or thickness of the material with predetermined properties 801 found separating and/or maintaining separation between electrode 855BB's electrode main-body portion 80 and adjacent center co-planar electrode 800-IM's electrode main-body portion 81 similar to that of FIG. 1. This amount or range distance or area 814"X" is created as a zone defining boundaries of an insetting position of a typical electrode main-body portion 80 that could or can be variable for each embodiment and/or application. In any case, distance or area 814"X" created as a zone defining boundary or not, should be to a size and/or spacing or a degree to which an electrostatic shielding operation of portions of propagating energies utilizing a typical electrode and/or typical electrode main-body portion 80, is operable for at least some type of an electrostatic shielding function, either grounded or not.

In other cases almost any one adjacent (next to) shielding electrode should not be smaller than any one adjacent (that it is next to) complementary electrode or shielded, electrode that is being shielded by it (the any one shielding electrode). Electrodes or energy pathways will comprise a main-body electrode 80 having at least a first lead or extension portion designated 79"XZ", 'X'="B"=-Bypass or "F"-Feedthru depending upon propagation to be used, "Z"=extension of an electrode "A" or "B" and finally, if needed "#"=the numbered unit where there is a more than one extension portion per main-body electrode. For example, FIG. 1 uses a 79BA as the extension of electrode 855BA. A complementary main-body electrode 80 of 855BA, but not shown having at least a first lead or extension portion as well would be designated 79BB, as the first and second lead or extension portions of electrodes 855BA and 855BB (not shown) are arranged complementary opposite to the other in this arrangement.

It should be noted that the applicant also contemplates various size differential electrodes pairs that would also be allowed between the various electrode main-body portions designated as 80 of a plurality of co-planar arranged, electrodes in almost any array configuration. Although not shown, the portion and/or layer of a material with predetermined properties 801 can include additional co-planar arranged, electrode layering. Respective outer electrode portion(s) and/or electrode material portion 890A, 890B, and/or designated 890'X', 798-1, 798-2, and/or designated 798-'X' (not all shown) for each plurality of electrodes to facilitate common conductive coupling of various same plurality electrode members can also facilitate later conductive coupling of each respective plurality of electrodes to almost any outer conductive portion (not shown), energy pathway (not all shown).

Focusing beyond the electrode extension portions (or simply, 'extension portion' (s), used herein) which are contiguous in make-up to each respective electrode main-body portion 80 and/or 81, generally, electrode main-body portion 80$s$ are normally spaced-apart but physically inset a predetermined distance to create an inset portion 806 relative to the electrode main-body portion 81$s$. A electrode main-body portion 80 is normally smaller-sized (compared to the adjacent main-body shield electrode 81$s$) and superposed within the portion coverage of each of the at least two spaced-apart, but larger electrode main-body portion 81$s$ of two shield electrodes with the only exceptions being the electrode extension portion(s) (if any) like 79BA similar to that of FIG. 1, for example, in that are each operable for a subsequent conductive coupling to a point beyond the electrode main-body portion 80 from which it is contiguously and integrally apart of.

It should be noted, that same manufacturing process that might place the 79"X" or 79"XX" lead conductive portion and/or electrode extension portions, non-integral and/or integral and contiguously at the same time could very well apply. For example, a bonded, and/or fused, non-integral, and/or non-contiguous 79"XX" (not shown) portion could be added later by and/or during manufacturing of certain other variants of a new energy pathway arrangement. This, later applied, extension type is allowed and would utilize such a combination of electrode main-body portion 80 and a non-contiguous/integrally produced conductive 79"XZ" or 79"XX" portion that would still be need to be conductively coupled in a manner that would be allow substantially the same conditions of operations of the contiguous version.

There is normally no precise way of determining the exact point where an electrode main-body portion 80 and/or 81 ends and where a 79G and/or 79"XZ" or 79"XX" extension electrode portion begins and/or starts for a typical shielded electrode and/or shielding electrode other than it is normally safe to say that to define the extension, the electrode main-body portion 80 for a typical shielded electrode will be considered to be the portion that is positioned for creating a predetermined distance and/or an average of a predetermined distance 806 that is found between and/or within the common perimeter and/or the average common perimeter of a shielding electrode edge 805 of an adjacent shielding electrode of the shielding electrode plurality that form shielding, electrode perimeter edges 805 from common superposed arrangement of a predetermined number of electrode main-body portion 81$s$ which could be any number odd integer number greater than one of common electrode members for shielding the shielded electrode grouping found within an electrode arrangement embodiment.

Therefore, this is to include at least three shield electrodes for shielding complementary electrodes that are paired within a typical energy conditioner or electrode arrangement, among others with respect to electrode main-body portion 80's of the at least two shielded, electrodes. A same conductive material 799 can comprise and/or can be characterized by most electrodes of a typical energy conditioner or electrode arrangement, among others as having uniform electrode materials 799 arranged in a predetermined manner, or even non-uniform electrode material 299 compositions, which are equally sufficient.

There are normally at least two pluralities of electrodes, a first plurality of electrodes where each electrode is of substantially the same size and shape relative to one another. These electrodes of the first plurality of electrodes will also be coupled conductively to each other and aligned superposed and parallel with one another. These common electrodes are also spaced-apart from one another to facilitate the arrangement of various members of the second plurality in a corresponding relative relationship to one another (members of the second plurality of electrodes) within the superposed shielding arrangement created with the first plurality of electrodes. This means that regardless of the rotational axis of a superposed grouping of the first plurality of electrodes with respect to the earths' horizon will be called a stack or arrangement of the first plurality of electrodes.

Within this first plurality of electrodes, arrangement, or superposed stacking will also comprise at least portions of 801 material(s) having predetermined properties. The number of a configuration of superposed electrodes of the first plurality is an odd-numbered integer greater than one.

These electrodes could also be conductively coupled to one another by at least one portion of conductive material that provides contiguous and common conductive coupling along at least an edge of each electrode of the of the common grouping of electrodes that would allow the plurality to be considered, or to function as a non-grounded single common conductive structure, a non-grounded shielding conductive cage or a non-grounded Faraday cage. In many configurations, at least two portions of conductive material will provide contiguous and common conductive coupling along at least an edge of each electrode of the of the common grouping of electrodes on at least two portions of grouped edgings and will be separate and/or isolated from the other. When this portion or portions of the now shielding structure are conductively coupled to an outer conductive potential, a state of grounding or reference would be created.

The total number of the second plurality of electrodes is an even integer. Electrodes of the second plurality of electrodes can also make up two groupings or sets of electrodes of the second plurality of electrodes which can be considered divided into two half's of the even number of electrodes of the second plurality of electrodes comprising a first set of electrodes, which are then considered complementary to the remaining set of electrodes of the two half's of the even number of electrodes and having a correspondingly paired electrode to each other as in the case of only two electrodes total, a pairing of electrodes, respectively (It is noted that these sets themselves can be further characterized as at least a first and a second plurality of electrodes of the second plurality of electrodes, in accordance with the description below).

Electrodes are spaced-apart from one another. If they are considered co-planar in arrangement with other electrodes of the first set of electrodes of the second plurality of electrodes when found on one layering, while each electrode of the second set of electrodes of electrodes of the second plurality of electrodes is correspondingly paired to a complementary, oppositely arranged electrode, but on a second co-planar layering of electrodes. It should be also noted that as depicted in FIGS. 5D–5C, 5C, and 8A, for example members of either the first or second set of electrodes can be co-planar and interspersed among one another while each electrode of the co-planar electrodes still as an oppositely oriented counter-part electrode mate on a different layering.

It should also be noted that while each shielded, electrode of a specific complementary pairing of electrodes are of substantially the same size and the same shape, a second complementary pairing of electrodes that are also spaced-apart from one another of generally the same size and the same shape do not necessarily have to correspond as being individually of generally the same size and the same shape as members of the first complementary pairing of electrodes as is depicted in FIGS. 3A and 4A It should also be noted that as part of the overall electrode arrangement in almost any energy conditioner, the first pair of electrodes (shielding) and the second pair of electrodes (shielded) maintain an independence of size and shape relationships from one another. While the first pair of electrodes and the second pair of electrodes of the second plurality of electrodes can comprise electrodes of substantially the same size and the same shape, it is not a requirement. Only as a pair of electrodes, 'individually', do any complementary electrode pairs need to be maintained as two electrodes of equal size and shape relative to each other so that a complementary relationship is created between specifically paired electrodes.

For another example, while the second pair of electrodes could be the same size as the first pair of electrodes, the second pair of electrodes could still be of a different shape than that of the first pair of electrodes. Again, the converse holds true. Other pairs of electrodes added beyond the at least two pairs of electrodes would also maintain this independence of size and shape from that of the first two pairs of electrodes as part of an overall, new energy conditioner having an electrode arrangement.

Continuing, embodiments below, and among others not shown, provide a small variety of possible electrode combinations, each relative to a particular embodiment as shown, but universal to the main objective of the disclosure. A main objective of the disclosure is to provide a shielding and shielded electrode arrangement with other elements in-combination for allowing at least two independent and electrically isolated circuit systems to mutually and dynamically utilize one typical discrete or non-discrete energy conditioner having an electrode arrangement, internally.

Accordingly, the new typical passive architecture, such as utilized by a specific embodiment, among others, can be built to condition and/or minimize the various types of energy fields (h-field and e-field) that can be found in an energy system. While a specific embodiment, among others is normally not necessarily built to condition one type of energy field more than another, it is contemplated that different types of materials can be added and/or used in combination with the various sets of electrodes to build an embodiment that could do such specific conditioning upon one energy field over another. Various thicknesses of a dielectric material and/or medium and the interpositioned shielding electrode structure allow a dynamic and close distance relationship with in the circuit architecture to take advantage of the conductive portions propagating energies and relative non-conductive or even semi-conductive distances between one another (the complementary energy paths).

As depicted in FIGS. 2A and 2B, a specific embodiment like 6005, among others can include groupings of predetermined elements selectively arranged with relative predetermined, element portioning and sizing relationships, along with element spaced-apart and positional relationships combined to also allow portions of at least two independent and electrically isolated circuit systems, as depicted in FIG. 2C to mutually and dynamically utilize, simultaneously, one common circuit reference potential or node provided in part by the shielding electrode portion of the given energy, conditioner and of which this shielding portion is in conductive combination with a common voltage potential of a conductive portion located beyond a typical energy conditioner, among others' AOC 813.

When conductive coupling of the plurality of shielding electrodes to an outer common conductive portion found beyond AOC 813 is made utilizing standard coupling means know in the art such as solder material (not shown), or resistive fit coupling (not shown) or others is made to physically and the shielding structure is now enlarged via the conductive 'meld' or conductive integration of the now larger shielding portion that occurs. A shielding electrode structure of electrodes 830, 820, 810, 800/800-IMC, 815, 825, and 835, conductively coupled to electrode extension portions 79G-1, 79G-2, 79G-3 and 79G-4, and then to 798G-1, 798G-2, 798G-3 and 798G-4 and then with the final physical act of coupling by standard means known in the art that can include almost any or almost all types of coupling methods, processes or conductive materials, etc. (contingent upon a specific chosen application, of course) with conductive portion 007, the portion 007 now functioning as part of a typical energy conditioner circuit arrangement in that a CRN or common reference node, as depicted in FIG. 2C becomes established during dynamic or energized operations and the shielding structure elements are simply the extension of the outer conductive portion 007 now brought in parallel and microns close to paired and opposing circuit pathway portions for each circuit included a typical embodiment.

Typical energy conditioner configurations shown herein include FIG. 2A, FIG. 3A, FIG. 4A, FIG. 5A, FIG. 5C FIG. 7A, FIG. 8A, FIG. 10 and FIG. 11 with embodiments 6005, 8005 and 10005, 1005, 1105, 1207, 1200, 19200, and 19210 among others but shown herein, respectively. Of these embodiments, there are at least three types of multi-circuit energy conditioner arrangements that can be defined within this disclosure, a straight stacked multi-circuit arrangement, a straight co-planar stacked multi-circuit arrangement, and a hybrid of the straight/co-planar multi-circuit arrangements, each in its own integrated configuration. Generally, an energy conditioner will comprise at least two internally, located circuit portions per circuit system, both of which (each internally located circuit portion pairing) are considered to be part of one larger circuit system, each and not of the other, respectively.

Each circuit portion can comprise portions of a first and a second energy pathway, each of which is in some point considered part of a typical energy conditioner, among others itself, within the AOC 813. For example, the first and second energy pathways S-L-C2 and L-S-C2 and the S-L-C1 and L-S-C1 of each isolated circuit system, respectively. First and second electrode portions of the respective energy pathways designated 855BA and 855BB for C1 and 845BA, 845BB, 865BA and 865BB for C2 and exist as energy pathways of either the energy source, 002=C2, 001=C1 and the energy-utilizing load portions, L2=C2 and L1=C1 found for each complementary electrical operation relative to the other as part of the overall multi-circuit system arrangement 0000. Each internally located circuit portion designated 855BA and 855BB for C1 and 845BA, 845BB, 865BA and 865BB for C2, respectively is coupled the first and the second energy pathway portions via extension portions if needed, 79BB and 79AA, respectively to outer electrodes C2-890BB, C2-890BA, C1-890AA, and C1-890BB (that are external of a typical energy conditioner, among others).

Conductively coupled with portions of an energy conditioner as shown, among others, is made at predetermined locations C2-890BB, C2-890BA, C1-890AA, and C1-890BB for example can be done by a predetermined conductive coupling process or manner with the materials or predetermined physical coupling techniques and predetermined materials used in the electrical coupling art, such as soldering, melding, mechanical, chemical or material, or material connection and/or coupling means, methods of which includes all of the standard industry means of conductive coupling or conductive connection used today or in the future solder (not shown) or resistive fitting, (all, not shown), etc. These internal circuit portions can be considered the electrode pathways, or the complementary energy pathways as described above. Generally internal circuit portions, as described will not comprise the shield electrodes designated 835, 825, 815, 800/800-IMC, 810, 820, 830, and 840, of which these shielding energy pathways are spaced-apart, and insulated or isolated from a directive electrical coupling by at least a portion a comprising the material having predetermined properties 801 or anything else that can provide a space-apart function, insulation or isolation, as needed.

A first and a second circuit systems (C2/C1 of FIG. 2C for example) having the at least two paired, circuit portions respectively, will each (C2/C1—the circuit systems) further comprise at least an energy source, 002=C2, 001=C1 and a energy-utilizing load portions, L2=C2 and L1=C1, respectively, for both the at least first energy pathway and at least second energy pathway per circuit, respectively. Each circuit system will generally begin with the first energy pathway leading from a first side of the energy source, which can be considered a supply-side of the energy source, and then a first energy pathway is subsequently coupled to a first side of the energy utilizing load, which is considered the energy input side of the energy utilizing load.

It is further recognized that the point of the energy source and the coupling made to the energy utilizing load is for the first energy pathway what is the consideration determinate to calling out that this position conductively isolates the first energy pathway electrically from the positioning arrangement of the second first energy pathway which is also physically coupled between the energy utilizing load, and the energy source as the return energy pathway to the energy source. Therefore, at least the second energy pathway which is found leaving a second side of the energy source and which is considered the return-out side of the energy utilizing load (after portions of energy have been converted by the energy-utilizing load for use or work) and is then coupled to a second side of the energy-utilizing load, which is considered the energy return-in side of the energy source.

A one notable difference of each of the at least three types of multi-circuit energy conditioner arrangements called out are; a stacked multi-circuit energy conditioner arrangement comprises an arrangement that results in the circuit portions being placed or arranged over the other yet in a relationship that is not necessarily opposite or complementary to the other circuit system portion of the electrical operations that occur. Rather the at least two circuit system portion pairs are oriented relative to the other in an arrangement that allows a "null" interaction between the two separate and/or isolated; circuit systems to take place within the same energy conditioner and AOC 813 while both sets of electrical system portion pairs are commonly sharing voltage reference facilitated by the 'grounded' the shielding structure that is comprised of the electrodes of the plurality of shield electrodes that have been coupled conductively to each other and conductively coupled to an otherwise outer conductive portion, not necessarily of any one respective circuit system or pairing.

It is contemplated that in some cases, conductive coupling to one portion of the complementary energy pathways by one circuit system pair and not the other(s) might be desirable for some users such that this type of arrangement or biasing of one arrangement verses the other(s) or favoring one circuit system over another(s) with the conductive coupling of the isolated, shield electrode structure is fully contemplated by the applicant.

However, when conductive isolation of the shielding structure is maintained, a path of least impedance created with coupling to a non-complementary energy pathway of the circuit systems involved will dynamically create a low impedance energy pathway common to energies of the at least two isolated circuit systems as they are operable and arranged for operations relative to the other, such as for straight stacking like embodiment 6005, one above the other relative to at least a respective positioning that reveals such a stacked or adjacent arrangement between the plurality of shield electrodes.

Referring now to FIGS. 2A–2B, an embodiment of an energy conditioner 6005. Energy conditioner 6005, among others is shown in FIG. 2A as an exploded view showing the individual electrode layering formed or disposed on layers of material 801, as discussed above. A predetermined embodiment structure of FIG. 2A among others is a predetermined shielding, electrode arrangement comprising a shielding arrangement of an odd integer number of equal-sized and equal shaped, electrodes designated 835, 825, 815, 800/800-IMC, 810, 820, 830, and 840, that conductively coupled together provide shielding to the smaller sized circuit pathway pair portions already named. This shielding arrangement of an odd integer number of equal-sized and equal shaped, electrodes can also include as well, almost any optional shield electrodes (not shown) for image plane shield electrodes designated –IMI'X'and/or –IMO'X' disclosed below.

Energy conditioner 6005 can also be seen to comprise at least a first plurality of electrodes of generally the same or equal-sized and the same or equal-shaped designated 835, 825, 815, 800/800-IMC, 810, 820, 830, and 840 and a second plurality of electrodes of generally same or equal-sized and the same or equal-shaped designated 845BA, 845BB, 865BA and 865BB for C2 and 855BA and 855BB for C1 that are combined in configurations various single or sub-plurality of electrode configurations (such as 845BA, 845BB, 865BA and 865BB electrodes) of the original two pluralities of first and second pluralities of electrodes for a host of the many combinations possible that provide a typical energy conditioner, among others with any possible numbers of grouped, paired homogeneously electrodes that are also seen as gathered into sets of electrodes to comprise the second plurality of electrodes with the first plurality of electrodes.

As shown in FIG. 2B, energy conditioner 6005 is operable with eight possible couplings to each respective outer electrode portions, 798-1, 798-2, 798-3 and 798-4 and 890M, 890AB, 890BA and 890BB as shown. Of these, possible coupling portions energy conditioner 6005 is capable of being coupled to five conductively isolated pathways designated 001A, 001B and 002A, 002B and conductive area 007 as shown in FIG. 2C. Therefore, 798-1, 798-2, 798-3 and 7984 can be coupled conductive area 007, respectively, and 001A, 001B to 890AA, 890AB, respectively and 002A, 002B to 890BA, 890BB respectively, (or for example, or the converse of 001A, 001B to 890BA, 890BB, respectively and 002A, 002B to 890M, 890AB, respectively) as each pair complementary pathways form two 1-degree to 180-degree circuit paired orientations (this meaning to what ever degree or range orientation that is physically possible to be of manufacturability to then be dynamically operable, of course) of at least two independent and electrically isolated circuit systems (C2/C1) to mutually and dynamically utilize energy conditioner 6005 independent of the other in an null fashion with respectively as later depicted in FIG. 2C.

It should be noted that in other examples 798-1, 798-2, 798-3 and 798-4 can be coupled conductive area 007, respectively, and 001A, 001B to 890AA, 890AB, respectively and 890BA, 890BB respectively for a single circuit attachment/coupling scheme to only C1 for example, among others.

There are also many ways to describe the same typical embodiment. Thus, many approaches or labels still arrive with the same final embodiment. For example, embodiment 6005, among others, can be described in a first combination of the number of plurality configurations or combinations possible for a typical energy conditioner is one that includes the first plurality of electrodes, along with the second plurality of electrodes which is divided into at least two or four directional, more paired orientations that could include as is the case for a configuration 6005, at least one electrode of 855BA, 855BB, 865BA and 865BB with its respective extension 79"XZ" or 79"XX" facing at least one of four possible 90 degree orientations just like hands of a clock, as in a 9-O'clock., 12'-O'clock, 3'-O'clock, and 6-O'clock.

It should also be noted that as shown, a location relationship of the conductive elements with respect of a 360-degree positional axis is now disclosed (but not shown, herein). The as shown location of the conductive elements (and not) such as the outer common electrode portions 798-1, 798-2, 798-3, 798-4 that are internally conductively coupled (not shown) with their respective 79G-1, 79G-2, 79G-2 and 79G-4 extension portion (when needed) can have location of respective 79G-1, 79G-2, 79G-2 and 79G-4 extension rotated (45 degrees clockwise, for example) to the from positions shown in FIG. 2A and FIG. 2B to the parallel sides rather than the corners as is depicted.

Conversely, outer electrode portions 890AA, 890AB, 890BA, and 890BB are arranged separate and/or isolated around the conditioner body. These outer electrode portions 890AA, 890AB, 890BA and 890BB, for example, can also have the location of their respective electrode extension rotated (45 degrees clockwise, for example) from positions shown in FIG. 2A and FIG. 2B to the respective corner locations, rather than the parallel sides as is depicted. As such, outer electrode portions 890AA, 890AB, 890BA, and 890BB are equally rotated to match up, as well. Thus, locations of almost any of the various respective electrode extension portions and almost any respective outer electrode portions that are coupled, (common or not), are always practicable to be symmetrically distributed to almost any position or location desirable. As the disclosure reveals, the embodiment can take the form of almost any shape element, including but not limited to polygon, polygonal, circular, spherical, or almost any other 3-dimensional shape that is practicable for manufacturing the embodiment arrangements that are operable for shielded, complementary energy pathways in feedthru, in bypass or mixed bypass-feedthru combinations of both electrode types and propagation modes, as well. Also included are single circuit or multiple circuit configurations of almost any of the just mentioned (or not) are included, now or currently, or in the future.

Then, for example, embodiment 6005, among others, can be described in a second combination of the number of plurality configurations or combinations possible for a typical energy conditioner is one that includes the first plurality of electrodes, along with the second plurality of electrodes which is divided as groupings of complementary pairings with an energized orientation of propagating energies oriented to at least one pairing of clock positions that are 180 degrees from the other, considered in a 'locked' pairing or positioned in an orientation range that is at least considered from not aligned to 90 degrees perpendicular in mutual orientation. In this example, pairings are positioned in an orientation considered parallel to one another, but mutually unaligned, in relative (to the other's) transverse (from a superposed alignment of the same axis, for example to a now transverse orientation relative to that same axis of rotation) or similar-axis, or rotated positions, up to exactly perpendicular in orientation or "null" or 90 degrees away from the other (in the same axis orientation) orientations relative to one another and not 180 degree oriented set of electrodes. If one considers in FIG. 2A, the pairings as just like hands of a clock, as in a 9-O'clock and 3'-O'clock arranged "null" (in this case 90 degrees) to the 12'-O'clock and 6-O'clock set.

Then, for example, embodiment 6005, among others, can be described in a third combination of the number of plurality configurations or combinations possible for a typical energy conditioner is one that includes the first plurality of electrodes, along with the second plurality of electrodes which is divided into at least two sets of electrodes. A first set of electrodes further comprises paired complementary electrodes groupings including complementary electrodes 845BA, 845BB and complementary electrodes 865BA, 865BB. A second of at least two sets of electrodes comprises paired complementary electrodes 845BA and 845BB. As later seen in FIGS. 2A and 2C, the first set of electrodes of the second plurality of electrodes comprises portions of the first circuit of a possible plurality of circuits with complementary portions utilizing a typical energy conditioner, among others, while the second set of electrodes of the second plurality of electrodes comprises portions of the second circuit of a possible plurality of circuits with complementary portions utilizing a typical energy conditioner, among others.

A first plurality of electrodes and a second plurality of electrodes that comprise a typical energy conditioner 6005, among others can also be classified a plurality of shield electrodes and a plurality of shielded electrodes. First plurality of shield electrodes designated 835, 825, 815, 800/ 800-IMC, 810, 820, 830, and 840 are also given a GNDG designation providing the shielding, structure (not numbered) when these are conductively coupled to one another an identifier in terms of 79G-'X' electrode extension orientations relative to the 6005 energy conditioner and the second plurality of electrodes designated 845BA, 845BB, 855BA, 855BB, 865BA and 865BB and the location and orientation of their respective 79"XZ" or 79"XX" electrode extensions, discussed above.

Plurality of GNDG electrodes are operable as a plurality of shield electrodes that are conductively coupled to each other to function as a single means for shielding at least the second plurality of electrodes. This odd integer number of shield electrodes will also provide a pathway of least impedance for multiple circuit systems (C2 and C1, in this case) as a group and when the plurality of GNDG electrodes are commonly coupled conductively to one another as a group or structure and then conductively coupled to an externally located common conductive portion or pathway 007.

Another combination of the number of combinations of the first primary and the second primary plurality of electrodes in a configuration 6005 has the second primary plurality of electrodes divided evenly into what is now will be described below as a second plurality of electrodes and a third plurality of electrodes which join the now simply, first plurality of electrodes as an energy conditioner comprising at least a first, a second and a third plurality of electrodes that are interspersed within the first plurality of electrodes designated 835, 825, 815, 800/800-IMC, 810, 820, 830, and 840 functioning as shielding electrodes with each electrode of the first plurality of electrodes designated generally, as GNDG. This is done to show the ability of any electrode of the first plurality of electrodes to be shifted in function so to act as the 8"XX"/800-IMC central electrode of the first plurality of electrodes and/or a typical energy conditioner, among others as shown general electrode 810 GNDG becoming center shield electrode 810/800-IMC of an energy conditioner Gust a two pairing of 845BA, 845BB and 855BA, 855BB of embodiment 6005 arranged as pairings that are oriented null to one another, in this case null at 90 degrees) in a multi-circuit arrangement with common reference node, CRN of FIG. 2C. Therefore, the 8"XX"/800-IMC central electrode of the first plurality of electrodes and a typical energy conditioner can usually be identified as such from at least a series of cross-sections taken to cut a typical energy conditioner into even halves.

Continuing with FIG. 2A and FIG. 2B, in the sequence of electrodes, each electrode of the second and third pluralities of electrodes is arranged, shielded and sandwiched by and between at least two electrodes GNDG of the first plurality of electrodes. In addition, each paired electrode of the second and third plurality of electrodes is arranged such that the pair of corresponding electrodes sandwich at least one electrode GNDG of the first plurality of electrodes. It should be noted that Accordingly, a minimum sequence of electrodes of an energy conditioner as shown, among others, is 6005, which could characterized by (in this instance, for example) having a first electrode 845BA of the second plurality of paired electrodes arranged spaced-apart, above a first electrode GNDG and below a second electrode GNDG. A second electrode 845BB of the second plurality of paired electrodes is arranged spaced-apart, above the second electrode GNDG and below a third electrode GNDG. A first electrode 855BA of the third plurality of paired electrodes is arranged spaced-apart, above the third electrode GNDG and below a fourth electrode GNDG. A second electrode 855BB of the third plurality of paired electrodes is arranged spaced-apart, above the fourth electrode GNDG and below a fifth electrode GNDG. In this minimum sequence, each electrode of the second and third pluralities of electrodes is conductively isolated from each other and from the first plurality of electrodes GNDG.

As seen similar to that of FIG. 1, in FIG. 2A, the electrode 855BA has its main-body electrode portion 80 sandwiched by main-body electrode portion 81s of electrodes 800/800-IMC and 810, respectively and simultaneously. Therefore, since the shield main-body electrode portion 81s are of generally the same size and same shape, (which is also meaning having together a common physical homogeny, substantially per utilizing standard manufacturing practice and processes allow, or at least uniform in size and shape relative to one another), at the same time electrode 855BA is having each large portion side, 1FS and 2FS (not all shown, however, it is noted, that 1FS and 2FS are at least two, opposite facing sides of any typical energy pathway that include and can be depicted as having a first facing side 1FS, second facing side 2FS for all energy pathways disclosed or not) of its main-body electrode portion 80 receiving the same portion of shielding function relative to the other, the electrode edge 803 of its main-body electrode portion 80, is kept within a boundary 'DMZ' or portion 806 established by the sandwiching perimeter of the two superposed and aligned shield main-body electrode portion 81s with their electrode edge 805s of the now commonly coupled shielding, electrodes 800/800-IMC and 810, both of the first plurality of electrodes.

Referring now to FIG. 2B, the energy conditioner 6005, among others is shown in an assembled state. Outer electrode portions 798-1, 798-2, 798-3, and 798-4 and 890AA, 890AB, 890BA and 890BB are arranged separate and/or isolated around the conditioner body. Shielding, electrodes GNDG comprise a plurality of coupling electrode portion(s) or extension portions 79G-1 (shown in FIG. 2A) which are conductively coupled to a plurality of outer electrodes 798-1 thru 798-4 in a discreet version of 6005. A non-discrete version might not have these outer electrodes, but directly couple into a circuit contiguously.

In a minimum sequence of electrodes similar to that discussed above, the first electrode 845BA of the second plurality of paired electrodes comprises a electrode extension portion 79BA (shown in FIG. 2A) which is conductively coupled to outer electrodes 890BA and the second electrode 845BB of the third plurality of paired electrodes comprises a electrode extension portion 79BB (shown in FIG. 2A) which is conductively coupled to outer electrode 890BB. First electrode 855BA of the second plurality of paired electrodes comprises an electrode extension portion 79BA (shown in FIG. 2A) which is conductively coupled to outer electrodes 890BA and the second electrode 855BB of the third plurality of paired electrodes comprises an extension portion 79BB (shown in FIG. 2A) which is conductively coupled to outer electrode 890BB. It is noted that the extension portions and the outer electrodes of corresponding paired electrodes are arranged 180 degrees from each other, allowing energy cancellation.

In order to increase the capacitance available to one or both of the coupled circuits, additional pairs of electrodes are added to the energy conditioner 6005, among others. Referring again to FIG. 2A, an additional pair of electrodes 865BA, 865BB, are added to the stacking sequence which correspond in orientation with the first pair of electrodes of the second plurality of electrodes. First additional electrode 865BA of the second plurality of paired electrodes is arranged above the fifth electrode GNDG and below a sixth electrode GNDG. A second additional electrode 865BB of the third plurality of paired electrodes is arranged above the fourth electrode GNDG and below a fifth electrode GNDG. First additional electrode 865BA is conductively coupled to the first electrode 845BA of the second plurality of electrodes through common conductive coupling to outer electrode 890BA. Second additional electrode 865BB is conductively coupled to the second electrode 845BA of the third plurality of electrodes through common conductive coupling to outer electrode 890BB. It is noted that the additional pair of electrodes could be arranged adjacent the first pair of electrodes 845BA, 845BB instead of on adjacent the second pair of electrodes 855BA, 855BB. Although not shown, the capacitance available to one or both coupled circuits could be further increased by adding more additional paired electrodes and electrodes GNDG.

FIG. 2C is a multi-circuit schematic that is not meant to limit a typical energy conditioner in a multi-circuit arrangement to the configurations shown, but is intended to show the versatility utility of a typical energy conditioner in multi circuit operations. An energy conditioner (just a two pairing of 845BA, 845BB and 855BA, 855BB of embodiment 6005 arranged as pairings that are oriented null to one another, in this case null at 90 degrees) in a multi-circuit arrangement with common reference node, CRN, could comprise a first means for opposing shielded energies of one circuit C2, which can comprise (a complementary portion of C2's overall circuit system and further comprising a paired arrangement of correspondingly, reverse mirror images of the complementary electrode grouping of electrodes 845BA, 845BB as seen in FIG. 2A) and a second means for opposing shielded energies of another circuit C1, which can comprise (a complementary portion of C1's overall circuit system and further comprising a paired arrangement of correspondingly, reverse mirror images of the complementary electrode grouping of electrodes 855BA, 855BB as seen in FIG. 2A) having elements individually shielded as members of a paired arrangement of correspondingly, reverse mirror images of the complementary electrode grouping of electrodes of both C2's and C1's respective circuit portions as just disclosed by at least the means for shielding (which is at least plurality of shield electrodes of generally the same shape and the same size that are conductively coupled to one another, including at least 830, 820, 810, 800 and 815 with electrode 810 becoming 810/800-IMC of FIG. 2A, for example) and also where the means for shielding (the plurality of shield electrodes as just described) also shields the first means for opposing shielded energies (as just described) and the second means for opposing shielded energies (as just described) from each other. This is to say that C2's and C1's respective circuit portions, respectively (as just described) are shielded from the other as at least two respective circuit portions by means for shielding as circuit portions (as just described).

FIG. 2C's multi-circuit schematic will also specifically include the whole body of multi-circuit arrangement 0000 rather than just a small portion as just described would have a full 3 pairing embodiment 6005 as shown in FIG. 2A coupled in a having two isolated circuit systems C2 and C1, respectively, each having at least a energy source 001=S1, 002=S2 and energy-utilizing loads, L2, L1, each C2 and C1 of which is contributing some complementary portion of itself within the energy conditioner 6005, among others, and sandwiched within and conductively isolated to one another between members of the plurality of shield electrodes. Each respective internally located circuit portion pairing of 845BA, 845BB, 855BA, 855BB and 865BA, 865BB is coupled at a corresponding first electrode or a second electrode coupling portion 890BA and 890BB, respectively.

The isolated circuit system C1 is respectively coupled from energy source 001 to energy-utilizing load L-1 by the S-L-C1 (energy source to energy-utilizing load—circuit 1) outer pathway portion and the L-S-C1 (load to source—circuit 1) outer pathway portion of the respective complementary energy pathways existing from the energy source 001 to the energy-utilizing load L1 and arranged or positioned and conductively coupled (not fully shown) relative to the other on each respective side of the L1 and S1 for complementary electrical operations relative to the other and on the other side at energy source to the energy-utilizing load side of C1).

The isolated circuit system C2 is respectively coupled from energy source 002 to energy-utilizing load L-2 by the S-L-C2 (energy source to energy-utilizing load—circuit 2) outer pathway portion and the L-S-C2 (energy-utilizing load to energy source—circuit 2) outer pathway portion of the respective complementary energy pathways existing from the energy source 002 to the energy-utilizing load L2 and arranged or positioned and conductively coupled (not fully shown) relative to the other on each respective side of the L2 and S2 for complementary electrical operations relative to the other and on the other side at energy source to the energy-utilizing load side of C2).

The C1/C2 isolated circuit systems are respectively coupled on a first side of the circuit (each respective circuit side) to an outer electrode portion(s) 890AA, 890BA on the S-L-C'X' as shown in FIG. 2C and respectively coupled on a second side of the circuit (each respective circuit side) to an outer electrode portion(s) 890AB, 890BB on the L-S-C'X' as shown in FIG. 2C, which are made by and at a simple conductive coupled portion of each circuit side utilizing a physical coupling method and/or material known in the art per respective circuit portion, such as a solder material coupling for example (not shown). This physical coupling, designated the same for location and method are normally paired to complementary sides of each respective circuit.

Therefore, C1-890M and C1-890AB and the C2-890BA and C2-890BB are shown as the respective identifiers designating that a respective, conductively coupled connection is made. For example, when C1-890AA is made for the 890AA outer electrode portion coupling with an outer energy pathway S-L-C1. This side of the circuit is the pathway by going from the first side of S1 energy source to a first side of the L1 energy-utilizing load as an 'energy-in' pathway. When C1-890AB is made for the 890AB outer electrode portion coupling with an outer energy pathway L-S-C1. This side of the circuit is the pathway by going back from second side of L1 Energy-utilizing load going to a second side of the 001 Energy source as an energy-return pathway.

In the drawing, FIG. 2C for the Circuit 2 or the C2, or C'X' systems, the appropriate designations have similar elements but are changed for the respective identifiers on the drawing and substituted from C1 to C'X' or C2 for FIG. 2C. When C2-890BA is made for the 890BA outer electrode portion coupling with an outer energy pathway S-L-C2. This side of the circuit is the pathway by going from the first side of S2 energy source to a first side of the L2 energy-utilizing load as an energy-in pathway. When C2-890BB is made for the 890BB outer electrode portion coupling with an outer energy pathway L-S-C2. This side of the circuit is the pathway by going back from second side of L2 Energy-utilizing load going to a second side of the 002 Source as an energy-return pathway.

It should be noted that for almost any typical embodiment arrangement, each circuit system portion of a plurality of circuit system portions, comprises, (conductively isolated or not), at least two, line to reference (or ground) conditioning relationships (either any same two, line to reference (or ground) relationships, consisting of a plurality of each: a capacitive, an inductive or a resistive, line to reference (or ground) relationships). These at least two, line to reference (or ground) conditioning relationships are operable between each of the at least two complementary electrodes and the same shielding, electrode, respectively, where the at least two complementary electrodes sandwich the same, shielding, electrode between themselves, respectively, (usually sandwiching a larger-sized electrode that is not of any complementary electrode pairings.). Thus, at least a first reference (or ground) relationship operable between a first complementary electrode of the at least two complementary electrodes and a first shielding electrode, and at least a second reference (or ground) relationship that is operable between a second complementary electrode of the at least two complementary electrodes and the first shielding electrode.

In addition, it should be noted that for almost any same typical embodiment arrangement having the at least two, line to reference (or ground) conditioning relationships as just described, the same circuit system portion of a plurality of circuit system portions, comprises, (conductively isolated or not), at least one line to line conditioning relationship comprising at least a capacitive, an inductive or a resistive, line to line relationship that is operable between at least the same at least two complementary electrodes.

It is also noted that the respective and relative, energy conditioning relationship value (e.g. measured capacitance available for the respective circuit portion of the plurality of circuit portions, for example) of the at least one line-to-line energy conditioning relationship value is generally in a range of at least almost any percentage of the given value that is from 1% to 99% less for a same-type energy conditioning relationship value (e.g. capacitance for example) then that of almost any one line-to-reference energy conditioning relationship value of the two, line-to-reference energy conditioning relationship values that could be measured for a respective and relative individual relationship.

Therefore, if a new typical embodiment like 6005 or not, among others comprises at least two circuit system portions (at least two sets of shielded pairs of complementary electrodes, for example), a typical embodiment like 6005 or not, among others will comprise at least four, line to reference (or ground) conditioning relationships and at least), at least two, line to line conditioning relationships. This would also allow at least two of the at least four, line to reference (or ground) conditioning relationships and at least one of the two, line to line conditioning relationships to be isolated and attributed to at least a first circuit system, while the remaining two of the at least four, line to reference (or ground) conditioning relationships and at least one remaining of the two, line to line conditioning relationships could be attributed to a second circuit system, respectively.

Finally, shown are outer common electrode portions 798-1, 798-2, 798-3, 798-4 internally conductively coupled (not shown) with their respective 79G-1, 79G-2, 79G-2 and 79G-4 extension portion (when needed) are also shown in FIG. 2B and are conductively coupled common to conductive portion 007, schematically shown in FIG. 2C to which are now aiding in providing both a voltage reference node or common reference node (CNR) to energies utilizing 845BA, 845BB, 855BA, 855BB and 865BA, 865BB pathways, equally via of all 798-1, 798-2, 798-3, 7984, respectively via extension portions 79G-1, 79G-2, 79G-2 and 79G-4 via the first plurality of electrodes, comprising as designated 835, 825, 815, 800/800-IMC, 810, 820, 830, and 840 functioning as shielding electrodes of embodiment 6005.

This 6005 embodiment shielding configuration portion will be facilitated by the conductive coupling in common or 'grounding' of the electrode shielding structure created (comprised of the electrodes of the first plurality of electrodes that have been coupled conductively to each other to be utilized almost any one respective circuit system, C'X'.) with the larger conductive portion 007, as described earlier.

One should also note that in the course of being operable for the at least single of multiple operations of the minimum first two groupings of three pairs of complementary electrodes spread to comprise two separate and/or isolated circuit systems of FIG. 2C as described utilizing a multi-circuit arrangement 6005, and conductively common coupling of all 798-1, 798-2, 798-3, 798-4 with common reference node, CRN comprising at least a first means for opposing shielded energies of one circuit and at least a second means for opposing shielded energies of another circuit and having a means for shielding the first and the second means for opposing shielded energies both individually and from each other, respectively at least two (2) sets of capacitive networks are created individually and respectively by C2 and C1, each. Therefore, each capacitive network further comprises at least one line to line capacitor and two, line to reference line or 'GnD' capacitors each, per circuit system that are also integrated as a unit X2Y-1 and unit X2Y-2, respectively, as depicted in FIG. 2A within the same, type of energy conditioner for example, all generally as a result of what is mutually shared. (reference line being common conductive portion 007, GnD or reference potential 007 that is mutually shared by both C2 and C1, a result of energization of the (2) isolated circuit arrangements and their respective amalgamated portions, as described.)

Although FIG. 2A depicts a electrically null arrangement position operable to being at least 90 degrees out of phase in electrical operation, between C2 and C1, as an electrically null arrangement position is considered active during at least one energized state relative of one system to either a non-energized or energized state of another between C2 and C1, for example.

In this particular configuration, although FIG. 2A is at a 90 degree physical angle that C2 and C1 that is equal to relative to the other, physically this 90 degree angle is not a limit, and almost any other directional position that allows even a partial electrically null arrangement to be considered operable for the respective h-field flux emissions that would otherwise have a detrimental effect to one another and this is fully contemplated by the applicant.

For example by placing a stacked or an arranged plurality of circuits not necessarily 90 degrees physically oriented away from the other and placing them in a vertical separation of distance that effectively accomplishes the same or even a partial nulling effect function is satisfactory. Adding additional 801 material layerings with or without additional –IMI-'X' shielding electrodes for example, is one say this could be done (not shown)

Therefore, a null position relative to the at least two isolated circuit portion pairs could be anywhere from 1 degree to 90 degrees electrically relative on at least two or even three axis's of positioning from a relative center point respective to the 8"XX"/–IMC center shielding electrode to develop a first position and a second position to determine a electrically null relationship and its degree of relative effect or interference between at least two directional field flux positions of each of the respective isolated circuit portion pairs found within a new, typical energy conditioner.

Accordingly, relative on at least two or even three axis's of positioning from a relative center point respective to the 8"XX"/–IMC center shielding electrode, when energized a typical energy conditioner, among others will allow partial or full "null effect" to occur upon energy fields (if any) interacting with one another along respective a pair of isolated circuit system portions, in accordance almost any complementary bypass and/or feedthru electrode pathway(s) can operate within a specific embodiment, among others, in a "paired electrically opposing" as complementary bypass and/or feedthru electrode pairings in a manner in which is anywhere in a physically orientation from anywhere between at least 1 to 180 degrees apart from one another, relative to positioning of the interposing shielding electrodes of a typical energy conditioner, among others.

This first plurality of electrodes are also coupled conductively to one another and as five members of the first plurality of electrodes have been commonly coupled to become or to function as a single, and generally uniform shielding structure that provides each sandwich, respective shielded electrode generally the same amount of shielding portion to each respective large side of at least two opposing portions of the shielded, electrode or energy pathway receiving physical shielding.

Therefore, the circuit system (C1) energy pathways 845BA, 865BA, respectively, now complementarily paired to 845BB, 865BB, while circuit system (C2) operates with complementary electrodes 855AB and 855BB are dynamically null to one another as a plurality of two isolated circuits, simultaneously.

By utilizing seven shielding members 830,820,810,800, 815,825 and 835 of the first plurality of electrodes that have been coupled conductively to one another to function as a single cage-like shielding structure or grouped shield, the first plurality of electrodes provides both physical and dynamic shielding (electrostatic shielding) of portions of energies utilizing complementary conductors 845BA, 865BA, 845BB, 865BB, 855AB and 855BB, respectively.

Overall, embodiment 6005 in-turn will be operable coupled to C2 and C1 systems in establishing or creating a static complementary physical relationship considered as a symmetrical corresponding opposite orientation arrangement relationship between the two complementary energy pathways. For example in these relationships as pairs in C2 are energy pathways 845BA, 865BA, respectively and complementarily and correspondingly paired to 845BB, 865BB, while C1 operates with complementary and correspondingly paired electrodes 855AB and 855BB. As two sets of paired circuit system portions comprising these paired electrodes, respectively, the sets of paired circuit system portions are the groupings that form the electrically null relationships to one another. In this instance all electrodes shown are of generally the same shape and size, overall both generally match up or correspond relative to the other so as to match 'face to face' with their opposing surface portions of each respectively with the other. This is not needed through out.

This is a balanced, corresponding physical and complementary relationship between the C2 energy pathways 845BA, 865BA respectively and complementarily paired to 845BB, 865BB, while C1 operates with balanced, corresponding physical and complementary relationship between complementary electrodes 855AB and 855BB.

All while operating electrically null to one another in as depicted in FIG. 2C, which allows portions of energy found on opposite sides of a given circuit system to be independent and dynamic relative to a circuit (C1 or C2, for example) yet as sets of paired circuit system C1 and C2 energies are propagating to the degree that at the same time, two oppositely phased, energy portions will be practicable or operable null to one another. Yet simultaneously, these same portions are utilizing one of the two pairs of respective C2 energy pathways pairs, while in C1 energies of this system are utilizing one pair of respective C2 energy pathways pairs to one another in a balanced and mutually complementary dynamic relationship with respect relative to the other at energization.

Generally, operations of a typical energized energy conditioner arrangement is in dynamic operation to establish and maintain a substantially balanced and ongoing, sustainable complementary electrical conditioning operation for these and almost any subsequent energies utilizing this AOC 813 within a portion of a single of multiple energized circuit system. In each circuit system (C1/C2, etc.) paired energies portions with respect to the other establish a mutual h-field propagations that cancel one another according to rules establish by the science beginning with Ampere's Law and including the life's work of Faraday, Maxwell, Tesla, Einstein, Planck and the others that state collectively that symmetrical opposing forces can effectively be cancelled upon the interaction or co-mingling of the two corresponding portions and can also be maintained as ongoing for almost any of the ensuing energy portions propagating within the dynamic.

Use of the embodiment will provide the plurality of circuits with a generally, structural balanced, composition of generally, equal capacitance layerings (note that 'generally, equal capacitance' is not always necessarily in a typical new embodiment) located between each of the opposing, paired energy pathways within the embodiment, in a generally balanced, electrical manner.

Transformers are also widely used to provide common mode (CM) isolation and depend on a differential mode transfer (DM) across their input to magnetically link the primary windings to the secondary windings in their attempt to transfer energy. As a result, CM voltage across the primary winding is rejected. One flaw that is inherent in the manufacturing of transformers is propagating energy source capacitance between the primary and secondary windings. As the frequency of the circuit increases, so does capacitive coupling; circuit isolation is now compromised. If enough parasitic capacitance exists, high frequency RF energy (fast transients, ESD, lighting, etc.) may pass through the transformer and cause an upset in the circuits on the other side of the isolation gap that received this transient event. Depending on the type and application of the transformer, a shield may be provided between the primary and secondary windings. This shield, coupled to a common energy pathway reference node, is designed to prevent against capacitive coupling between the multiple sets of windings.

With respect to a new typical embodiment arrangement, each single circuit portion of a complementary circuit portion pairing of a larger circuit system is utilized by propagating energies in which these energies give off energy fields. Because of their close proximity in physical arrangement in the differential pairing, propagating energies interact with one another mirroring in their own proportionality the complementary symmetrical circuit portion pairing of circuit system pathways. Therefore, these proportional propagating energies are force to act in a mutually opposing manner with one another and hence they undergo a mutual cancellation of field's effect due to this close proximity of mutual but opposite propagation operations, just as described. The complementary symmetrical paired electrodes of a paired grouping also provide an internally balanced opposing resistance load function for each respective single circuit portion of a complementary circuit portion pairing of a larger circuit system or separate circuitry found utilizing a typical, new energized embodiment. Thus, a typical embodiment also functions overall or mimics the functionality of at least one electrostatically shielded transformer per circuit system portion per embodiment. A typical, new embodiment improves upon and reduces the need for transformers in a typical transformer-required circuit portion. A typical, new embodiment can be utilized in some applications for its energy-conditioning ability as a substitute for the functionality of at least one electrostatically shielded transformer per paired circuit system portion. A new typical embodiment effectively uses not just a physical and relative, common electrode shield or shields to suppress parasitics, it also uses its relative positioning of common shield or shields, (the differential paired electrode or circuit portion pairing/layering) and a conductive coupling to a common conductive area in combination to effectively function like a transformer. If a circuit system portion is being upset by transients, this type of electrostatically shielded, transformer function of a typical, new embodiment can be effective for transient suppression and protection simultaneously while also working as a combined differential mode and common mode filter. Shielding electrode structure can normally be coupled conductively to at least one common energy pathway.

A straight stacked, multi-circuit operable energy conditioner comprises an electrode arrangement of at least two pluralities of electrodes. First plurality of electrode pathways of the two pluralities of electrode pathways comprises electrodes that are considered shield electrodes within the arrangement. First plurality of electrode pathways can be homogeneous in physical composition, appearance, shape, and size to one another. Within a vertical or straight stacked, arrangement, members of the first plurality of electrode pathways will be arranged or positioned superposed relative to one another such that perimeter edges 805 are even and aligned with one another. Each energy conditioner multi-circuit arrangement of the at least three multi-circuit energy-conditioning arrangements will each utilize a single common conductive portion as a circuit reference node, CRN during energized operations, and as a common coupled energy potential for grounding of the shielding, electrode structure of almost any multi-circuit energy-conditioning arrangement.

In some cases, for stacked multi-circuit energy-conditioning arrangements will comprise the isolated circuit arrangement portions spread horizontally or co-planar, relative to one another and not necessarily stacked over the other. Operational ability of a specific embodiment or a specific embodiment in circuit arrangements, among others, refers to conditioning of complementary propagations of various energy portions along pairings of basically the same-sized, and/or effectively and substantially the same size, complementary conductors and/or electrodes and/or electrode pathway counterparts, (with both electrode pathways) will for the most part, be physically separate and/or isolated first by at least some sort of spacing between electrodes whether the spacing be air, a material with predetermined properties and/or simply a medium and/or matter with predetermined properties. Then the conditioning of complementary energy portion propagations will for the most part, also be separate and/or isolated by an interposing and physically larger positioning of a commonly shared, plurality of energy conductors or electrode pathways that are conductively coupled to one another and are not of the complementary electrode pathway pairs, as just described above. One should note that this structure becomes a grounded, energy pathway structure, a common energy pathway structure, a common conductive structure or a shielding structure that functions as a grounded, Faraday cage for both the sets of energy portions utilizing complementary conductors and the complementary conductors of a specific embodiment or a specific embodiment in circuit arrangements, among others is normally capable of conditioning energy that uses DC, AC, and AC/DC hybrid-type propagation of energy along energy pathways found in energy system and/or test equipment. This includes utilization of a specific embodiment or a specific embodiment in circuit arrangements, among others to condition energy in systems that contain many different types of energy portion propagation formats, in systems that contain many kinds of circuitry propagation characteristics, within for example, the same energy system platform.

The applicant contemplates additional numbers of centrally positioned common energy pathway electrodes 8"X>C"/8"X>C"-IMCs totaling to an odd number integer that can be added to the existing central positioned common energy pathway electrode 8"XX"/8"XX"-IM-C common electrode pathway as shown to provide specific and distinct features that can enhance or shape the multi-circuit energy-conditioning of the numbers of separate and distinct energy circuits contained within. As disclosed in FIG. 3A, FIG. 4A and FIG. 4C, additionally placed, outer shielding electrodes designated as –IMO-'X'. Additionally placed, inner shielding electrodes designated as –IMI-'X' (with the exception of 8"XX"/8"XX"-IM-C) are optional. Additionally placed, outer and inner shielding electrodes are also normally conductively coupled to one another, the center shield electrode, designated 8"XX"/8"XX"-IM-C, and almost any other members of the plurality of shielding electrodes in a final static energy-conditioning arrangement. It should also be noted that most of these relationships as just described are for two-dimensional positioning relationships and are only taken from a two-dimensional viewpoint depicted in FIG. 4C. Material 801 spacing or the spacing equivalent (not fully shown) separation distances designated 806, 814, 814A, 814B, 814C and 814D (not fully shown) are normally device-relevant. By looking at the cross section provided in FIG. 4C and later in FIG. 10, an observer will note the other significant vertical distance and vertical separation relationships (not fully shown), that are of a predetermined electrode and energy pathway stacking arrangement (not fully shown) that is depicted. As shown in FIG. 4C, if only one additional shielding, electrode 800-1 is inserted adjacent to 800/800-IMC common electrode pathway, the balance of the shielding electrode structure polarizations will shift and an introduction of a polarity unbalance will occur with respect to each circuit located electrically opposite one another to the shielding, electrode pathways.

Figure 11:
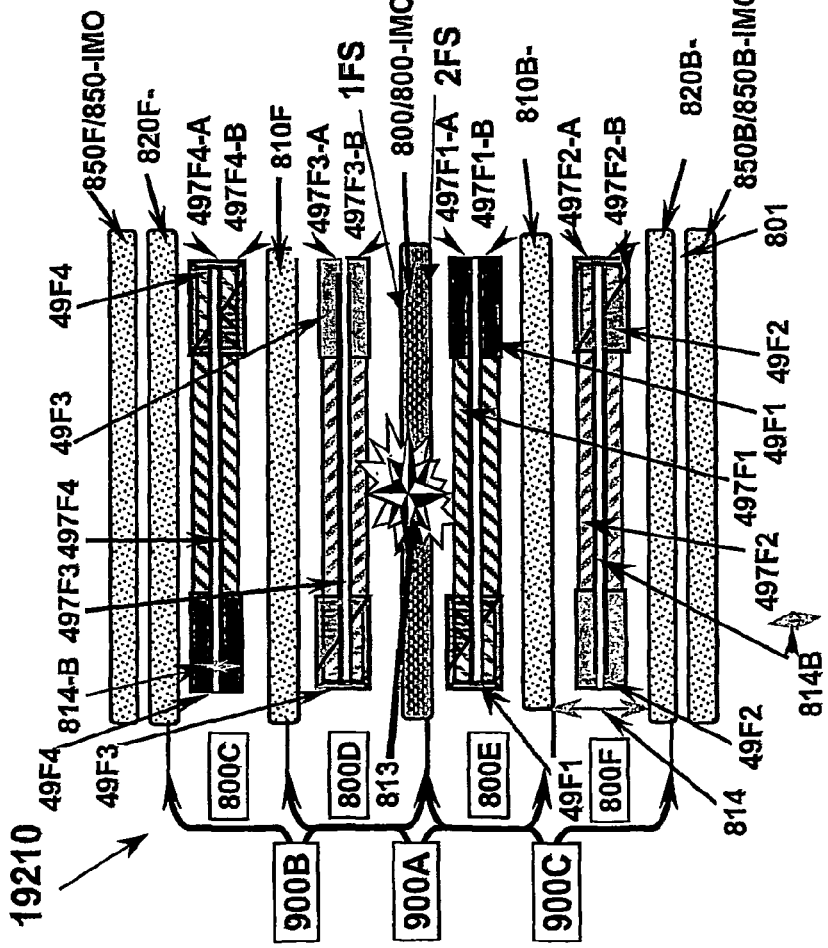
FIG. 11 shows an cross-section view of an arrangement embodiment 19210, which is but one of many possible configurations in accordance with typical configurations presented, among others.

Referring now to FIG. 4C and FIG. 11, for example, if two additional shielding electrodes 800-1 and 800-2 are positioned and arranged to sandwich shielding, electrode 800/800-IMC of FIG. 11, for example, such that this creates a tri-stacking of 800'X's, shielding, energy pathways and/or shielding, electrodes, the balance of the shielding, energy pathway structure polarizations for circuit operation functions will be maintained with respect to the additional shielding, energy pathways, internally, within a 19210 for example, and with respect to each separate, circuit portion pairing located electrically opposite one another to the shielding, electrodes. By utilizing various distance and separation relationships designated in the drawing as 806, 814, 814A, 814B, 814C and 814D (not all fully shown) as they are predetermined with respect to the shielding, electrode stacking arrangement as depicted will also utilize the various effects of close spacing versus the further spacing relationships as previously described.

With the exception of 8"XX"/800-IMC, when used, there are at least even integer number, or one pair of –IMI'X' to be sandwiching the common central shield electrode designated 800/800-IMC as seen in FIGS. 4A, 4B and 4C, and when used, and of which are together also, are conductively coupled to the plurality of shielding electrodes including the common central shield electrode designated 800/800-IMC in almost any final static energy-conditioning arrangement. With or without any additionally placed, inner arranged, shielding, electrodes designated (#-IMI-'X') in place, almost any integer number of shield electrodes that is or are arranged as the center or center grouping of shield electrodes within the total energy-conditioning arrangement will normally be an odd integer numbered amount of shielding electrodes that is at least 1, Conversely, the total number of electrodes of the first plurality of electrodes or the plurality of shielding electrodes as a total number found within the total energy-conditioning arrangement will normally be an odd integer numbered is at least three. Additionally placed, outer shielding electrodes designated as –IMO-'X' will usually increase the shielding effectiveness of an energy-conditioning arrangement as a whole. These electrodes help provide additional shielding effectiveness from both outside and inside originating EMI relative to the energy-conditioning arrangement and can also facilitate the shield electrodes not designated –IM'X'-'X' which are normally adjacent (with the exception of 8"XX"/800-IM) a shielded complementary electrode. In addition, with the exception of the center shield electrode 800/800-IMC, which is relatively designated as both the center electrode of almost any plurality of total arranged electrodes comprising an energy-conditioning arrangement, as well as the center electrode of the total number of electrodes comprising almost any plurality of first electrodes or shielding electrodes, the remaining electrodes of the first plurality of electrodes or as other wise known as the remaining electrodes of the plurality of shield electrodes will be found equally and evenly, divided to opposite sides of the center shield electrode 8"XX"/800-IMC. Thus, the now two symmetrical groups of remaining electrodes of the plurality of shield electrodes (meaning excluding the shared center shield electrode 800/800-IMC) will normally total to an even integer number, respectively, but when taken together and added with the center shield electrode 8"X)C"/800-IMC will normally total to an odd integer number of the total number of electrodes comprising the plurality of shield electrodes to work together when conductively coupled to one another as a single and shared image "0" voltage reference potential, physical shielding structure.

There will be a need for at least a minimum odd integer number of three electrodes functioning as shield electrodes needed in the case of arrangements utilizing a typical, co-planar or stacked/straight/co-planar hybrid embodiments shown in schemes like FIGS. 3A, 4A, and 7A, among others, for example.

For various embodiments like a typical, straight, arranged isolated circuit portion scheme like FIG. 2A and FIG. 8A, among others, there will be a need for at least a minimum odd integer number of five electrodes functioning as shield electrodes.

Both sets of minimum, odd integer numbers of electrodes will perform as an electrostatic shielding structure or means for shielding providing both a physical shielding function and at least an electrostatic or dynamic shielding function for propagating energy portions along the at least two sets of paired, conductive and energy pathway portions or electrode main-body portion 80s which are each sandwiched and shielded within the means for shielding.

Electrostatic or dynamic shielding function component of the sets of odd integer numbers of electrodes for almost any stacking scheme occurs when the energy-conditioning arrangement is energized and the odd integer numbered plurality of coupled together electrodes are conductively coupled to a common conductive portion or a potential not necessarily of almost any of the respective source to energy-utilizing load circuit systems including there respective circuit system energy-in or energy-out pathways. The physical shielding function component of the sets of odd integer numbers of electrodes for almost any stacking scheme occurs always for a typical energy-conditioning arrangement, energized or not.

Referring to FIG. 3A, another typical embodiment of a multi-circuit energy-conditioning component 8005 is shown in an exploded plan view. In this embodiment, multiple, co-planar electrodes are positioned on a layer of material 801. In a minimum configuration, component 8005 comprises a first paired conductive means for propagating energy portions of at least a first circuit, a second paired conductive means for propagating energy portions of at least a second circuit, a third paired conductive means for propagating energy portions of at least a third circuit, and a means for shielding. The means for shielding shields the first, the second, and the third paired conductive means for propagating energy portions, individually, and from each other.

First paired conductive means for propagating energy portions of at least a first circuit is provided by a first paired complementary set of electrodes 845FA, 845FB. Second paired conductive means for propagating energy portions of at least a second circuit is provided by a second paired complementary set of electrodes 845BA, 845BB. The third paired conductive means for propagating energy portions of at least a third circuit is provided by a third paired complementary set of electrodes 845CFA, 845CFB.

The means for shielding the first, the second and the third paired conductive means for propagating energy portions, individually, and from each other is provided by a plurality of electrodes referred to generally as GNDD. Specifically of the plurality of electrodes One electrode of each pair of the paired complementary GNDD electrodes, 820, 810 and 800 comprise the means for shielding and are positioned at a predetermined locations, each disposed on a layer of material 801, respectively. One half of the paired electrodes of each respective pairing, 845FA, 845BA and 845CFA are disposed co-planar and separate from one another on a layer of material 801 designated 845PA. The corresponding second electrodes and corresponding paired electrode of each respective pairings, 845FB, 845BB, and 845CFB are each disposed co-planar and separate from one another on another layer of material 801 designated 845PB is positioned in for example, the same location on a second layer of material 801.

First plurality of co-planar complementary electrodes 845FA, 845BA, and 845CFA and the second plurality of co-planar complementary electrodes 845FB, 845BB, and 845CFB are interspersed within the plurality of electrodes GNDD. The plurality of GNDD electrodes are operable as shield electrodes, which are also then conductively coupled to one another by respective outer electrode portions, 798-1, 798-2, 798-3 and 7984 (not fully shown, but see FIG. 3B), to provide a shielding, structure or the means for shielding discussed above, such that the plurality of GNDD electrodes are operable to provide a common pathway of least impedance for circuit energy portions of either at least a first and/or at least a second circuit systems, if applicable.

Therefore, a minimum electrode arrangement for a three-circuit system arrangement could be comprising the plurality of electrodes GNDD (conductively coupled to one another) and the first plurality of co-planar complementary electrodes which are each spaced-apart from each other as well as conductively isolated from one another. Second plurality of co-planar complementary electrodes are each spaced-apart from each other as well as conductively isolated from one another, as well. This also allows the paired electrodes 845FA and 845FB, and 845BA and 845BB, and 845CFA and 845CFA, for example, as members of the first and the second plurality of co-planar complementary electrodes to be corresponding to one another from oppositely oriented positions that are each relative to the other and still retain a position in the arrangement that allows paired electrodes 845FA and 845FB, and 845BA and 845BB, and 845CFA and 845CFA to be shielded from one another as paired electrodes (not co-planar).

It is noted that 845FA and 845FB, and 845CFA and 845CFA electrodes are shown as feedthru electrodes while paired complementary electrodes 845BA, 845BB are shown as by-pass electrodes. The co-planar electrodes can be of almost any combination of bypass or feedthru and is not limited to the configuration shown.

In another variation, electrodes GNDI are positioned in a co-planar relationship between the co-planar electrodes, providing additional shielding and isolation and enhancing a common pathway of least impedance for each circuit system coupled and when the GND'X' electrodes are all coupled to a common conductive portion or pathway previously mentioned. Electrodes GNDD are conductively coupled to outer electrode portions 798-14 discussed below, and when utilizing optional GNDI electrodes, outer electrode portions 798-1-6 are used as such to allow-all plurality of electrodes providing shielding to conductively couple to each other. Conversely, the each paired electrodes 845FA and 845FB, and 845BA and 845BB, and 845CFA and 845CFA are each conductively isolated from each other and from the electrodes of the plurality of GND'X' electrodes.

While a minimum, three-circuit configuration has been discussed above, additional electrode pairs and co-planar electrode layerings can be added for conditioning coupling of additional circuit systems. Referring to FIG. 3A, note that paired electrodes 845CFA, 845CFB are a feedthru variant referred to as a crossover feedthru electrodes. Although not shown, additional co-planar electrode pairs can be added. Additional capacitance can also be added to the component 8005 by adding additional GND'X' electrodes as well as co-planar layers of corresponding paired electrodes 835FA and 835FB, 835BA and 835BB, 835CFA and 835CFB, respectively above and/or below the existing layers.

Referring to FIG. 3B, the multi-circuit, energy-conditioning arrangement 8005 is shown in an assembled state. Outer electrode portions are positioned around the conditioner body. The shielding, electrodes GNDD and GNDI comprise a plurality of extension portions 79G-1-6 (shown in FIG. 3A) which are conductively coupled to a plurality of outer electrode portions 798-1-6.

Electrode 845FA and 835FA which are superposed to one another while still members of other paired electrodes comprises two extension portions 79"XZ" or 79"XX", each (shown but not always numbered in FIG. 3A) on opposite ends which are conductively coupled to outer electrodes 891FA and 891FB, respectively. Electrodes 845FB and 835FB which are superposed to one another while still members of other paired electrodes comprises two extension portions 79F'X', each (shown but not always numbered in FIG. 3A) on opposite ends which are conductively coupled to outer electrodes 890FA, 890FB.

Electrode 845BA and 835BA which are superposed to one another while still members of other paired electrodes comprises one extension portion 79B'X', each (shown but not always numbered in FIG. 3A) on ends which are conductively coupled to outer electrode 890BB, respectively. Electrode 845BB and 835BB which are superposed to one another while still members of other paired electrodes comprises one extension portion 79B'X', each (shown but not always numbered in FIG. 3A) on ends which are conductively coupled to outer electrode 890BA, respectively.

Electrode 845CFA and 835CFA which are superposed to one another while still members of other paired electrodes comprises two extension portions 79CF'X', each (shown but not always numbered in FIG. 3A) on opposite ends which are conductively coupled to outer electrodes 891CFA and 891FB, respectively. Electrodes 845CFB and 835CFB which are superposed to one another while still members of other paired electrodes comprises two extension portions 79CF'X', each (shown but not always numbered in FIG. 3A) on opposite ends which are conductively coupled to outer electrodes 890CFA, 890CFB. It is noted that the extension portions and the outer electrodes of corresponding paired electrodes are positioned generally 180 degrees from each other, allowing optimal energy cancellation.

Previous embodiments disclosed a typical multi-layer energy conditioner or energy-conditioning arrangement providing multi-circuit coupling capability by adding electrodes arranged, in a stacking 6005 and by adding electrodes co-planar in a co-planar stacking 8005. A variation of these embodiments is a typical hybrid energy-conditioning arrangement 10005, which provides multi-circuit coupling capability for at least three circuits as shown in FIGS. 4A and 4B. (These multi-circuit embodiments, among others can also be coupled to less numbers of circuit systems in a predetermined manner.)

Referring now to FIG. 4A, a typical energy-conditioning arrangement 10005 is shown in an exploded plan view showing the individual electrode layering formed or disposed upon layers of material 801, as discussed above. Conditioner 10005 comprises a first complementary means for conditioning a first circuit, a second complementary means for conditioning a second circuit, a third complementary means for conditioning a third circuit and a means for shielding the first, the second, and the third complementary means for conditioning individually, and from each other.

First complementary means for conditioning a circuit is provided by a first plurality of paired complementary electrodes 845BA1, 845BB1. Second complementary means for conditioning a second circuit is provided by a second plurality of paired complementary electrodes 845BA2, 845BB2. The third complementary means for conditioning a third circuit is provided by a third plurality of paired complementary electrodes 855BA, 855BB. This means for shielding the first, the second, and the third complementary means for conditioning individually, and from each other is provided by a fourth plurality of electrodes referred to generally as GNDG, like that of FIG. 2A.

One electrode of each pair of the first and the second paired complementary electrodes are positioned at a predetermined location on a first layer of material 801. The corresponding second electrodes of each pair of the first and the second paired complementary electrodes are positioned in for example, the same respective, locations but they are oppositely oriented on a second layer of material 801 relative to the first electrodes of each pair of the first and the second paired complementary electrodes. First plurality of paired complementary electrodes 845BA1, 845BB1, the second plurality of paired complementary electrodes 845BA2, 845BB2, and the third plurality of paired complementary electrodes 855BA, 855BB are interspersed within the fourth plurality of electrodes GNDG. Fourth plurality of electrodes GNDG provide the shielding, structure discussed above such that the fourth plurality of electrodes GNDG are operable as shield electrodes, which are conductively coupled to each other and provide a pathway of least impedance as stated with the GNDD electrodes of FIG. 3A.

A first electrode 845BA1 of the first plurality of electrodes and a first electrode 845BA2 of the second plurality of electrodes, co-planar to each other, are arranged above a first electrode GNDG and below a second electrode GNDG. A second electrode 845BB1 of the first plurality of electrodes and a second electrode 845BB2 of the second plurality of electrodes, co-planar to each other are arranged above the second electrode GNDG and below a third electrode GNDG. A first electrode 855BA of the third plurality of electrodes is arranged above the third electrode GNDG and below a fourth electrode GNDG. A second electrode 855BB of the third plurality of electrodes is arranged positioned oppositely oriented to the first electrode 855BA, above the fourth electrode GNDG and below a fifth electrode GNDG. In this minimum sequence, each electrode of the first, the second, and the third pluralities of electrodes is conductively isolated from each other and from the fourth plurality of electrodes GNDG.

Referring now to FIG. 4B, the 'hybrid' energy-conditioning arrangement 10005 is shown in an assembled state as a discrete component. Outer electrode portions are positioned around the conditioner body. The shielding, electrodes GNDG comprise a plurality of extension portions 79G-1, 79G-2, 79G-2 and 79G-4 (shown in FIG. 4A), which are conductively coupled to a plurality of outer electrodes 798-1, 798-2, 798-3 and 798-4. First electrode 845BA1 of the first plurality of electrodes comprises an extension portion 79BBA1 (shown in FIG. 4A) which is conductively coupled to outer electrode 890BB and the second electrode 845BB1 of the first plurality of electrodes comprises an extension portion 79BBB1 (shown in FIG. 4A) which is conductively coupled to outer electrode 890BA. First electrode 845BA2 of the second plurality of electrodes comprises an extension portion 79BBA2 (shown in FIG. 4A) which is conductively coupled to outer electrode 891BB and the second electrode 845BB2 of the second plurality of electrodes comprises an extension portion 79BB2 (shown in FIG. 4A) which is conductively coupled to outer electrode 891BA. First electrode 855BA of the third plurality of electrodes comprises an extension portion 79BA (shown in FIG. 4A) which is conductively coupled to outer electrode 893BB and the second electrode 855BB of the third plurality of electrodes comprises an extension portion 79BB (shown in FIG. 4A) which is conductively coupled to outer electrode 893BA. It is noted that the coupling electrode portion or extension portions and the out r electrodes of corresponding paired electrodes are positioned 180 degrees from each other, allowing energy cancellation. Also noted, that while the corresponding paired electrodes are shown positioned 180 degrees from each other, each paired circuit portion of which each corresponding paired electrode set are comprised in varied orientation relationships. For example, the first and the second plurality of electrodes which make up a first and a second paired circuit portion, respectively, are also physically parallel to one another, side by side in an electrically null relationship when energized. This could also be called an electrically parallel null relationship. In another example, the third plurality of electrodes is also the third paired circuit portion, which is physically arranged 90-degrees oriented relative to the first and the second paired circuit portion, respectively. Thus, the first and the second paired circuit portion, respectively are also each in an electrically null relationship relative to the second paired circuit portion when energized.

While the paired electrodes shown are bypass arranged, this or almost any other embodiment, among others, is not limited as such and may include and almost any combination of bypass, feedthru, and/or cross over feedthru electrode pairs, just as easily, with minor adjustments of the positioning and number of the outer electrodes, if needed. It Is noted that the coupling electrode portion(s) or extension portions and the outer electrodes of corresponding paired electrodes are positioned 180 degrees from each other, allowing energy cancellation.

Although not shown, as with FIG. 2A, 3A and 4A or the others shown, or not, the capacitance available to one, two, or most all of the coupled circuit portions and there respective circuit systems (not shown) could be further increased by adding more additional paired electrodes and electrodes GNDG as previously shown in the earlier embodiments. It should be noted the increased distance of separation between 845BA, 865BA, 845BB, and 865BB increases the capacitance given C2 as opposed a lesser capacitance given to C1.

Referring now to FIGS. 5A–5D, 5C–5D, 7A–7B, and 8A–8B, and to the various embodiments shown. These embodiments are depicted as shaped embodiments or more specifically, for example herein, as annulus shaped embodiments. Although the energy pathways or the various electrodes are shaped, the dynamic energy-conditioning functions among others, operate for example, the same respectively and relatively, as earlier disclosed embodiments depending on configuration of course. They are similar to the earlier disclosed embodiments in that they all comprise in part various energy pathways or electrodes both individually, and as a relative groupings and form portions of circuit system pairings operable for propagating energies (not shown) that are utilizing an energy-conditioning component just as with the previous embodiments disclosed herein.

A shaped embodiment such as an annular-shaped embodiment, among others can allow the energy-conditioning arrangement to be used in different applications such as motors, for example, and/or anywhere a specific shape of the energy-conditioning arrangement can add versatility to the possible coupling accesses of this discrete and/or non-discrete version of the component.

Referring now to FIG. 5A and FIG. 5B, planar and annular-shaped electrode layering 855BA is shown in FIG. 5A having an annular-shaped main-body portion 80 of conductive material 799 deposed on annular-shaped material portion 801. Similarly, referring now to FIG. 5B, planar and shaped electrode layering 855BB is shown in FIG. 5B having a shaped main-body portion 80 of conductive material 799 deposed on shaped material portion 801.

In these portions of a typical shaped embodiment, among others, shown material 801 while having the annular-shaped form is also larger than the shaped main-body portion 80 of conductive material 799 for each electrode 855BA and 855BB. The outer perimeter circumference edge 817-O of material 801 is larger than the outer perimeter circumference edge 803-O of the electrode body portion 799 for each electrode 855BA and 855BB and forms an outer insulation portion 814-O extending which is simply an portion absent of electrode material 799 along at least one predetermined portion location adjacent and parallel the outer perimeter circumference edge 803-O of the electrode body portion 799. The inner perimeter circumference edge 817-I of the material 801 is smaller than the inner perimeter circumference edge 803-I of the energy pathway and/or electrode body portion 799 and forms an inner insulation portion 814-I extending adjacent and parallel relative to the aperture 000 shown and adjacent and parallel the inner perimeter circumference edge 803-I of the energy pathway and/or electrode body portion 799.

Shaped energy pathway and/or electrodes of these embodiments also comprise at least one energy pathway extension portion (and/or simply 'extension portion') that extends outward relative to the aperture 000 for electrode 855BB, and extends inward relative to the aperture 000 for electrode 855BA, and/or in other arrangements that can be extending both outward and inward, from the electrode main-body 80 portion, respectively.

As shown in FIG. 5A, four energy pathway and/or extension portions 79-I1, 79-I2, 79-I3, 79-I4 extend inward relative to the aperture 000 to past the inner perimeter circumference edge 803-I of the energy pathway material portion 799, through the inner insulation portion 814-I to the inner perimeter circumference edge 817-I of the shaped material 801. Conversely, as shown in FIG. 5B, extension portions 79-O1, 79-O2, 79-O3, 79-O4 extend outward away relative to the aperture 000 to past the outer perimeter circumference edge 803-O of the electrode body portion 799, through the outer insulation portion 814-O to the outer perimeter circumference edge 817-O of the shaped material 801.

Alternate versions of the planar-shaped, plurality of co-planar energy pathways are the disposed energy pathways made co-planar and/or are made as co-planar layerings, isolated from at least one other corresponding layering, respectively, as is shown in FIGS. 5C and 5D. In FIGS. 5C and 5D, only the 801 material layerings are annular shaped and/or are 801 portions with an aperture there thru. Specifically, in these embodiment layers, co-planar energy pathways and/or co-planar electrodes are shaped as a plurality of shaped main-body portion 80s. Like almost any of the energy pathway and/or electrodes disclosed, the shaped sections could be bypass and/or feedthru electrode applications, having bypass-shaped sections and feedthru-shaped sections, intermingled and/or segregated, co-planar on for example, the same respective, 801 material layering.

Referring to FIG. 5C, a plurality of by-pass, shaped, energy pathways portions 855AB1 and 855AB2, are positioned apart and oppositely oriented relative to one another in their not necessarily, equal size and shape relationship as shown (as already disclosed) here disposed on shaped material 801. Bypass shaped portion electrode 855AB1 has an energy pathway and/or extension portion 79-OB1 extending outward relative to the aperture 000 from the outer perimeter circumference edge 803-O of the electrode body portion 799 of 855AB1 and through the outer insulation portion 814-O to the outer perimeter circumference edge 817-O of the shaped material 801.

Referring again to FIG. 5C, bypass shaped portion electrode 855AB2 has an energy pathway and/or extension portion 79-IB1 extending inward relative to the aperture 000 from the outer perimeter circumference edge 803-1 of the electrode body portion 799 of 855AB2 and through the outer insulation portion 814-I to the outer perimeter circumference edge 817-I of the shaped material 801.

Referring again to FIG. 5C, a plurality of feedthru shaped portion electrodes 855ACF1 and 855ACF2 are positioned apart and oppositely oriented relative to one another in their not necessarily, equal size and shape relationship as shown (as already disclosed) here disposed on shaped material 801 between the bypass, energy pathways and/or electrodes 855AB1 and 855AB2.

Each feedthru electrode 855ACF1, 855ACF2, has a first energy pathway and/or first extension portion 790CF1, 790CF2, respectively extending outward and away relative to the aperture 000 and a second energy pathway a first energy pathway and/or first extension portion 791CF1, 791CF2, respectively, extending inward relative towards the aperture 000.

Referring now to FIG. 5D, which is depicts for example, the same respective, co-planar electrode layering 855AB1 shown repeated except that it is rotated and/or oriented 180 degrees as compared to FIG. 5C and the feedthru electrode 855ACF1, 855ACF2 have been flipped and are now 855BCF1, 855BCF2, respectively, such that when the two layerings are positioned arranged over one another, the shaped energy pathway and/or electrode portions directly above and below will be paired complementary to each other.

As shown in FIG. 5A, four energy pathway and/or extension portions 79-I1, 79-I2, 79-I3, 79-I4 extend inward relative to the aperture 000 to past the inner perimeter circumference edge 803-I of the energy pathway material portion 799, through the inner insulation portion 814-I to the inner perimeter circumference edge 817-I of the shaped material 801. Conversely, as shown in FIG. 5B, extension portions 79-O1, 79-O2, 79-O3, 79-O4 extend outward away relative to the aperture 000 to past the outer perimeter circumference edge 803-O of the electrode body portion 799, through the outer insulation portion 814-O to the outer perimeter circumference edge 817-O of the shaped material 801.

In FIGS. 5E and 5F, alternate versions of the planar-shaped energy pathways are shown as either disposed energy pathways made upon a portion of an 801 material layering and/or made and/or manufactured in a sequence of various as planar shaped material layerings (NOTE: energy pathways, among others, can be disposed upon portions of other materials and/or manufactured singularly and positioned and/or made as part and/or in a sequence as single layerings for example, as is also the case for all typical embodiments shown herein and/or not disclosed herein, for almost any new typical embodiment configuration), isolated from at least one other corresponding layering, respectively, as is shown in FIGS. 5E and 5F.

In FIGS. 5E and 5F, only the 801 material layerings are annular shaped and/or are 801 portions with an aperture there thru. Specifically, in these embodiment layers, planar energy pathways and/or planar electrodes are shaped as a plurality of shaped main-body portion 80s. Like almost any of the energy pathway and/or electrodes disclosed, the shaped sections can be either bypass and/or feedthru electrode applications, having bypass-shaped configurations and/or feedthru-shaped configurations, intermingled and/or segregated.

Referring to FIGS. 5E and 5F where energy pathways 80 of 855M and 855AB are very similar to energy pathways 80 of 855AB and 855AB of FIGS. 5A and 5B. Energy pathways 80 of 855M and 855AB are positioned apart and oppositely oriented relative to one another in their equal size and shape relationship as shown here, disposed on shaped material 801. Extension portions 79-O1 and 79-O2 of 855M and 855AB are very similar and are extending outward relative to the aperture 000 from the outer perimeter circumference edge 803-O of the electrode body portion 799 respectively and through the outer insulation portion 814-0 to the outer perimeter circumference edge 817-0 of the shaped material 801.

Referring again to FIG. 5E, Extension portions 79-I1 and 79-I2 of 855AA and 855AB are very similar and are extending inward relative to the aperture 000 from the inner perimeter circumference edge 803-I of the electrode body portion 799 respectively and through the inner insulation portion 814-I to the inner perimeter circumference edge 817-I of the shaped material 801.

Referring again to FIG. 5E, a plurality of feedthru shaped portion energy pathways 855ACF1 and 855ACF2 are positioned apart and oppositely oriented relative to one another in their not necessarily, equal size and shape relationship as shown (as already disclosed) here disposed on shaped material 801 between the bypass, energy pathways and/or electrodes 855AB1 and 855AB2.

Referring now to FIG. 5F, which is depicts for example, the same respective, energy pathway layering shown in FIG. 5E, except that it is rotated and/or oriented on an imaginary axis 90 degrees as compared to FIG. 5E such that when the two layerings are positioned arranged superposed over one another, the shaped energy pathway and/or electrode portions directly above and below will be paired complementary to each other. A difference could lay in the orientation of the various extension portions, which allow a typical energy pathway and/or electrode arrangement additional variants.

Referring now to FIG. 6A, FIG. 6B, FIG. 6C and FIG. 6D, planar and annular-shaped shielding electrode layering 800 is shown in FIG. 6A having an annular-shaped main-body portion 81 of conductive material 799 deposed on annular-shaped material portion 801. Similarly, referring now to FIG. 6B, planar and shaped electrode layering 800 is shown in FIG. 6B having a shaped main-body portion 81 of conductive material 799 deposed on shaped material portion 801.

In these portions of a typical shaped embodiment, among others, shown material 801 while having the annular-shaped form is also larger than the shaped main-body portion 81 of conductive material 799 for each electrode 800 and 800. The outer perimeter circumference edge 817-O of material 801 is larger than the outer perimeter circumference edge 803-O of the electrode body portion 799 for each electrode 800 and 800 and forms an outer insulation portion 814-O extending which is simply an portion absent of electrode material 799 along at least one predetermined portion location adjacent and parallel the outer perimeter circumference edge 803-O of the electrode body portion 799. The inner perimeter circumference edge 817-I of the material 801 is smaller than the inner perimeter circumference edge 803-I of the energy pathway and/or electrode body portion 799 and forms an inner insulation portion 814-I extending adjacent and parallel relative to the aperture 000 shown and adjacent and parallel the inner perimeter circumference edge 803-I of the energy pathway and/or electrode body portion 799.

The shaped energy pathway and/or electrodes of these embodiments also comprise at least one energy pathway extension portion (and/or simply 'extension portion') that extends outward relative to the aperture 000 for electrode 800, and extends inward relative to the aperture 000 for electrode 800, and/or in other arrangements that can be extending both outward and inward, from the electrode main-body 81 portion, respectively.

As shown in FIG. 6A, four energy pathway and/or extension portions 79G-I1, 79G-I2, 79G-I3, 79G-I4 (not all shown) extend inward relative to the aperture 000 to past the inner perimeter circumference edge 803-I of the energy pathway material portion 799, through the inner insulation portion 814-1 to the inner perimeter circumference edge 817-1 of the shaped material 801.

Conversely, as shown in FIG. 6B, extension portions 79G-O1, 79G-O2, 79G-O3, 79G-O4 (not all shown) extend outward away relative to the aperture 000 to past the outer perimeter circumference edge 803-O of the electrode body portion 799, through the outer insulation portion 814-O to the outer perimeter circumference edge 817-O of the shaped material 801.

As shown in FIG. 6C, 800 and/or 8"XX" shielding pathway has been divided into at least two common energy pathways which are shown created and having paired extension portions 79G-I'X' (not all shown) extending outward and inward respectively, relative to the aperture 000 to past the various perimeter circumference edges 803-'X' of the energy pathway material portion 799, through the inner insulation portion 814-'X' to the inner/outer perimeter circumference edge 817-'X' of the shaped material 801. It is this type of shielding configuration that when substituted into shown in FIG. 7A that another embodiment of the arrangement is disclosed.

Thus an energy conditioning arrangement using 800 and/or 8"XX" shielding pathway has in a FIG. 8 sequencing, for example, can be characterized by at least having a first plurality of energy pathways which could be two 855Ms of FIG. 5E of substantially the same size and shape that are conductively coupled to one another. Then a second plurality of energy pathways which could be two 855AB's of FIG. 5F of substantially the same size and shape that are conductively coupled to one another. Plus, at least a first plurality of shielding energy pathways which could be three COM1's of FIG. 6C of substantially the same size and shape that are conductively coupled to one another and a second plurality of shielding energy pathways which could be three co-planar COM2's of FIG. 6C of substantially the same size and shape that are conductively coupled to one another in this example. These energy pathways are arranged in positioned interspersed as thoroughly explained through out the disclosure herein (substitute Into FIG. 8A, respectively the appropriate energy pathway layerings). Thus, a configuration could yield the first plurality of shielding energy pathways at least shielding the first plurality of energy pathways from the second plurality of energy pathways and the second plurality of shielding energy pathways at least shielding the second plurality of energy pathways from the first plurality of energy pathways. In addition, the first and the second plurality of shielding energy pathways (COM2's and COM1's) are conductively isolated from one another in one typical arrangement and/or even contemplated as conductively coupled to one another in different arrangement example.

A shown in FIG. 6D, 800 and/or 8"XX" shielding pathway has extension portion 79G-O1 singular without any interruptions extend outward away relative to the aperture 000 to past the outer perimeter circumference edge 803-O of the electrode body portion 799, through the outer insulation portion 814-O to the outer perimeter circumference edge 817-O of the shaped material 801.

A converse 800 and/or 8"XX" shielding pathway to the 800 and/or 8"XX" shielding pathway of FIG. 6D (all not shown, but designated C800 and/or C8"XX" shielding pathway—"C" used here as 'converse' 800 and/or 8"XX" shielding pathway) could have a sequence as follows: (energy pathways normally have at least a layering of 801 material spacing apart electrode portions) A first 800 and/or 8"XX" shielding pathway of FIG. 6D, followed by an 855BA of FIG. 5A, next a second 800 and/or 8"XX" shielding pathway of FIG. 6D, then an 855BB of FIG. 5B, then a third 800 and/or 8"XX" shielding pathway of FIG. 6D which is then followed by at least one, but perhaps multiple layerings of 008 of material 801 portions if desired or simply one portion of 801 followed by a first C800 and/or C8"XX" shielding pathway of FIG. 6D similar to that described, followed by a second '855BA-like' energy pathway of FIG. 5A, followed by a second C800 and/or C8"XX" shielding pathway of FIG. 6D similar to that described, followed by a second '855BB-like' energy pathway of FIG. 5A, followed by a third C800 and/or C8"XX" shielding pathway of FIG. 6D similar to that described. Of course, variations to this minimal arrangement are fully contemplated by the applicants, however the spaced-apart energy pathways could follow this sequence in one of many possible examples. It is also noted that 800 and/or 8"XX" shielding pathways would all be conductively coupled to one another and C800 and/or C8"XX" shielding pathways would all be conductively coupled to one another. In a multiple circuit arrangement 800 and/or 8"XX" shielding pathways and C800 and/or C8"XX" shielding pathways could be conductively isolated from one another to yield multiple and isolated common pathways for multiple pathways of low impedance operable for example, in the same, typical embodiment type. It is noted that C800 and/or C8"XX" shielding pathways could be even contemplated as conductively coupled to one another in different arrangement example.

This would be different in a configuration utilizing uniformly arranged shielding pathways of one type (like FIG. 6B, for example). Of course, a typical impediment need not be annular shaped, but configured in almost any possible 3-dimensional layering arrangement with and/or without apertures, vias, and the like. Thus embodiments like FIG. 2A could be arranged with shielding energy pathways having 79G-1's and 79G-3's for one common pathway of low impedance in a circuit arrangement while other shielding energy pathways having 79G-2's and 79G-4's could be used for another common pathway of low impedance in a another coupled circuit arrangement. The configurations and circuit arrangements possibilities are vast and numerous.

Referring to FIG. 7A and FIG. 7B, one discrete embodiment 1005 of an energy-conditioning component utilizing all bypass electrode sections similar to by pass sections of FIGS. 5C–5D is shown as a typical minimum-layered sequence for coupling to multiple separate circuits.

Complementary pairings of co-planar bypass main-body electrode sections 80 in arranged layerings are shown arranged within a plurality of larger sized, same, shaped, shielding, electrodes 800, 810, 815. Each same, shaped main-body electrode 81 of electrodes 800, 810, 815 is formed on as a larger electrode on material 801 portion 800P, 810P, 815P. Each co-planar electrode layering comprises four equally sized main-body electrode portion 80s having at least one extension portion 79-'X', respectively.

Each co-planar electrode layering is arranged between at least two shaped, main-body electrode portion 81s of shielding energy pathways from the plurality of shielding energy pathways comprising at least energy pathways 800, 810, 815. Each shielding electrode of shielding energy pathways from the plurality of shielding energy pathways has a plurality of extension portions 79-'X' contiguous of a main-body electrode portion 81, respectively that is extending both inward towards and outward away from the aperture 000. A shaped material 801 layer or layer 008 is arranged as the last layering after shaped shielding electrode 810, as shown.

It is noted that a shaped energy pathway and/or electrode 855BA1, 855BA2, 855BA3 and 855BA4 of a first co-planar layering is complementary paired to corresponding, but oppositely oriented, shaped energy pathway and/or electrode 855BB1, 855BB2, 855BB3 and 855BB4 of a second co-planar layering the in a manufacturing stacking sequence, respectively. This occurs when one is taking into account the added area and shaping contributed by a contiguous 79'X' extension portion(s), respectively. When corresponding pairing occurs in a manufacturing stacking sequence Not taking into account a contiguous 79'X' extension portion(s), corresponding shaped energy pathways and/or electrodes from each respective corresponding pairing of shaped energy pathways or electrodes are superposed, with 803 edges correspondingly aligned, respectively. Therefore, only the contiguous 79'X' extension portion(s) do not receive shielding of the various shielding energy pathways as thoroughly described earlier in the disclosure and applicable throughout.

Referring now to FIG. 7B, and FIG. 5A and FIG. 5B, one discrete embodiment 1205 of an energy-conditioning component could be utilizing layerings of either FIGS. 5A–5B or FIG. 7A for example, as is shown as a minimum outer electrode sequence for coupling to multiple, separate circuits.

A view of the energy-conditioning component 1205 is shown utilizing minimum layered sequence 1005 of FIG. 7A. Each shaped portion electrode 855BA1, 855BA2, 855BA3 and 855BA4 of the first co-planar layering and each shaped portion electrode 855BB1, 855BB2, 855BB3 and 855BB4 of the second co-planar layering has at least one extension that is each is coupled to its own outer electrode 890A–894A, while for the inner extension portions, each is coupled to its respective the inner electrodes 890B–894B in the minimum layered sequence of FIG. 7A.

Each the respective outer side, extension portion is conductively coupled to an outer electrode portion positioned along the outer perimeter circumference edge 817-0 and each the respective inner side, extension portion is conductively coupled to an inner electrode portion positioned along the inner perimeter circumference edge 817-1 of the energy-conditioning component 1205 as shown. Shaped, shielding, energy pathways 800, 810, 815 with each shielding, energy pathways respective extension portion 79'X' are each conductively coupled to the respective outer electrode portions 798-I(s) and 798-O(s).

Referring now another type of typical annular-shaped embodiment of an energy-conditioning component of FIG. 8A, is energy-conditioning component 1105, among others, which is shown as a minimum layered sequence for coupling to at least one or more than one separate circuit system(s).

In one instance, among others, many a typical embodiments can be disclosed as an energy conditioner comprising a plurality of superposed energy pathways (thus all energy pathways are not only aligned, they are of equal size and equal shape for shielding) that are conductively coupled to one another. Then a plurality of electrodes of which they are all of equal size and equal shape to one another and will include at least a first and a second pair of electrodes (all electrodes of this plurality receive shielding from being at least sandwiched by at least two shielding electrodes, respectively), that are each conductively isolated from one another. Electrodes of first pair of electrodes are each arranged conductively isolated and orientated in mutually opposite positions from one another (in many cases directly complementary opposite the other). This is also the same for the electrodes of the second pair of electrodes respectively. It is also noted that any one electrode of the plurality of superposed electrodes will be equally larger (as any other one electrode of the same plurality of superposed electrodes), than any one electrode of the second plurality of electrodes. Of particular note, the first and the second pair of electrodes are each arranged shielded from the other, They are as a pairing, orientated from now transverse positions relative to the other. The need for a now, transverse position of one circuit portion grouping as it is relative to another isolated circuit portion grouping, among other reasons, aids effectiveness In the formation of a dynamic null relative relationship during conditions of separate and/or isolated, but mutual dynamic operations within the AOC 813 of a typical embodiment. An energy conditioner or a energy pathway and/or electrode arrangement of an energy conditioner as just described, can also further comprise a material having predetermined properties such as disclosed previously in this treatment such that the plurality of superposed electrodes and the plurality of electrodes are each at least as both pluralities and of individual electrodes, spaced-apart from one another by at least the material and/or portions of material of a plurality of material portions all having predetermined properties.

To continue with FIG. 8A, a first plurality of paired and annular-shaped electrodes 855BA, 855BB, and a second plurality of paired annular-shaped electrodes 865BA, 865BB, are shown arranged within a third plurality of annular-shaped electrodes 800, 810, 815, 820, and 825, which themselves (as with this embodiment) are each shaped electrodes of the third plurality of annular-shaped electrodes. 800, 810, 815, 820, 825, are each formed on a equally-sized and shaped 801 material designated 800P, 810P, 815P, 820P, 825P, respectively. Each shaped electrode 800, 810, 815, 820, 825, has a plurality of extension portions 79G-I'X's and 79G-O'X's, extending both inward towards, and outward away from the aperture 000, respectively.

In a feedthru/bypass configuration, the paired annular-shaped electrodes 855BA, 855BB and 865BA, 865BB, each have at least one extension portions designated 79'X'. Annular-shaped electrodes 855BA, 865BA have at least two extension portions 79-I1 and 79-I2 extending inward towards and relative to the aperture 000 and annular-shaped electrodes 855BB, 865BB, which have at least two extension portions 79-O1 and 79-O2 extending outward away from and relative to the aperture 000.

It is also important to note that the electrode extension portions of each respective electrode are coupled to respective outer electrode portions 890A–894A, while for the inner extension portions of each respective electrode are coupled to respective inner electrode portions 890B–894B in the minimum layered sequence as shown looking at both FIG. 7A and FIG. 7B.

Although not shown, the coupling electrode portion(s) and/or extension portions of the paired electrodes could be offset from each other at almost any relative predetermined angle, such as 90 degrees for example, however, the cancellation effects for noise energies are maximized at opposing 180 degree orientations.

The various groupings of the pluralities of electrodes are arranged in a predetermined manner and/or a sequence that allows for isolated coupling to at least one or more than one separate circuit system(s). Each shaped electrode of the first and second pluralities of annular-shaped electrodes is arranged sandwiched and shielded between at least two annular-shaped electrodes of the third plurality of electrodes. Accordingly, shaped electrode 855BA of the first plurality of annular-shaped electrodes is arranged sandwiched and shielded between annular-shaped electrodes 825 and 815 and shaped electrode 855BB of the first plurality of annular-shaped electrodes is arranged sandwiched and shielded between annular-shaped electrodes 815 and 800. Shaped electrode 865BA of the first plurality of annular-shaped electrodes is arranged sandwiched and shielded between annular-shaped electrodes 800 and 810 and shaped electrode 865BB of the first plurality of annular-shaped electrodes is arranged sandwiched and shielded between annular-shaped electrodes 810 and 820. A shaped layer of material 008 is arranged and positioned after the last shaped electrode 820 shown here in this typical embodiment.

Stacking sequence shown of 1105, for example in FIG. 8A is intended to be a minimum sequence of a manufactured arrangement for an energy-conditioning component capable of coupling to at least one or more separate circuit system(s). In order to increase capacitance, additional electrode pairs of either the first and/or second pluralities of electrodes can be added as long as each additional electrode is positioned between two electrodes of the third plurality of electrodes which provide the shielding for the electrode pairs as well as a pathway of least impedance for the filtered energy as discussed in detail above.

Referring now to FIG. 8B, a view of the energy-conditioning component 1207 is shown utilizing minimum layered sequence of FIG. 8A. Each extension portion is conductively coupled to an outer electrode positioned along the outer diameter edge and inner diameter edge of the energy-conditioning component 1207. The annular electrodes of the third plurality of electrodes 800, 810, 815, 820, 825 are all conductively coupled to outer electrode portions 798-1 and 798-0 and as such are conductively coupled to each other. Conversely, the paired annular electrodes 855BA, 855BB, and 865BA, 865BB, are each conductively isolated from each other and from the annular electrodes of the third plurality of electrodes 800, 810, 815, 820, 825.

In an alternate embodiment of FIG. 8A with FIG. 8B (still using embodiment 1105 to disclose the idea in order to reduce the number of drawings needed, herein) of a typical embodiment like FIG. 8A with FIG. 8B, among others, could have annular energy pathways and material portions 801, among others can further comprise a plurality of apertures serving as either conductive, non-conductive vias or insulated conductive vias designated as 500-1, 500-2, 500-3, and 5004, for example.

The third plurality of energy pathways 800, 810, 815, 820, 825 are each shown conductively insulated from the conductive vias 500-14 by a portion of material 801-I, which could also be simply a portion or area preventing conductive coupling of the aperture to the electrode, shown or not shown. In a typical embodiment, among others shown, one of a plurality of vias or apertures is conductively coupled to an annular electrode of one of the first or second pluralities of energy pathways, while a predetermined remaining plurality of vias are either conductively coupled or insulated from the same electrode, depending upon application needs. Accordingly, each via is at least conductively coupled to at least one complementary annular electrode in the minimum configuration, but never conductively coupled to a shield electrode. However, it is fully contemplated that there are configurations were this is done and it is fully anticipated and disclosed.

In this embodiment, the electrode extension portions of the first and second pluralities of energy pathways are optional as the circuit coupling may be made through the vias. It is important to note that the vias may be made of a solid conductive material or a conductive aperture or merely be insulated and non-insulated apertures that allow conductors to be placed there-thru to be either conductively coupled or insulated to the various energy pathways as desired.

Thus, new embodiments as disclosed, among others, are suitable for simultaneous electrical systems comprising both low and high-voltage circuit applications by utilizing a balanced shielding electrode architecture incorporating paired, and smaller-sized (relative to the shielding, pathway electrodes) complementary pathway electrodes. In addition, new feedthru embodiments as disclosed, among others, can also be combined with, and suitable for multiple electrical systems comprising various low and high current circuit applications. It should also be noted that various heterogeneous combinations of either both or mixed same-sized and paired equally-sized bypass and paired complementary feedthru energy pathways that are configured for electrically opposing, paired operations can be arranged or arranged co-planar or in a combination of both stacked and co-planar mixed and matched complementary circuitry pathways utilizing a variety of energy portion propagation modes as described.

Turning to FIG. 9, it should be noted that various types of outer conductive coupling portions for the shielding energy pathways and/or the complementary energy pathways could be either utilized, all together or mixed with embodiment combinations, as just described. These outer conductive coupling portion configurations can include a conductive coupling of various outer differential pathways (not shown) to an outer coupling electrode portions like 498SF1(T/B), 498SF2(T/B), 490A and 491A as shown. For example, of the various respective energy portions 400, 401, 402, and 403 propagating depicted along outer pathways (not shown) and entering a typical embodiment like that of the FIG. 9 drawing, for example. Note that at 498SF1 (T/B) (which is a straight feedthru energy propagation) one possible attachment/coupling scheme would allow the outer differential energy pathway (not shown) to end at conductive coupling portion top (relative to drawing location) and bottom (relative to drawing location) of each respective 498SF1(T/B). In this type of conductive coupling, portions of propagating energy continue along into 797SF1A and out along 797SF1B, respectively, (not shown) which are portions of the internal complementary pathways through an embodiment, among others, to undergo energy-conditioning and then continue out bottom (relative to drawing location) 498SF1B, shown on a lower portion of the drawing FIG. 9, to upon exit start up along the beginning of that portion of outer differential energy pathway (not shown) would be coupled. A variation of this conductive coupling and energy portion propagation scheme, allows the portion of the outer differential energy pathway (not shown) that normally ended at entry into an embodiment, among others at 498SF1T on the FIG. 9 to now also be external and contiguous so to go underneath a typical embodiment like that of the FIG. 9 drawing, for example, as well as, so to be also internally passing thru a typical embodiment like that of the FIG. 9 drawing, for example, between means of conductive coupling points 498SF1T and 498SF1B, Therefore, allowing portions of propagating circuit energy to either pass to the outside of a typical embodiment, among others (not shown) in addition to maintaining the internal feedthru pathway utilizing an embodiment 19200. Of course, these propagation scenarios also go for the 498SF2(T/B) coupling side, as well FIG. 10 shows electrically opposing complementary electrode pairings 497SF2 and 497SF1. Each complementary electrode 497SF2 and 497SF1 comprises 'split'-electrodes 497SF2B and 497SF2A, 497SF1A and 497SF1B, respectively, which form straight feedthru complementary electrodes comprising part of a typical embodiment like 19200, among others, of FIG. 10. Each 'split'-complementary electrodes of parent 497SF2 and 497SF1 are positioned in such close proximity within an embodiment, among others that the pair of 'split'-complementary electrodes 497SF2B and 497SF2A, 497SF1A and 497SF1B work as one single capacitor plate 497SF2 and 497SF1, respectively when they are electrically defined.

497SF2B and 497SF2A, 497SF1A and 497SF1B, comprise a unit of two closely spaced and parallel pairing of thin energy pathway electrode parents 497SF2 and 497SF1 elements. These dual plate elements or "split-energy pathways" or "split electrodes", 497SF2B+497SF2A, and 497SF1A+497SF1B, respectively, cooperatively to define electrically opposing paired set of two complementary energy split-energy pathway electrode 'parents' 497SF2 and 497SF1, respectively. These electrode elements for example, significantly increase the total electrode skin surface portions available to facilitate and react to a corresponding increase of current handling capacity of a typical energized circuit like Circuit 1A. The increase of the total electrode skin surface portions or areas available to facilitate and react to a corresponding increase of current handling capacity by the usage of "split-energy pathways" or "split electrodes" yields minimal increasing of the total volumetric size of the overall multi-circuit energy-conditioning structure like 19200, for example, relative to a typical non-"split-energy pathway" Configuration having similar total electrode skin surface portions or areas of current handling capacity.

A typical embodiment like 19200 allows the use of these 'split-energy pathway and/or 'split-complementary electrode' pairs, like 497SF2B+497SF2A, and 497SF1A+497SF1B, respectively, for example, are placed in a position of separation 814B by only microns of distance with respect to one another. As such, this distance relationship(s) will allow portions of propagating energies utilizing along these complementary energy pathways to utilize the closely positioned split pairings like 497SF2B+497SF2A, and 497SF1A+497SF1B, respectively, for example, in such manner that it will appear within the Circuit 1A (not shown) that each grouping of 'split'-electrodes as described is as one single complementary electrode each and yet this can be done without having to configure additional shielding, electrodes interposed therebetween, as well.

While the 'split'-electrode construction can substantially increase the relative current carrying ability over that of one single paired 'un-split' energy pathway grouping(s), this feature will also allow the voltage dividing function of almost any typical, new embodiment, among others, like embodiments 19200 and 19210, to further take advantage of the energy pathway architecture's voltage dividing and balancing function and/or abilities to increase a typical, new embodiments' own overall current handling ability while performing such functions, among others, while having a reduction in overall size normally not expected for such an embodiment, as it is able to still maintain a relatively less stressful energy-conditioning environment for the various 499 electrode and/or material elements that also comprise the various types of possible new embodiments.

Electrode extension portions 49SF'X', allow portions of propagating energy to utilize internally positioned electrodes and/or energy pathways after arriving from external energy pathway portions (not fully shown) that can be or are coupled by standard or future industry coupling/attachment means and/or standard or future connection/attachment methodologies.

To improve further, some typical embodiment elements as referenced in the disclosure, embodiments, among others, as shown in FIG. 10 and others all disclose an ability to allow multiple circuit, high-low voltage handling ability provided within the same multi-circuit energy-conditioning embodiment to allow both a low voltage energy-conditioning function utilized for a predetermined energized circuit but to simultaneously function for a circuit utilizing a high-voltage energy pathway and conditioning function within the very same multilayer embodiment, among others if desired, is now disclosed.

Therefore, some of embodiments overall, are suitable for simultaneous sets of electrical system portion pairs comprising both low and high-voltage circuit applications that will provide excellent reliability by utilizing a balanced shielding electrode architecture incorporating paired, and smaller-sized (relative to the shielding, pathway electrodes) electrodes, but also same-sized and paired bypass configured and paired feedthru configured conductive and electrically opposing electrodes as shown in FIG. 10, for example.

A new, typical embodiment, among others 19200 would be comprised of a 'split'-electrode feedthru version which are positioned or spaced closely relative to one another in such a manner that each set of split-complementary electrode planes of electrode materials normally appear to be comprise in a completed 19200 with the same or slightly less in volumetric size then that of a non-spilt utilizing structure, yet with more efficient and larger energy handling capacity than that found in an identically sized non-spilt utilizing device comprising more distinct numbers of same sized split equally-sized feedthru conductive complementary electrodes.

The difference would be that the new embodiments, among others would allow for more energy carrying or energy portion propagation ability utilizing less layering, occupying less portion, allowing for more circuitry conductive couplings while simultaneously handling multi-circuit energy-conditioning demands of a plurality of energy pathways this small, but significant configuration only within the new embodiments, among others, 19200, or the like.

Therefore, closely positioned split pairings like 497SF2B+497SF2A, and 497SF1A+497SF1B that respectively can make up 'parent' 497SF1 and 497SF2, together are defined as at least two same-sized and shaped, complementary reversed-positioned energy pathways that are spaced apart and/or isolated and shielded from one another by at least a larger, shielding, energy pathway portion and/or electrode that is interposed and positioned between one another operable to be shared (the larger shielding electrode is) by both closely positioned split pairings like 497SF2B+497SF2A, and 497SF1A+497SF1B that respectively can make up 'parent' 497SF1 and 497SF2, for energy-conditioning and voltage reference for a Circuit 2A, for example (not shown) for reference functions in a typical embodiment like 19200, among others.

Again, referring to FIG. 10, another typical layered energy pathway and/or electrode and 801 material arrangement combinations can be shown as energy-conditioning component 19200. Outer coupling electrode portions 498SF2B, 498-1, 498SF1A, 491A, 498SF1B, 498-2, 498SF2A, 490A each designated by their respective outer conductive coupling structure depictions shown surrounding the 19200 discrete body. A typical multi-circuit energy-conditioning component like 19200 can comprise two outer common coupling electrodes 498-1 AND 498-2 for common coupling to an outer common energy pathway or common energy portion (not fully shown). Straight feedthru outer coupling symmetrical complementary electrodes 498SF1A+498SF1B and symmetrical complementary electrodes 498SF2A+498SF2B (not fully shown) for outer differential pathway conductive coupling to a first outer differential energy pathway (not shown) and a second outer differential energy pathway (not shown) of a first circuit pathway. Finally, by-pass outer coupling electrodes 490A and 491A are for differential conductive couplings to third and fourth outer differential energy pathways (not shown) of a second circuit pathway.

Each internal complementary electrode, 497SF1, 497SF2, 455BT and 465BT (not fully shown) that are contained within the various shielding electrode containers designated 800'X' and arranged within the overlapping field energy and overlapping physical 900'X' cage-like shield structures will now be described in terms of internal complementary electrodes, 497SF1, 497SF2, 455BT and 465 BT (not fully shown) ability to provide energy-conditioning along these electrode pathways as well as direction for portions of energies propagating within first or second separate and/or isolated circuits that are created when these symmetrical complementary electrodes 497SF1, 497SF2, 455BT and 465BT are energized.

In an energized configuration for 19200, portions of energies that have taken entry into the 813 AOC of 19200 are doing so to the almost instantaneous development of a zero impedance pathway or 'hole' that is created by the spaced-apart positioning of the interconnected and shared and combined shielding electrode structures 900B+900A+900C found comprising portions of 19200 with the almost totally enveloped sets of symmetrical complementary electrodes 455BT and 465BT (not shown) as well as symmetrical complementary electrodes 498SF1A+498SF1B and symmetrical complementary electrodes 498SF2A+498SF2B within the shielding electrode containers 800C, 800D, 800E, 800F, which form combined shielding electrode structures 900B+900A+900C, which in turn form a single shielding structure found in FIG. 10 (but not numbered).

Thus, a typical embodiment like 19200 is operable for dynamic convergence of oppositely phased energies (not shown) within an AOC 813 that are interacting with one another in a harmonious, complementary manner, simultaneously, while at the same time the same dynamic convergence of oppositely phased energies is aiding to create, exploit and utilizing a dynamically developed, zero impedance state to allow portions of the energies to propagate outward of the 813 AOC influence along to outer common energy pathway 6803. The internal common electrode materials 499G and the portion of material 499G located along the conductive surfaces formed by 499G or the "skins" (not fully shown) of the various shielding common electrodes 800/800-IMC, 810F and 820F and the other conductively coupled "8"XX" shield electrodes, aid indirectly and directly as they are utilized at the same time by energy portions of C1 and C2, and so forth, by way of respective oppositely paired symmetrical complementary electrodes such as 465BT, 455BT, 497SF1 and 497SF2, that are also utilizing in a non-conductively coupled manner, the very same outer common energy pathway 6803 for portions of energy propagations and circuit voltage reference, as well.

At the same time, it should be noted that 455BT and 465BT are utilizing 810F simultaneously, as the larger 810F shielding, electrode is positioned between the two electrically opposing, complementary by-pass electrodes, but in a reversed mirror-like manner, that also allows portions of energy propagating along this section of a typical embodiment like 19200, among others, to move out and onto the common energy pathway 6803, which is common to both 455BT and 465BT complementary electrodes. It should be noted that both 455BT and 465BT complementary electrodes are not necessarily operating electrically in tandem with another operating circuit utilizing (among others) the oppositely paired equally-sized electrodes 497SF1, 497SF2, that are also utilizing a very same common energy pathway 6803 for energy portion propagation for other portions of energy, simultaneously.

The propagation of portions of energies moving along (not shown) operable second circuit system's 497SF1, 497SF2 equally-sized energy pathways and of course, onto the very same internally shared common energy pathway/internal electrode shields, 820F, 810F, 800, 810B, 820B which make-up 900B, 900C and 900A, respectively. Some portions of energies utilizing a common energy pathway will egress out onto the common energy pathway or the outer common energy pathway 6803 by way of shielding electrode extensions 49'X's (not fully shown) and conductive coupling means 6805 (explained further, below).

The various circuit operational propagations and conditionings taken by the portions of propagating energies originally external from 19200 (not shown) as just described will occur for the most part, simultaneously after energization, along the various externally located energy pathways and the internally-found, equally-sized energy circuit pathways/electrode pairs (individually electrodes of the pairs are sized and shaped relative to one another equal-sized and shaped) such that these portions of propagating energies moving along in multiple directions, arranged, in some embodiments co-planar, and most points in-between (not shown) will be able to undergo the various energy-conditioning functions as described in a predetermined manner.

While this energy propagation occurs simultaneously, other portions of the energies will propagate to a low impedance pathway created by the interaction and presence of the internally shared, co-acting, common energy pathway/internal electrode shields comprising the internally shared, and intercoupled, co-acting, common energy pathway/internal electrode shields, 820F, 810F, 800/800-IMC, 810B, 820B, which make-up conductive cage-like shield structures 900B, 900C and 900A, as well as the additional and optional 850F/850F-IM and 850B/850B-IM image/shield electrodes respectively, most of which are electrically and conductively distinct from that of the two sets of electrically opposing, outer energy circuit pathways. Some portions of energies utilizing a common energy pathway (not shown) will egress out onto the common energy pathway or the outer common energy pathway 6803 by way of shielding electrode extensions 49'X's (not shown) and outer conductive coupling means 6805 (explained further, below).

It should also be noted that a material 801 having an insulating function can be used for separating the conductive attachment means and/or methods used with the common coupling to the common energy pathway or the outer common energy pathway 6803 such that it prevents portions of complementary electrode pathway propagating energies of each distinct and operable Circuit 1A and Circuit 2A (each not shown) coupled with 19200 from electrically meeting or shorting out by way of physical contact with any of the other outer energy pathways, respectively (not shown) of the distinct circuitries nearby (not shown) or the outer common energy pathway 6803, itself.

As shown in FIG. 10, solder or simply a conductive material operable for coupling, or even a physical coupling method such as resistive fit or spring tension, etc. designated as 6805 can also provide a means to conductively couple to a same portion or same outer common energy pathway 6803 to facilitate common energy pathway conductive coupling and eventual development of a shared voltage reference point or image (not shown) after energization.

Energy pathway electrode shielding structure (not fully shown) comprising the internally shared, and intercoupled, co-acting, common energy pathway/internal shield electrode, 820F, 810F, 800/800-IMC, 810B, 820B, make-up larger conductive cage-like shield structures 900B, 900C and 900A, as well as the additional and optional 850F/850F-IM and 850B/850B-IM image/shield electrodes respectively, allow for formation of a 0-voltage or same voltage un-biased (subjective to each circuit simultaneously) reference or image plane relative internally to each of the sets of electrically opposing complementary energy pathways that are electrically positioned, on opposing sides of an energized energy pathway electrode shielding structure (not fully shown) not of the complementary energy pathways.

The ability of each half of each respective Circuit 1A and 2A (not shown) to utilize and share a self-contained and positioned circuit voltage reference (not shown) provides each ½ of the electrically opposing complementary energy pathway pairings a desired energy-conditioning feature that will divide respectively contained circuit voltages (not shown) evenly between the electrode material elements, 455BT, 465BT and 'split'-electrode 497SF1 as well as, 'split'-electrode 497SF2 located within 19200 to be electrically located simultaneously, (for each paired set of complementary elements, respectively) in a reversed-mirrored image to one another, across a portion of the internally shared, co-acting, common energy pathway/internal electrode shields comprising the internally shared, and intercoupled, co-acting, common energy pathway/internal electrode shields, 820F, 810F, 800/800-IMC, 810B, 820B, which make-up conductive larger grouped, cage like shield structures 900B, 900C and 900A, as well as the additional and optional 850F/850F-IM and 850B/850B-IM image/shield electrodes respectively, that is physically providing an opposite side of the intercoupled and internal shielding electrode structure for utilization by each complementary electrode comprising each electrically opposing complementary energy pathway pairings.

The AOC 813 shown in FIG. 10, and FIG. 9 and point to the position marking a portion of the passive conditioning network developed within an energized 19200 embodiment as depicted in FIG. 10, and like a typical embodiment like that of the FIG. 9 drawing, for example, as well as the portion of a voltage dividing network developed within an energized embodiment like 19210, among others. Normally, by utilizing an embodiment, among others like 19200 which are conductively coupled to at least two separate energy circuit pathways (not fully shown), with each coupled circuit relying upon its own separate energy source and its own separate energy-utilizing load for energy portion propagation, the relative parallel positioning of each circuit unit provide by each of the single complementary circuit pathways that comprise electrically opposing paired and complementary pathways will be operating within an embodiment but in a protective and mutually null convergence that is essentially shielded, electrically, within by the presence of the shielding, electrode structures which allows a user to take the opportunity and the advantage of utilizing simultaneous interactions of various circuit energies of both circuitry elements that are efficiently exploiting the statically positioned electrode material elements as well as the various dynamically occurring energy portion propagations that result in various forms of RFI containment, EMI energy minimizations, parasitic energy suppressions as well as opposing cancellation of mutual inductance found along adjacent, and pre-positioned electrically opposing energy pathways.

It should be noted as one looks at FIG. 10, and FIG. 9 energy egress points for egress of the external originating energy portions to complementary bypass pathways (not fully shown) that are shown located to the right and to the left which comprise 491A and 490A, are approximately 180 degrees in positioning from one another, while the 498SF1A, 498SF1B and 498SF2A and 498SF2B electrode energy exit/entry points for a typical embodiment like 19200, among others, are located 180 degrees in a relative positioning away from one another, yet 498SF1A+B and 498SF2A+B outer electrodes are also maintaining a parallel relationship with one another between the two 498-'X' common energy exit points of the internal common shield structures' (not fully shown) common energy pathway 6803 (not fully shown), and yet this grouping 498-'X's of energy exit points are also in a 90 degrees, or perpendicular, positioning relationship from physical 180° degree relative separation positioning of the bypass coupling electrodes 490A and 491A to one another which are conductively coupled to a separate, externally paired, electrically opposing complementary energy pathway Circuit 1A (not shown) not of the external paired electrically opposing complementary energy pathway Circuit 2A (not shown) which is conductively coupled to 498SF1A+B and 498SF2A+B external electrodes.

The cross section provided in FIG. 10 will note the other significant distance and separation relationships designated 806, 814, 814A, 814B, 814C and 814D (not all fully shown) as they are predetermined with respect to the vertical electrode and energy pathway stacking arrangements as depicted. It should also be noted that the various energy pathway positional direction of the separate and/or isolated circuit paired groupings of opposing complementary paired energy pathways 498SF1 and 498SF2 and 465BT and 455BT take advantage of a 90 degree, or perpendicular positioning relationship of 498SF1A+B and 498SF2A+B and 465BT and 455BT, for example, with respect to one another as well as simultaneously taking advantage of the 180 degrees positioning relationship that exists along the paired set of electrically opposing complementary electrode pathways 498SF1A+B and 498SF2A+B for example, that is not only a physical positioning convenience, but is utilized to take advantage of null effect incurred upon the possible H-field energies that will normally not conflict with one another due to in this case but not all, a 90 degree positioning for energy portion propagation relationship.

It is noted that most of the separation distances of elements within the device are relative to the various electrode pathway structures contained within the device and though, not absolutely necessary for many multi-circuit energy-conditioning applications, in order to maintain control of the balance within a specific, system circuit, these material distance relationships should be even in embodiment spacing considerations and distributions.

Large variances or inconsistencies with these paired volumes or distances of materials have been experimented with and any anomalies that are detrimental for circuit balance for most general electrical applications of typical embodiments are possible, but not optimal, among others.

Separation distance 814 calls out a application relative, predetermined, 3-dimensional distance or portion of spacing or separation as measured between shielding, electrode energy path-container 800C, 800D, 800E, 800F respectively, that contain a single or grouping of 'split'-complementary electrodes, such as 800F comprising common shields 810B and 820B and comprising complementary energy pathway 497SF2, including portions abutting or bordering along electrode material surfaces or 'skins' of these structures that would effect the energy portion propagations that could also be found within such defined portions in an energized state in one example, or such as 810F and 820F such as 800F, comprising common shields 810B and 820B and comprising complementary energy pathway 465BT, including portions abutting or bordering along electrode material surfaces or 'skins' of these structures that would effect the energy portion propagations that could also be found within such defined portions in an energized state for another example, as shown respectively in FIG. 10.

Separation distance 814A is a generally a portion of three dimensional separation distance or proximity of spacing found between multiple adjacent common electrode material pathways such as common electrode pathway 820B and common electrode pathway image shield 850B/850B-IM for example comprising a thin material 801 or spacing equivalent (not fully shown) or other type of spacer (not shown).

Separation distance 814C is the separation found between common electrode pathways such as common electrode pathway 820B and complementary electrode pathways such as complementary electrode pathways 465BT. Separation distance 814B is the vertical separation between 'split'-complementary energy pathways such as 'split'-complementary energy pathways 497SF1A and 497SF1B.

These unique combinations of dynamic and static forces (not shown) occur simultaneously within the containment of shielding electrode structure and due to its use as a conduit, to a common energy pathway distinct from the complementary pathways. Therefore, by utilizing and combining various rules of physical element distance and energy field separations between energy pathways, 801 materials, non-conductive materials, as well as the dynamic energy relationships that are taking place within an energized circuit pathway, a new utility and multi-circuit energy-conditioning ability is provided.

Split electrically opposed, complementary electrodes 497SF1 and 497SF2 that comprise one set of paired, similarly sized conductive material portions for utilization as paired and opposing complementary electrodes. These two similarly sized conductive material or electrode portions are further comprised together as a grouping of four distinct, yet closely spaced pairs of two units each of thin electrode elements 497SF1A, 497SF1B, and 497SF2A, 497SF2B, respectively separate and/or isolated in parallel relation in and among themselves by a thin layer of the casing material 801. More particularly, each conductive 497SF1 and 497SF2 electrode material or energy pathway comprises a closely spaced pair of thin conductive plate elements 497SF1A, 497SF1B, and 497SF2A, 497SF2B, which effectively double the total conductive surface portion of the paired electrically opposing 497SF1 and 497SF2 complementary energy pathways. It should be noted that similarly, each common, shielding electrodes does not comprise a corresponding closely spaced pair of thin common, shielding electrode elements because it is not necessary for these shielding, electrode structure elements for these shielding electrodes to possess double the total electrode surface portion because of utilizing this configuration, the shielding, electrode structure elements that comprise the larger universal shielding, electrode structure architecture with stacked hierarchy progression does not handle energy the main input or output energy portion propagation pathway functions like those of the prior art. Rather, the shielding, electrode structure elements are utilized within a typical embodiment like 19200, among others, or an embodiment like 19210, among others, and the like, in most cases, as a common, additional energy transmission pathway not of the external energy pathways (not shown).

Spacing 814B between the electrode element pairs 497SF1A, 497SF1B and 497SF2A, 497SF2B, is desirably minimized, such as on the order of about less than 1.0 mil or to what ever spacing allows operability, mostly dependent upon currently existing manufacturing tolerances and electrode material energy-handling properties will allow for the desired effect, whereas the distance 814C and 814 that can be found between the interpositioned equally-sized and common energy pathway electrodes 810B, 497SF2A+ 497SF2B, 820 for example, is substantially greater than that of the 814C separation.

It should be noted that each paired and 'split'-electrode pathway is generally similar in conductive portion size, but preferably the same with respect to its split mate, and therefore, the twin plates designated 497SF2B and 497SF2A, 497SF1A, and 497SF1B, respectively are each merely reversed electrode material mirror images of the other. However, the electrically opposing equally sized electrode pair, 497SF2, and 497SF1 comprised of 497SF2B and 497SF2A, 497SF1A and 497SF1B respectively will be considered reversed mirror images of one another as a whole, relative to its position within a typical embodiment like 19200, among others.

An actual embodiment like 19200, among others, manufacturing sequence for building one of these specific energy pathway structures will now be outlined and described in a discrete variation 19200A of FIG. 10. At first, a deposit or placement of material 801 is made, then a layering of electrode material 499G for formation of 850B/850B-IM is positioned, next a 814A thin layering or spacing of a material 801 or 801'X' is made, then positioning of a layering of electrode material 499G is deposited for formation of shielding, electrode pathway of 820B. This layering is then followed by a layering of material 801 to establish spacing 814C, then followed by a layering of electrode material 499G to allow formation of energy pathway 497SF2A, next a 814B thin layering or spacing of a material 801 or 801'X' is made, followed by a layering of 499G electrode material for the formation of energy pathway 497SF2B, then an 814C application of material 801 is positioned, followed by the placement positioning of a layering of electrode material 499G for formation of shielding, electrode pathway 810B, then a 814C layering of material 801, followed by a layering of electrode material 499 for formation of energy pathway 497SF1A, next a 814B thin layering or spacing of a material 801 or 801'X' is made, then a another layering of electrode material 499 for formation of energy pathway 497SF1B, then a 814C layering of material 801, then a layering of electrode material 499G for formation of shielding, electrode pathway 800/800-IMC which is also the shared, central shielding electrode structure balance point of a typical embodiment like 19200, among others, 814C layering of material 801, then a layering of 499 electrode material to allow formation of bypass electrode pathway 455BT, followed by a 814C deposit of material 801, then a layering of electrode material 499G for formation of common energy shielding electrode pathway 810F, a 814C material 801, a layering of 499 electrode material to allow formation of bypass electrode pathway 465BT; then 814C material 801, then common energy shielding electrode pathway 820F, next, a very thin layer 814A of material 801, then a layering of electrode material 499G for formation of common energy shielding electrode pathway 850B/850B-IMO, and finally a deposit or placement of material 801 is made to comprise some of the major fundamental layering structure and supporting elements the physical stacking composition of 19200.

Referring now to FIG. 11, the pathway arrangement example 19200 as shown as a drawing previously shown in FIG. 10 has been modified in that the FIG. 11 is a drawing of embodiment variant 19210, which now depicts the first pair of bypass electrodes 455BT and 465BT have been replaced with split-feedthru electrode pathways 497F4A and 497F4B, and 497F3A and 497F3B while the bottom (relative to drawing location) portion of 19200 comprising 497F1A, 497F1B and 497F2A, 497F2B 'split'-electrode feedthru electrode pathways remain forming an energy-conditioning circuit component an embodiment like 19210, among others, capable of conductive coupling to two separate external, electrically opposing complementary energy pathway circuits. The conductive couplings comprising two separate energy pathways are shown in FIG. 12, which is a top (relative to drawing location) view of completed energy-conditioning circuit component 19210A.

Referring now to FIG. 12, the arrangement 19210 shown in FIG. 11, is now shown as a finished energy-conditioning component with at least elements of arrangement 19210A, now mounted on a layer 6806 (represented as the portion of the large outer circle) of a PCB having external opposing energy pathways or traces (not shown) for coupling to various energy-utilizing loads and sources of energy as shown. External coupling electrodes 498-1, 498-F1A 498-F2A, 498-2, 498-F4A, 498-F3B, 498-3, 498-FIB, 498-F2B, 498-4, 498-F4B, and 498-F3A, each designated by their respective outer coupling electrode structures surround the FIG. 12 component body. Underneath the layer 6806, separate and/or isolated by insulating or material 801 (not shown), a second conductive portion or layer or common energy pathway 6803 (represented as the portion of the large square within circle 6806) of the PCB comprises a common energy common energy pathway and circuit voltage image reference node, CRN (not shown) separate and/or isolated from layer 6806 by insulating or material 801 (not fully shown). The an energy-conditioning component like 19210A comprises four outer coupling bands or electrodes 498-1, 498-2, 498-3, 4984 each coupled to outer common energy pathway or portion 6803 by conductive coupling means (not shown) by conductive apertures or filled vias 6804. Conductive apertures or filled vias 6804 are insulated from layer 6806 by insulation portion 6804B. The propagation of energy portions through an energy-conditioning component like 19210A will now be described.

Referring to a first circuit coupled to an energy-conditioning component like 19210A, portions of energy propagate as shown with energy flow arrow from energy source-1 along an energy pathway (not fully shown) to cross over feedthru outer coupling electrode 498-F1A, along split-feedthru electrode pathways 497F1A-B to outer coupling electrode 498-F1B on the opposite side of component 19210A, along an outer energy pathway (not fully shown) to energy utilizing load-1.

Portions of energy then propagate from energy utilizing load-1 along an energy pathway (not fully shown) to outer coupling electrode 498-F2A, through AOC along split-feedthru electrode pathways 497F2A and 497F2B to outer coupling electrode 498-F2B on an opposite side of component 19210A, and then along an external energy pathway (not fully shown) back to energy source-1.

Referring to a first circuit coupled to an energy-conditioning component like 19210A, portions of energy propagate as shown with energy flow arrow from energy source-2 along an energy pathway (not fully shown) to outer coupling electrode 498-F3A, along crossover split-feedthru electrode pathways 497F3A-B to outer coupling electrode 498-F3B on the opposite side of component 19210A, along an outer energy pathway (not fully shown) to energy utilizing load-2.

Portions of energy then propagate from energy utilizing load-2 along an energy pathway (not fully shown) to outer coupling electrode 498-F4A, through AOC along split-feedthru electrode pathways 497F4A and 497F4B to outer coupling electrode 498-F4B on an opposite side of component 19210A, and then along an external energy pathway (not fully shown) back to energy source-2.

While the above-mentioned description provides a general description for the majority of portions of energy passing through an energy-conditioning component like 19210A, the conditioning function of the component has yet to be described. Accordingly, portions of energy propagating (not shown) along split-feedthru electrode pathways 497F1A, 497F1B and 497F1A, 497F1B, respectively are electrostatically shielded and physically shielded from internal and external effects by the internally shared, co-acting common energy pathway/internal electrode shields 820F, 810F, 800/800-IMC, 810B, 820B, which make-up larger grouped, conductive cage-like or cage-like shield structures, 900B, 900C and 900A, as well as the additional and optional 850F/850F-IM and 850B/850B-IM image/shield electrodes respectively.

Simultaneously, portions of energies propagating along split-feedthru electrode pathways 497F1A, 497F1B, and 497F1A, 497F1B, have magnetic or "H"-field emissions in the direction of propagation according to Amperes' right hand rule. This magnetic field or "H"-field is partially canceled by an opposing magnetic or "H"-field field created by portions of energies propagating in the opposite general direction along the corresponding pairs of split-feedthru electrode pathways 497F1A, 497F1B and 497F1A, 497F1B, respectively.

Split-feedthru electrode pathways 497F4A, 497F4B, and 497F3A, 497F3B that are configured such that portions of propagating energies are directed at an angle of 90° degrees with respect to the portions of propagating energies accepted through split-feedthru electrode pathways 497F1A, 497F1B and 497F2A, 497F2B. Split-feedthru electrode pathways such as paired 497F4A+497F4B and 497F3A+497F3B and the remaining split-feedthru electrode pathways 497F1A+497F1B and 497F2A+497F2B, which as respective 'split'-electrode pairings are oriented at a 90 degree angle will have minimal effect on respective H-field energy propagation portions relative to each other, constructively or destructively, thereby negating or nulling almost any potential effects to each respective C1 and/or C2, and so on.

Other portions of energies propagate to the internally shared, and intercoupled, co-acting, common energy pathway/internal electrode shields, 820F, 810F, 800/800-IMC, 810B, 820B, which make-up conductive larger grouped, cage-like shield structures 900B, 900C and 900A, as well as the additional and optional 850F/850F-IM and 850B/850B-IM image/shield electrodes respectively and collectively are then conductively coupled to outer common energy pathway or portion 6803 by way of common conductive apertures or filled vias 6804. This multi-point coupling in common of the grouped shielding electrode pathways provides enhancement for usage of a reference voltage node and insurance of development of a low impedance pathway relative to almost any other possible pathways of higher impedance operable at energization. A low impedance energy pathway common to multiple circuit system portions helps to provide conditioning for other portions of energies utilizing both Circuit 1/1A and Circuit 2/2A's over-voltage and surge protection (shown or not shown). It should be noted that the energy-conditioning between each pair of electrically opposing electrode positions is balanced not only between themselves within the AOC but they also balanced with respect to the reference voltage node that each respective Circuit 1/1A and Circuit 2/2A's, are utilizing.

Figure 13B:
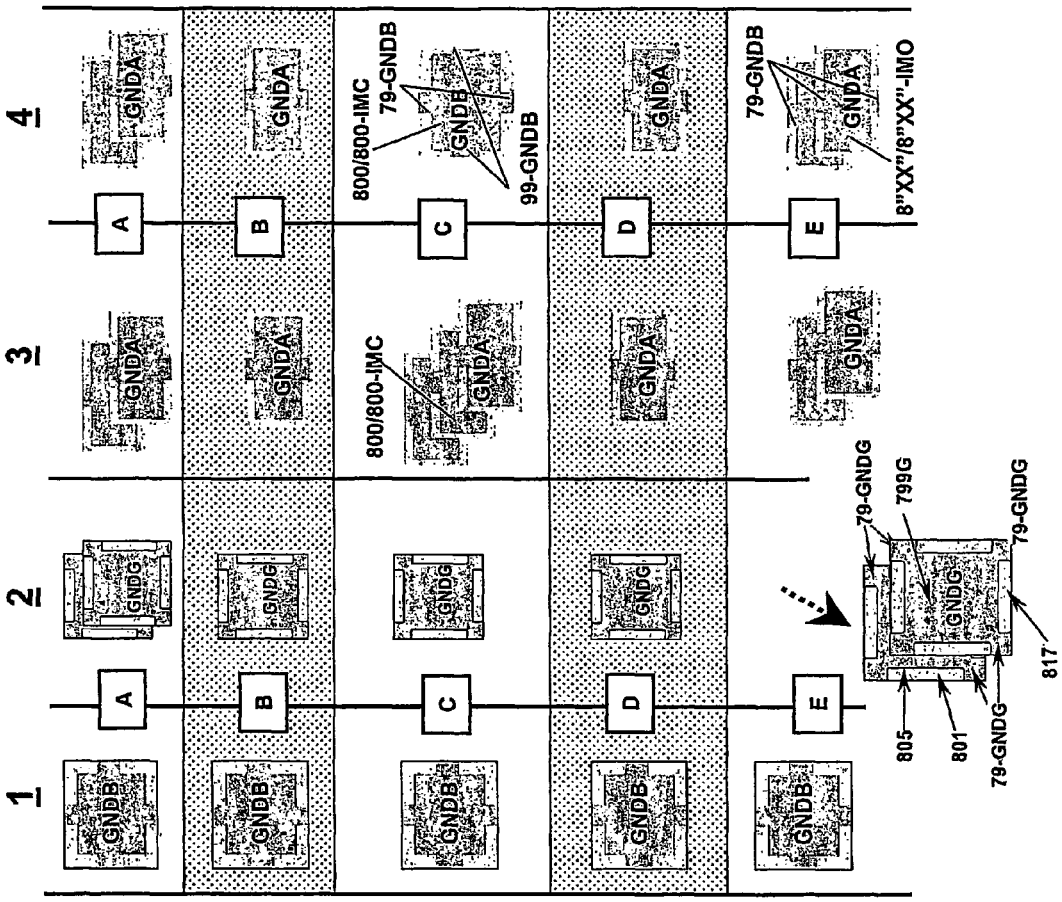
FIG. 13B shows a another view of portions of various component layerings in accordance with typical configurations presented, among others.
Figure 13A:
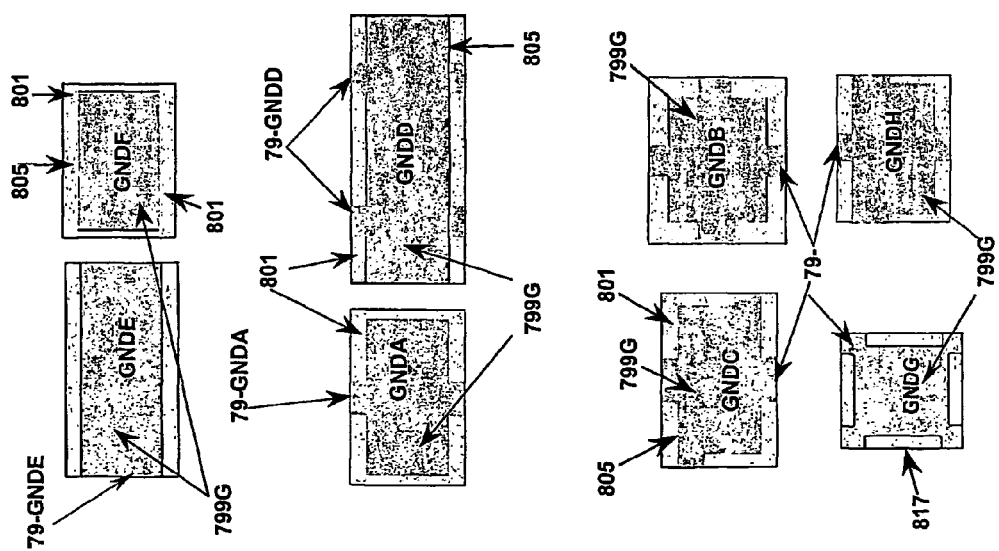
FIG. 13A shows an exploded plan view of portions of various component layerings in accordance with typical configurations presented, among others.

Referring now to FIG. 13A and FIG. 13B, depicting other variant arrangements of shielding, energy pathway portions and layerings designated GND"X" not earlier depicted, which comprise insulating and conductive energy pathway material elements of one or more species of embodiment layering(s) as shown in FIG. 13A, which are then positioned together in many configurations, a sampling of which are shown in FIG. 13B. Shielding, energy pathway layerings designated, for example, can be formed into generally planar-shaped insulating/shielding, energy pathway layers designated as GNDA, GNDB, GNDC, GNDD, GNDE, GNDF, GNDG, GNDH are shown in FIG. 13A and comprise of portions of both 799 and 801 materials for insulating/shielding, energy pathway layers which will be called out in various layer combinations (a sampling of some of the possible combinations are shown in FIG. 13A and FIG. 13B).

In FIG. 13A, various designated insulating/shielding, energy pathway layers GNDA-GNDH or insulating/shielding, energy pathway layer comprises a shielding, pathway material 799 at least partially surrounded by a insulating material or medium 801 or an isolation band 814, (which is simply a portion of area or distances along the energy pathway edge 805 of exposed layered material 801 that has not been covered by shielding, energy pathway material 799). It should be noted that shielding, pathway material 799 is not special, although various conductive materials known and not known in the art can be used, including electromagnetic, and ferro-magnetic combination compounds and the like. It is noted that various material that are conductively doped of applied, chemically made conductive material that utilizes a catalyst of some type that allow a material (not shown) to take on conductive characteristics or properties for energy propagation and of which can be identical in composition with almost any of the complementary conductive material (not shown here) disclosed or not.

Each insulating/shielding, energy pathway layer GNDA, GNDB, GNDC, GNDD, GNDE, GNDG, GNDH, with the exception of insulating/shielding, energy pathway layer GNDF, has two or more than two energy pathway extension areas (designated 79-GND'X' and the various external, conducive attachment portions and/or conductive portions are generally known as 798-'X' designations) that normally facilitate conductive energy pathway connections to a common conductive area or common energy pathway external to the GND'X' conductive portions of the GND'X' layerings. Energy pathway extension areas 79-GND'X' are simply a portion of shielding, pathway material 799 which extends into, and then normally, past the shielding, pathway material boundary or energy pathway edge 805 of shielding, pathway material 799, and through the surrounding border of material 801 to meet the outer edge 817 of the insulating/shielding, energy pathway and subsequently the 798-GNDB conductive coupling/termination portion or conductive coupling means.

Referring now to FIG. 13B, a matrix of four columns with 5 rows designated A, B, C, D, and E, wherein each box of the matrix includes at least one insulating/shielding, energy pathway layer. Each column represents a different configuration of insulating/shielding, energy pathway layers, which are used in a stacked configuration in combination with two pairs of dielectric/complementary energy pathway layers (not shown). In the arrangement configuration, one insulating/energy pathway layer of a first pair of insulating/energy pathway layers will be stacked between insulating/shielding, energy pathway layers in rows A and B, and a second insulating/energy pathway layer of the first pair of insulating/energy pathway layers will be arranged between insulating/shielding, energy pathway layers in rows B and C. Similarly, one insulating/energy pathway layer of a second pair of insulating/energy pathway layers will be arranged between insulating/shielding, energy pathway layers in rows C and D, and a second insulating/energy pathway layer of the first pair of insulating/energy pathway layers will be arranged between insulating/shielding, energy pathway layers in rows D and E.

Column 1 represents the minimum number of Insulating/shielding, energy pathway layers GNDB (in this example) which can be used with two sets of paired of dielectric/electrically opposing complementary energy pathway layers (not shown) such that each dielectric/electrically opposing complementary energy pathway layers has at least one insulating/shielding, energy pathway layer GNDB arranged above each dielectric/electrically opposing complementary energy pathway layers and at least one insulating/shielding, energy pathway layer GNDB arranged below each electrically opposing complementary energy pathway layers. It should be noted that the GNDB layering has four units of 79-GNDB internal common energy pathway extensions that will subsequently allow conductive attachment/conductive coupling to four units of 798-GNDB, external, conducive portions or conductive termination portions or common attachment means, that allows for a subsequent common conductive coupling to a and external third energy pathway not of at least two electrically opposing complementary energy pathways located internally within and comprising a portion of an typical, new embodiment.

Column 2 represents an alternate configuration of insulating/shielding, energy pathway layers GNDG in which the first and second dielectric/electrically opposing complementary energy pathway layers of each pair of dielectric/e electrically opposing complementary energy pathway layers is separated by only one insulating/shielding, energy pathway layer GNDG. However, each pair of dielectric/electrically opposing complementary energy pathway layers has at least two insulating/shielding, energy pathway layers GNDG arranged above each pair of insulating/energy pathway layers and each pair of dielectric/electrically opposing complementary energy pathway layers has at least two insulating/shielding, energy pathway layers GNDG arranged below each pair of insulating/energy pathway layers.

Column 3 depicts GNDA shielding, energy pathway layers which represents another alternate configuration of the possible insulating/shielding, energy pathway layers which is identical to the number of layer configurations shown and utilized in column 2 with the exception of that at least two additional insulating/shielding, energy pathway layers GNDA are now sandwiching the first centralized, common conductive and shared shielding energy pathway which was singularly arranged between each pair of dielectric/electrically opposing complementary energy pathway layers. Now, the introduction and interpositioning of two additional, common shielding, energy pathway layers GNDA with the first central common and mutually shared shielding, energy pathway layering, the total three distinct common shielding, energy pathway layers separate at least two circuits operating within the AOC of a typical, new embodiment yet are sharing the shielding, energy pathway structure, simultaneously. (See row C) Further discussions and disclosures for this type of configuration are explained in detail with FIG. 9.

Column 4 shows yet another one of a possible multitude of alternate configurations of the various insulating/shielding, energy pathways, designated GNDA, for example, but can be operable to almost any shielding, energy pathway groupings or species. As for column 4, unlike column 3, in place of the three centrally located, shielding, energy pathways, designated here as GNDA, respectively and which could also be configured like the configuration of FIG. 4C, for example, there is now only one insulating/shielding, energy pathway layer GNDB arranged between each pair of dielectric/electrically opposing complementary energy pathway layers (see row C).

The insulating/shielding, energy pathway layer GNDB shown in row C, column 4, is shown as a different configuration than the other insulating/shielding, energy pathway layers GNDA. Insulating/shielding, energy pathway layer GNDB has four energy pathway extension areas for external, conducive coupling portions 798-GNDB (not shown). It should be noted that this type of configuration creates enormous possibilities for many possible, circuit configurations contained within a typical, new embodiment. For example, the two additional 79-GNDB electrode or energy pathway extensions located on the sides of the GNDB layering and not present on the two sides of the GNDA layering, do not necessarily have to conductively couple to the common external third energy pathway or area by way of the two 798-GNDB (not shown) external energy pathway extensions or common termination structures or common attachment means. The two additional 79-GNDB (not all shown) energy pathway extension areas conductively coupling to external, conducive coupling portions 798-GNDB (not all shown), may be conductively coupled to a separate and active energy source which will enable a circuit reference voltage or image to be adjusted with respect to the commonly shared circuit voltage reference utilizing by the pair of separate and distinct embodiment circuit pathways, originally when these two external, conducive coupling portions are not attached to an energy source. Thus, the opportunity to create a wide variety of hybrid active/passive energy conditioning embodiments is possible. By selectively coupling or not coupling the GNDB shielding, energy pathway by way of 99-GNDB extension portions or even direct conductive coupling of any portion of the shielding, energy pathway to 9908-GNDB conductive portions or conductive termination portions or conductive coupling means (all not shown) operable to the shielding, energy pathway 800/800-IMC-GNDB, for example, to an additional isolated, energy pathway (not shown) which is not electrically common with either, the two sets of opposing complementary energy pathways (not shown) and/or a common energy pathway (not shown), a user could apply a voltage or energy bias and/or charging to the shielding, energy pathway 800/800-IMC-GNDB, for example, that will be common and simultaneously utilized by portions of energies propagating along one or multiple isolated circuit portion pairings comprised within portions of an AOC for this type of new, energy conditioning embodiment example, among others.

To go further, a predetermined energized bias activation of the shielding, energy pathways (not shown) through the utilization of selectively coupling or not coupling a GND"X" shielding, energy pathway by way of 99-GND"X" extension portions or even direct conductive coupling of any portion of the shielding, energy pathway to 998-GND"X" conductive portions or conductive termination portions or conductive coupling means (all not shown) operable to the shielding, energy pathway 8"XX"/8"XX"-IM"X"-GND"X", (not shown) for example, to an additional isolated, energy pathway(s) (not shown) which is not electrically common and/or conductively coupled with either, the two sets of opposing complementary energy pathways (not shown) and/or a common energy pathway (not shown), a user could apply a voltage or energy bias and/or charging to the shielding, energy pathway 8"XX"/8"XX"-IM"X"-GND"X"(s), (not shown) for example, that will be common and simultaneously utilized by portions of energies propagating along one or multiple isolated circuit portion pairings (not shown) comprised within portions of an AOC for this type of new, energy conditioning embodiment (not shown) example, among others.

Note that by way of 99-GND"X" extension portions or even direct conductive coupling of any portion of the shielding, energy pathway to 998-GND"X" conductive portions or conductive termination portions or conductive coupling moans (all not shown), conductive and shielding, energy pathway structures could be selectively timed to be switched 'on' bias and 'off' bias depending upon a specific application. Thus, an energized, bias activation and/or bias non-activation for a typical, new embodiments" shielding, energy pathway structure could change the behavior and electrical performance characteristics, as well as the various energy conditioning effects of portions of energies utilizing the separate and contained circuit pathways within the AOC of a typical, new embodiment or device (not shown), as opposed to a possible non-energized bias option for a similar, shielding energy pathway structure (not shown). It is important to note that this type of shielding, energy pathway arrangement of non-uniform 99-GND"X" extension portions is not relegated to just the center-arranged, shielding energy pathway, and it is contemplated that almost any predetermined energized, bias activation of the shielding, energy pathways through the utilization of coupling isolated outer electrode portions or outer, energy pathway portions like a 998-GND"X" is fully contemplated by the applicant.

With reference to FIG. 13B and FIG. 13A, it should be noted that almost any heterogeneous or homogeneous mixing and matching of the possible GND"X" configurations of both the types and numbers as well as specific positioning of the various insulating/shielding, energy pathway layers is not limited to simply the samples shown of the GNDA-GNDH layers, on the contrary almost any variation thereof can be used and the only limitation is that the shielding energy pathway elements/dielectric layerings comprise a shielding, energy pathway using some form of a dielectric the dielectric layering for both physical support and electrical characteristics provided that the shielding energy pathway conductive area maintaining a greater than or equal to the conductive energy pathway area then the energy pathway area of the dielectric/electrically opposing complementary energy pathway layers used in the same arrangement. To further touch upon briefly other non-discrete embodiments of a typical, new embodiment are contemplated such as a non-discrete embodiments of a typical, new embodiment, which is operable as an integral portion of an operational amplifier, a comparator, or sensor.

An operational amplifier is an extremely high gain differential voltage amplifier or device that can compare the voltages of two inputs and produces an output voltage that is many times the difference between their voltages. An operational amplifier will normally perform this type of subtraction and multiplication process depending upon its type of operational amplifier, but in most cases two input voltages control how current is shared between two energy pathways of a parallel circuit. Even a tiny difference between the input voltages produces a large current difference in the two energy pathways, especially for the energy pathway that is controlled by the higher, voltage input carries a much larger current than the other path. The imbalance in currents between the two energy pathways produces significant voltage differences in their components and these voltage differences are again compared in a second stage of differential voltage amplification.

Eventually the differences in currents and voltage become quite large and a final amplifier stage is used to produce either a large positive output voltage or a large negative output voltage, depending on which input has the higher voltage. In a typical application, feedback is used to keep the two input voltages very close to one another, so that the output voltage actually falls in between its two extremes. At that operating point, the operational amplifier is exquisitely sensitive to even the tiniest changes in its input voltages and makes a wonderful amplifier for small electric signals.

For other certain non-discrete embodiments of a typical, new embodiment, it is generally known that an electrically complementary neutral object such as the conductive shield structure and external common energy pathway coupling contains both positive and negative electric charges. However, those opposite charges are equal in amount in an un-energized state. However, this does not mean that the charges along the 'skin' of the shielding, energy pathways are unaffected by another nearby charge. The proximity of various paired and opposing complementary energy pathways operating with an electrically neutral shield architecture structure interpositioned between will, at energization, allow the interpositioned shielding energy pathway architecture to become simultaneously a voltage reference and image with respect of the generally unrelated portions of propagating energies located along the two or more than two separate circuitry passing within a typical, new embodiment AOC and comprising at least two or more than two, separate and generally electrically unrelated circuits in terms of energy sources and energy utilizing loads they each respectively serve that are comprising groupings of paired and opposing complementary energy pathways of specific circuitry comprising the same source and same energy utilizing load.

With respect to various electrically opposing and paired complementary energy pathways which are similar in manufactured conductive area when a measurement with respect to one another is compared and by being physically located in an electrically parallel relationship, but in as a reversed-mirrored pair positioned between the same enveloping but commonly shared conductive shielding energy pathway structure, balanced portions of some of the same source originating energies will place an electrical charge upon one portion or side of the same shielding energy pathway that will in turn cause portions of the interposed shield energy pathway to become charged on one of its' conducive large skin or side area with respect to the first complementary energy pathway (not shown), yet still neutral third pathway element (not shown), will also simultaneously charge bias a complementary reversed-mirror-matched rearrangement of the charges located physically on the opposite side of the same shared centered conductive and shared shield pathway (not shown), to take on a charge opposite to that of the now charged one half of the interpositioned shield (not shown), and at the same time causing portions of the energy electrons located on pathway (not shown), to shift toward a shield pathway (not shown), while like-charges like that of the charged object will shift away from that object. A common energy pathway will acquire an "induced polarization" with respect to the closely positioned paired complementary energy pathways meaning that shield pathways, positive and negative charges are displaced relative to one another and that this displacement is "induced" by the presence of nearby active charge.

Induced polarization is a common effect and is present whenever lightning is about to strike the ground. As an electrically charged cloud drifts, overhead and the relatively closely spaced Awnings or trees acquire this induced polarization. The objects 'skins' become covered with charge opposite that of the cloud proclaim an impending lightning strike that will possibly occur between the cloud and the oppositely charged top of a tree or building.

With the AOC 813, a pair of energy pathways like 855AA and 855AB of FIGS. 5E and 5F are in reality co-acting with one another in a balanced teeter-totter switching series of actions with respect to a centralized and shared conductive area or pathway. Although a external observer could detect and possibly measure a switching action maintained by the energized groupings of energy pathways, to an observer such as one located within the energy utilizing load of a typical, new embodiment circuit would be treated with the appearance of a balanced and impeccable care and its affect upon propagating energy within a typical, new embodiment To achieve the above advantages, according to a first aspect of a typical embodiment as a portion operable as an integral portion of sensor, or a portion of a surface potential sensor, a typical embodiment could be comprising a detecting electrode positioned to face a charged member for detecting a surface potential of the charged member, an arrangement for periodically changing an electrostatic capacitance formed between the charged member and the detecting electrode, an initial-stage input circuit conductively coupled to the detecting electrode, and a succeeding-stage amplifier circuit conductively coupled downstream of the initial-stage input circuit and including an operational amplifier for amplifying a difference between an AC component from the initial-stage input circuit and a reference node voltage, a source voltage supplied to the initial-stage input circuit is derived from the reference node voltage so that the sensor is not affected by noise superposed on the reference node voltage.

Even with noise superposed on the reference node voltage, therefore, no noise component appears in the difference between the AC component output from the initial-stage input circuit and the reference node voltage. The subsequent-stage amplifier circuit can therefore amplify the AC component without being affected by the noise component. Consequently, measurement accuracy can be improved with ease. Unless specified and depending upon application, the 801 materials in a typical embodiment, as well as the conductive material like 799, will each be, respectively, homogeneous in makeup, for material type. According an additional feature of a typical embodiment could be as a initial-stage dual input circuit or element in which a dual surface potential voltage sensor is developed by a conductive area and/or common potential and/or common grounding of a first source of a (Field Effect Transistor) FET, for example, and both of the inherent resistance found along the paired and normally electrically opposing, complementary conductive elements or those electrode elements made with resistive-conductive material operable between a drain of FET, for example, and the addition of a second source of like a FET, for example, and utilizing the both of the inherent resistance found along the paired and normally electrically opposing, complementary conductive elements that will now be maintained as a low impedance drain with respect to the central shielding electrode structure of a typical, new embodiment for use between a FET, for example, and a power source. A signal from the detecting reference electrode is applied to each a the gate of FET, for example, and conductive area and/or common potential and/or common ground, and a common the voltage drain potential is simultaneously applied to the subsequent-stage amplifier circuit through a typical, new embodiment.

A third use of a variation of a typical, new embodiment is disclosed, a dual line which supplies both a reference node voltage and as well as a shielding, electrode structure which is arranged in a position between both sides of a detecting electrode and also close to both sides of a gate terminal of FET, for example, or an input circuit portion leading to the gate terminal. Since the reference node voltage is common to and from both separate energy supply circuits having low output impedance, the commonly shared reference node voltage line is effective to also serving as the shielding, electrode structure. With the above arrangement, therefore, the dual configuration of detecting electrodes and the dual input circuit portions leading to the gate terminals are always shielded-by the common reference node voltage line and the ground electrode, consequently a sensor is less affected by extraneous noise occurring through a power distribution network, which has by definition, a large loop area for RF return currents. Although not shown, some of a typical embodiment and energy conditioning architecture structures can be adapted for use within active silicon integrated circuitry with their construction over a nonconductive substrate or conductively made or doped, as well as a conductive shielding electrode sub-strata in combination with conductive or conductively-made or doped materials configured in interconnect energy propagation pathways or layers provided by conventional integrated circuit manufacturing processes.

A resulting non-discrete energy conditioning structure comprises either a first conducting layer separated from a substrate or a shielding electrode sub-strata or a third conductive layer and will be separated from theses possible elements by a first dielectric layer 801, while a second conducting layer is separated from the first conducting layer by a second dielectric layer 801 and a third conducting layer and the third conductive layer is then separated from the second conducting layer (which is electrically opposing the first conductive layer) by third dielectric layer. The second conducting layer then separated from an additional third conductive layer by a fourth dielectric layer. It should be noted that the first and second conductive layers are complementary in nature and operation and are divided into a plurality of paired, but electrically isolated conductors in an ordered complementary electrical circuit array and separated by the groupings of the interconnected third conductive pathways which are common to both complementary first and second conductors through a physical interpositioning and circuit functioning manner as is shown in FIG. 11, for example.

Every one of the first conductors can be conductively coupled to a first terminal or a first sub-prime terminal, if desired, while the remaining second conductors can be conductively coupled to a second terminal or a second sub-prime terminal. All first, second conductive layers, regardless of conductive coupling portion(s), are always interposed to or with one another by a third conductor that is conductively coupled to all other third conductors of arrangement for example, by a conductively coupled manner, as well as to a third common, outer electrode or outer conductive portion(s), which are not of the first, first sub-prime, second or second sub-prime outer electrode or outer conductive portion(s), or conductive terminals.

Although not shown through pictures in the disclosure, a comparator circuit could be created that has a non-inverting input conductively coupled to the energy output of the switching threshold voltage setting maintained by the interposing shielding, electrode structure and it's external common energy pathway element such that a defined switching threshold voltage of a typical, new embodiment with respect to the various input/output coupling ports (all not shown) will define a centralized comparison voltage utilized for other larger portions of circuitry also utilizing a typical, new embodiment.

The variation of a typical, new embodiment in addition to its possible energy conditioning functions, could utilize its common electrode shielding structure to take on or emulate a center tap of resistor/voltage divider network which is normally constructed of a ratio of various integrated circuit resistors as disclosed byway of prior art configurations. However these ratios of various integrated circuit resistors to now be eliminated and will now be done with the inherent properties present within the combination of new embodiment elements, all of which are naturally occurring, such as the electrode resistance properties, instead.

The value of the voltage reference located on the opposing and opposite sides of the common electrode shielding structure or resistor/voltage divider will be created at energization the common and shared electrode shield structure is utilized to the determine or define a common voltage reference located on or at and instantaneously both respective sides of the common electrode shield structure which is now emulating a center tap of the resistor/voltage divider which is now processing equal voltage reference is that are shared to both of the design switching threshold elements of a master circuit's respective high or low level input buffer.

Thus, the voltage taken from the new typical, new embodiments created resistor/voltage divider and center tap emulator or a shielding electrode structure both internal portions of separate circuitry utilizing the now centrally shared and common created reference voltage element, so as it defines a second comparison voltage which can be compared for use as an actual switching threshold voltage as defined by controlling circuits utilization of a typical, new embodiment.

Thus, almost all embodiments and variations of an embodiment similarly constructed or manufactured by standard means and used with standard, multiple, paired line circuit situations and having a material having predetermined properties 801 difference as the only significant variation between identically configured embodiments, among other embodiments will yield an insertion loss performance measurement in a manner that is exceptional. This reveals circuits utilizing a new conductive shield structure and outer conductive attachment elements will be working in common utilizing electrostatic shielding suppression and physical shielding, among others and for influencing the conditioning of energy propagated within one of a plurality of possible circuit system portions amalgamated into a typical, new embodiment, among others.

Users of the various embodiment arrangements may use almost any type of the industry standard means of attachment and structures conductively couple all common energy pathways to one another and to the same common energy pathway that is normally separate of the equally sized paired complementary circuit pathways. The conductive coupling of common electrodes is desirable for achieving a simultaneous ability to perform multiple and distinct energy-conditioning functions such as power and signal decoupling, filtering, voltage balancing utilizing electrical positioning relative to opposite sides of a "0" Voltage reference created on opposite sides of the single sandwiching positioned electrode structure and the principals as disclosed.

As it is disclosed, additionally placed, shielding energy pathways those marked (#-IM'X') coupled with the inherent central, shared image "0" voltage reference plane will increase the shielding effectiveness of a typical, new embodiment in many ways. It should also be noted that complementary energy pathways are symmetrically balanced as it is disclosed in the various energy pathway arrangements as shown in FIG. 2A, FIG. 3A, FIG. 4A, FIG. 7A, FIG. 8A, FIG. 10 and FIG. 15, and FIG. 16, for example, among others.

Figure 14:
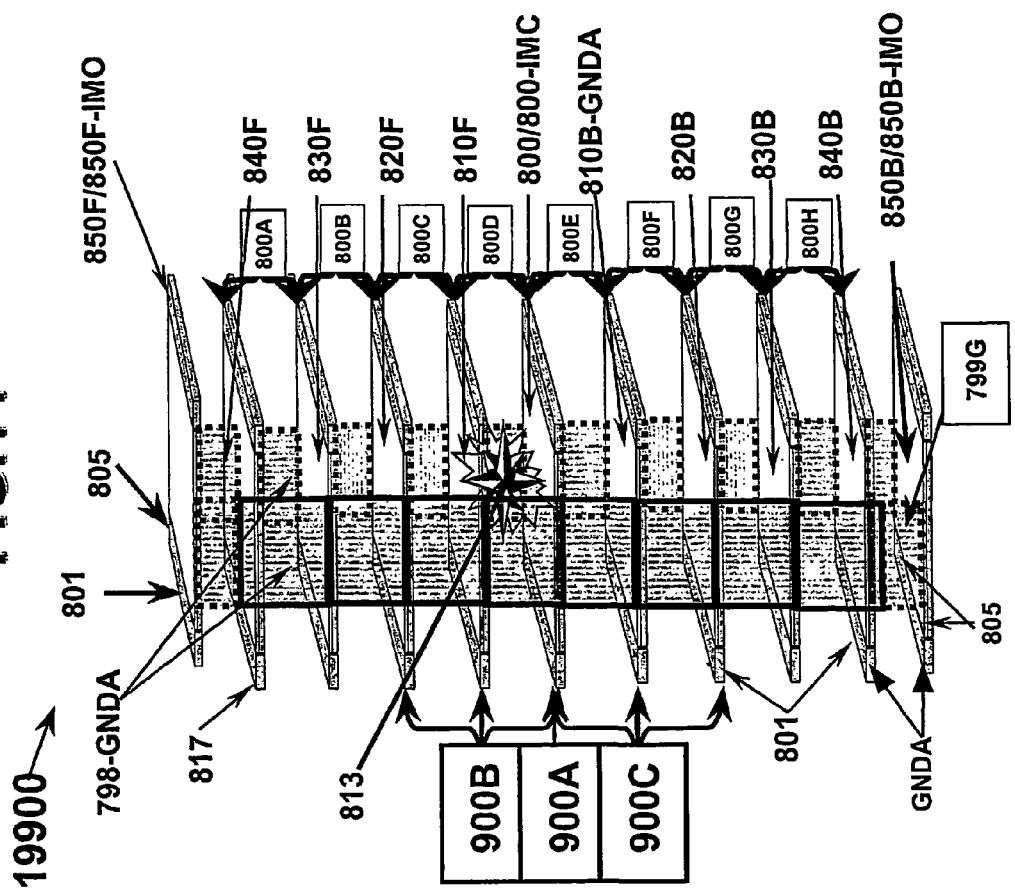
FIG. 14 shows portion of an exploded perspective view of a portion of an example of an embodiment 19900, which is one of many variants of a typical, universal, shielding energy pathway architecture and/or arrangement, having stacked shielding, energy pathway hierarchy progression in accordance with typical configurations presented, among others.

The sandwiching function of these pathways, 850F/850F-IMO, 840F, 830F, 820F, 810F, 800/800-IMC, 810B, 820B, 830B, 840B and 850B/850B-IM shown in FIG. 14 that make up shielding electrode containers 800A, 800B, 800C, 800D, 800E, 800F, 800G, and 800H that almost envelope the complementary energy pathway pairs to make up groupings of paired conductive shield-like containers 800'X' will again aid to a good degree in performing the portions of energy propagation relative to the externally attached, common conductive area or common energy pathway and will simultaneously allow for creation of voltage image reference aids for circuits contained within a typical embodiment.

Sandwiching function of typical paired, common-sized, energy pathways that comprise groupings of paired conductive, shield-like containers 800'X', will again aid to in effecting the energy portion propagation relative to externally coupled conductive, portion(s) and/or shielding energy pathway, which is also include a common conductive portion, and/or a simultaneously create voltage image reference aid –IM'X'.

It should be noted that if various shielding conductive structures that make up an embodiment are in balance, almost any additional or extra single, conductive shield pathway added individually by mistake or with forethought, will not necessarily hamper or degrade energy-conditioning operations to a significant degree and will actually allow or reveal a potential cost savings in the manufacturing process wherein an automated layer process(s) could possibly add or has added an additional outer shielding layer(s), as described in addition to those called out herein, but, in leaving in this case, an un-balanced result.

Thus, it is disclosed that minor errors or inconsistencies to configurations that include additional outer shielding layer(s), as described, intentional or accidental will not be detrimental to the overall performance for a majority of a typical embodiment when they (or it) is utilized an application(s) and are fully contemplated by the applicant.

It should be noted that equal numbers of shielding electrode container structures 800'X' make up part of an typical embodiment are in balance within the embodiment structure according to a followed predetermined stacking sequence and that almost any additional or extra single, conductive shield pathway layers that are added by mistake or with forethought during the manufacturing process will not sufficiently hamper or degrade energy conditioning operations. An added extra, conductive pathway layering can actually reveal a potential cost savings in the manufacturing process wherein almost any automated layer processes could possibly added the additional outer layer or layers as described or actually not include one of the two designated –IM'X' conductive shielding, electrodes. It is disclosed that these manufacturing errors whether intentional or accidental, will not overwhelmingly harmful to the balance integrity of an typical embodiment comprising the properly sequenced stacking of common and conductive, shielding containers designated 800'X'. As discussed and is fully contemplated by the applicants.

Normally, the shielding electrode container structures 800'X' that make up part of a typical embodiment are in balance within the embodiment structure according to a followed predetermined stacking sequence. Normally, there should be no additional or extra single conductive shielding, pathway layers placed before application of the additional outer separated paired and same sized, electrically opposing, differential conductive pathways. Thus, almost any additional or extra single conductive shielding, pathway layers, individually, that are added by mistake or with forethought before positioning, the additional outer separated paired and same sized, electrically opposing, differential conductive pathways during the manufacturing process will hamper or degrade energy conditioning operations.

By contrast, the total number of paired electrodes and/or complementary energy pathways that comprise and/or can be characterized by all of the paired, electrically opposing, complementary energy pathways not of the larger, shielding type-species of energy pathways of almost any variation of a typical embodiment must be even integer number.

By further looking at FIG. 14, it is seen that shielding, electrode pathways, 850F/850F-IMO, 840F, 830F, 820F, 810F, 800/800-IMC, 810B, 820B, 830B, 840B, and 850B/850B-IM are also surrounded by material having predetermined properties 801 that provides for support and the outer casing of a typical embodiment when configured as a discrete component. The common conductive coupling material or structures designated 798-GND'X', are applied to a extended, contiguous portion of said common shield pathway electrode extension 79-GNDA at electrode edges 805 of common pathway electrode material 799G of contained within structure 19900 on at least two sides as shown for this configuration as is depicted in FIG. 14 in detail for common electrode energy pathway 800/800-IMC, like that shown in FIG. 1, for example. Various insulating materials 801 also enable predetermined electrical conditioning functions to operate upon portions of propagating energies transporting along the various combinations of electrically opposing and paired differential conductive energy pathways that are within or utilizing the embodiment AOC.

Figure 15:
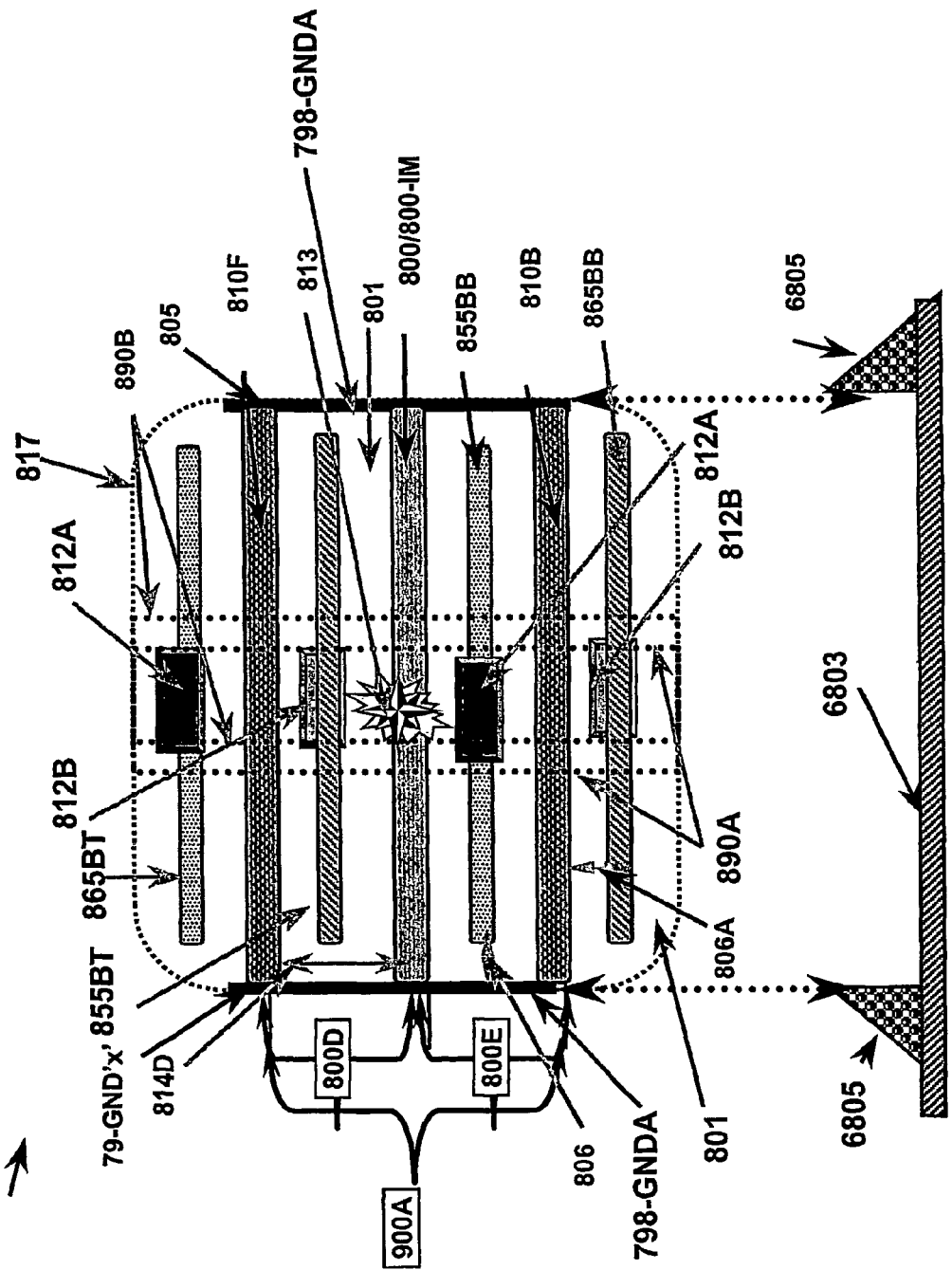
FIG. 15 shows an cross-section view of an embodiment 19905, which is an energy-conditioning arrangement in accordance with typical configurations presented, among others.

A further look at FIG. 14 reveals element type 798-GND'X' common, conductive attachment means, electrode and/or outer, energy pathway material portion, and/or outer conductive termination material portion will allow electrical and physical coupling of shielding, energy pathways, 850F/850F-IMO, 840F, 830F, 820F, 810F, 800/800-IMC, 810B, 820B, 830B, 840B and 850B/850B-IMO, respectively, to each other and to the same electrically conductive external common, conductive pathway or external common, conductive energy pathway or area 6803 as similarly depicted in FIG. 15. This new common energy pathway created is not of the differential pathways (not shown) and is utilized with a common, energy pathway, external (not shown) found beyond a typical embodiment AOC and a 7"XX"-GND'X'-type, common conductive attachment or coupling portion, such as an element type 798-GND'X' common, conductive attachment means, electrode and/or outer, energy pathway material portion, and/or outer conductive termination material portion.

A universal, multi-functional, common conductive shield structure like 19900 comprises multiple, stacked, common conductive cage-like structures 900A, 900B and 900C as depicted for example, and in turn, these cage-like structures 900A, 900B and 900C are comprised of multiple, stacked, common conductive cage-like 'containers' 800A, 800B, 800C, and 800D (each referred to generally as 800"X"), conductively coupled to one another and found in a generally parallel relationship. Each shielding, cage-like structure 800'X' comprises at least two shielding, energy pathways, such as is depicted in FIG. 14 with energy pathway stacking having 850F/800F-IMO, 840F, 830F, 820F, 810F, 800/800-IMC, 810B, 820B, 830B, 840B, and 850B/850B-IMO, for example. The number of stacked, common conductive cage-like structures 800'X' is not limited to the number shown herein, and can be almost any even integer in number. Thus the number of stacked, common conductive cage-like structures 900'X' is also not limited to the number shown herein and could be of an even or odd integer.

Although not shown, in other applications, each paired common conductive cage-like structure 800'X' sandwiches at least one conductive pathway electrode as previously described in relation to FIG. 1. The common conductive cage-like structures 800'X' are shown separately to emphasize the fact they are paired together and that almost any type of paired conductive pathways can be inserted within the respective common conductive cage like structures 800×. As such, the common conductive cage-like structures 800'X' have a universal application when paired together to create larger common conductive cage-like structures 900×, which are delineated as 900B, 900A and 900C, respectively and can be used in combination with paired conductive pathways in discrete, or non-discrete configurations such as, but not limited to, embedded within silicone or as part of a PCB, discreet component networks, and the like.

As has described in FIG. 14, the material having predetermined properties 801, conductively separates the individual shielding, electrodes 850F/850F-IMO, 840F, 830F, 820F, 810F, 800/800-IMC, 810B, 820B, 830B, 840B and 850B/850B-IMO, from the paired and same sized, electrically opposing, differential conductive pathways or conductive pathway electrodes (not shown) sandwiched therein and also conductively separates as well as shields the outer at least one pair of same sized, electrically opposing, differential conductive pathways.

In addition, as described In FIG. 14, a minimum of two cages, for example 800E and 800D, which make up larger cage 900A, are required to make up a multi-functional line-conditioning structure for use in almost all of the layered embodiments of almost any typical, new embodiment, among others. Accordingly, there are a minimum of two required common conductive cage-like structures 800×, as represented in FIG. 14 per each 900A, 900B, and 900C, respectively. The very basic shielding, manufacturing result of almost any sequence (excluding materials having predetermined properties 801, etc.) should appear as an shielding electrode embodiment structure that comprises a minimum of three conductively coupled, shielding electrode pathways stacked and further comprising, at least two sets of pairings of electrically opposing, differential electrode energy pathways, one set paired and internal within the minimum of three conductively coupled, shielding electrode pathways and one set paired and external to the minimum of three conductively coupled, shielding electrode pathways that can be conductively coupled an energized such that it will contain at least on portion of an operating, electrical circuit when energized.

In summary, generally, when a single, larger Grouped, cage-like-cage-like structure 900'X' is attached to a larger external, conducive area (not shown), the combination helps perform simultaneously, energized line conditioning and filtering functions upon the energy propagating along the various paired groupings of electrically opposing differential electrodes pathways (not shown), sandwiched within the cage-like structure 900'X' as well as conductively separating at least one pair of outer positioned, generally the same sized (there are exceptions to these special outer electrodes), electrically opposing, differential conductive pathways.

With almost all variations of the universal cage-like, shielding architecture with stacked, hierarchy progression is utilized as an interconnected shield structure comprising various individually layered shielding electrodes that share a common conductive coupling with one another and with an externally located energy pathway not of the differential conductive pathways.

Conductive common conductive coupling of the internally placed shielding electrodes with one another and to an external energy pathway not of the differential conductive pathways allows this third pathway to be used simultaneously as a separate energy pathway that can provide a reference voltage to the portions of circuitry contained within a typical embodiment. The third energy pathway utilized by the grouped electrode shielding pathways also simultaneously allows for development of a predetermined low impedance pathway utilized by the respective portions of the energies utilizing the differential pathways for propagation.

Differential propagation of energies through an typical embodiment allows for development of a device or embodiment that provides portions of the energies within an typical embodiment AOC to utilize portions of an typical embodiment in a complementary and balanced manner with respect to one another and to the benefit of the circuit system efficiency over that of similar prior art circuitry. This separate and commonly shared third pathway acts as not only a voltage divider for energies found in predetermined energized circuitry due to its actual physical and electrical placement locations in a normally larger energized circuitry. This physical and electrical location can best be described as a shielding electrode interpositioning and electrically common placement between at least a set of internal, paired and oppositely co-acting, differential conductive energy pathways and at least one pair of outer positioned, generally the same sized (there are exceptions to these special outer electrodes), electrically opposing, differential conductive pathways during energized operations.

The separate third pathway also becomes simultaneously utilized and shared as a common voltage reference node with respect to not only a circuit operating within an typical embodiment and/or its 813 AOC (not shown) but at least a set of paired and oppositely co-acting, differential conductive energy pathways and at least one pair of outer positioned, generally the same sized (there are exceptions to these special outer electrodes), electrically opposing, differential conductive pathways of the same circuit during energized operations, as well.

Almost any typical, new embodiment, among others, will also minimize or suppress unwanted energy parasitics originating from either of the paired and oppositely co-acting, differential conductive energy pathways conductively coupled to circuitry, respectively, from upsetting one another, portions of the propagating circuit energy or voltage balance within the AOC of an typical embodiment. Almost any typical, new embodiment, among others, will also minimize harmful and unwanted energy parasitics a subsequent conduction pathway of release for escaping in the form of common mode energies and the like back into the circuit system to detrimentally affect circuitry outside the AOC influence.

Referring now to FIG. 15, a break down of an overall structure 19905 into even smaller, paired, cage-like conductive structure portions can be done and reveals for example, various smaller grouping of overlapping conductive shield structures down to just 900A which is further comprised of shielding, electrode energy pathways 810F, 800/800-IMC, 810B individually of the shield species group will be almost always conductively combined and attached together with external common conductive material 6805 or industry standard connections means (not shown) to allow an externally located common conductive area or pathway 6803 to be utilized and which is not of the various external electrically opposing differential conductive energy pathways that can be found attached to or conductively coupled to an typical embodiment for a typical application for almost any typical, new embodiment, among others.

As seen in FIG. 15, to condition paired electrically opposing differential conductive bypass propagation mode energy pathways like inner 855BB and inner 855BT and the paired electrically opposing differential conductive bypass propagation mode energy pathways like outer 865BB and outer 865BT of FIG. 15, a larger stacking of containers 800'X' will comprise and/or can be characterized by common conductive universal shielding electrode structure 19905 or equivalent in such a manner that various shielding, electrodes could be added in a pre-determined fashion to form the paired 900'X' structures, which in turn form a larger overall shielding electrode structure similar to that shown in FIG. 14.

As long as, common conductive coupling material connections 798-GNDA can maintain some type of physical and electrical contact with a portion of common pathways electrode edge 805 directly and/or by the reach of a generally designated electrode extension portion such as, for example, an 79-GND'X', respectively, as shown in FIG. 15, a fully configured typical embodiment should work properly.

In FIG. 15, each and every paired electrically opposing differential conductive bypass propagation mode energy pathways like inner 855BB and inner 855BT of FIG. 15 are considered sandwiching the common interconnected conductive pathways each, respectively, such as various combinations of shielding, electrode pathways 810F, 800/800-IMC, 810B, which are sandwiching the 855BB and 855BT differential conductive pathways internally and which are themselves also set-back in a generally equal 806 positioning (see FIG. 1). In addition, each and every paired electrically opposing differential conductive bypass propagation mode energy pathways like outer 865BB and outer 865BT are also stacked yet separated from one another, conductively and electrically when in dynamic operation. Under these conditions, the conductive circuit when energized should exploit typical embodiment functions such as, noise or energy field cancellations or minimizations, filtering and surge suppressions in a complementary and common manner with respect to the internally positioned, shielding, electrode and material areas or deposits, as just discussed. As seen in FIG. 15, each container 800D and 800E can hold an equal number of same sized, differential electrodes such as inner 855BB and inner 855BT that are physically opposing one another to some degree within larger structure 900A, yet they are oriented and will operate in a generally physically and electrically parallel manner, respectively, that allows the various energy conditioning functions to be maintained.

The conductive and grouped, cage-like shield structure 900A with co-acting 800D and 800E individual shield-like structures, become one electrically, at energization when energized within a circuit and attached to the same external common conductive path area 6803 by way of electrode extensions 79-GNDA to externally applied common conductive material for electrical connections that are attached to common conductive area 6803. This is done by conductive solder material 6805 or other normal coupling means for conductive attachments or known industry methods like resistive fits, or various soldering methods known methods (not shown) and by utilizing internal electrode extensions 79-GNDA and almost any possible means of commonly acceptable industry attachment methods (not shown) such as reflux solder, conductive epoxies and adhesives and the like (but not shown).

As a result, almost any manufacturing sequence as follows: (excluding materials having predetermined properties 801, etc.) a differential conductive pathway 865BB, then a shielding, energy pathway 810B, internally positioned differential conductive pathway 855BB and then central and commonly shared shielding, energy pathway electrode 800/800-IMC, followed by internal differential conductive pathway 855BT, then shielding, energy pathway 810F and then outer electrically opposing differential conductive pathway 865BT a voltage reference pathway will result when a completed structure for this example is energized in FIG. 15.

Referring more to FIG. 15, portions comprising 810F, 800/800-IMC, 810B are now shown comprising part of embodiment 19905 of FIG. 15. Certain common shield electrodes are configured as shielding electrodes comprising two 798-GNDA electrode extensions (shown in detail in FIG. 1) and in turn are combined with the other elements of 19905 embodiment will be almost always placed in combination to form an embodiment with two pairs of paired electrically opposing differential conductive bypass energy pathways comprising two sub-sets of paired energy pathways, inner 855BT and outer 865BT and inner 855BB and outer 865BB respectively and are also considered paired bypass conductive pathway elements sharing a shielding, electrode energy pathway or structure 900A.

FIG. 15 depicts various elements of an attached cut-away version of typical embodiment 19905 and is shown in a cut-away view. The concept of the a universal grouped, cage-like shield architecture 900A with stacked conductive hierarchy progression comprising separate and circuitry for energies propagating simultaneous along paired and electrically differential pathways that utilize separate operating bypass energy propagation mode is showing structure 19905 comprises stacked, common conductive cage-like structure 900A depicted and which in turn is comprised of multiple, stacked, common conductive cage-like structures or containers 800D and 800E (each referred to generally as 800"X"), in a generally parallel, but interconnected, conductive shielding electrode relationship. Each common conductive container 800D and 800E comprises at least two shielding, energy pathway electrodes, 810F, 800/800-IMC, 810B. The number of stacked, common conductive interconnected shielding electrode cage-like structures $800x$ is and is normally of an even integer. Thus, the number of stacked, common conductive cage-like structures 900'X' is also not limited to the number shown herein and is normally of an even or an odd integer.

Also shown, in FIG. 15, is that each paired common conductive cage-like structure 800'X' sandwiches at least one conductive differential bypass mode pathway electrode that comprise and/or can be characterized by two separately operating pairs of two each, of electrically opposing pairs of same sized conductive differential bypass mode pathway electrodes. The stacked, common conductive interconnected shielding electrode cage-like structures 800'X' almost all can be used in combination with separate, but paired external differential conductive energy pathways in discrete, or non-discrete configurations such as, but not limited to, a discrete stand-alone component as shown in FIG. 15, or others not shown; such as but not limited to a component combination, discrete and non-discrete embedding within silicone IC's, interposers, modules, substrates or as part of a PCB, energy conditioning networks, and the like.

The shielding, energy pathway electrodes 810F, 800/800-IMC, and 810B are all conductively interconnected as shown at 79-GNDA(s) which provide conductive coupling point(s) to external common conductive energy pathway or area 6803 through solder material 6805 or most any other attachment means known within the state of the art. Each shielding, electrode 810F, 800/800-IMC, and 810B, is formed on material having predetermined properties 801 and reveal side bands only comprised of material having predetermined properties 801 in place of energy pathway material 799G.

It should also be noted as shown in FIG. 15 that the paired set electrically opposing differential energy pathways depicted are sets or pairs, co-sized and near completely lapping one another's principal electrode surface areas, although separated by a larger shielding, electrode and materials having predetermined properties 801. They are complementary paired for conductive attachment for electrically opposing operations (when energized). These co-sized, complementary paired electrically differential (in operation) electrode or energy pathways are always physically separated from one another as well as, electrically located on the opposite sides respectively, the electrical charge of one of two principal conductive portions of a shielding, electrode energy pathway with respect to each other. Since all of the electrodes found are generally planar in shape and appearance, aligned respectively per their homogeneous groups, symmetry develops at many levels within the part that is efficiently utilized by the various portions of energies propagating within.

Conductive coupling of the joined common conductive and enveloping, multiple common shield electrode pathways 810F, 800/800-IMC, and 810B, respectively with a common centrally located shielding, energy pathway 800/800-IMC will almost always become like the extension of external common conductive element or external common conductive energy pathway or area 6803, as shown in FIG. 15 Multiple common shield electrode pathways 810F, 800/800-IMC, and 810B will be almost always be interposed in such a multiple parallel manner between and to provide sandwiching of differential electrode conductors inner 855BT and inner 855BB while also themselves being sandwiched by outer positioned, 865BB and 865BT while still maintaining the condition that common shield electrode pathways 810F, 800/800-IMC, and 810B will have a minimal of 814C distance separation or 'loop area' with respect to the complimentary, paired and electrically opposing differential electrodes 855BB, 865BB and 855BT and 865BT within materials having predetermined properties 801.

External, conducive element like 798-GNDA, shown in FIG. 15 will aid in performance of the electrostatic shielding functions (not shown) performed by common shield electrode pathways 810F, 800/800-IMC, and 810B, among others. The structure also facilitates an energized combination as just described that will allow enhancement of the external common conductive energy pathway or area 6803 to aid the interconnected shielding, electrodes within embodiment 19905 to assist in providing efficient, simultaneous conditioning upon portions of energies propagating on or along said portions of assembly 19905s" differential electrode conductors 855BB, 865BB and 855BT and 865BT energy pathways as portions of these conductive pathways within 19905 are externally conductively coupled by conductive extensions 812A and 812B structures which attach to conductive coupling means 890B and 891B for the circuit grouping comprising paired differential electrodes 855BB, 855BT, 865BB and 865BT. The internal and external parallel arrangement groupings of a combined interconnected shielding, electrodes 810F, 800/800-IMC, and 810B will also help to cancel or suppress unwanted parasitics and electromagnetic emissions that can escape from or enter upon portions of for the circuit grouping comprising paired differential electrodes inner 855BB and inner 855BT and portions of the circuit grouping comprising paired differential electrodes outer 865BT and outer 865BT through the AOC which are respectively used by portions of energies as they propagate along these disclosed conductive pathways to active assembly load(s) (not shown).

The universal shielding electrode structure will also facilitate availability to portions of propagating circuit energies (not shown) the same type of physical shielding electrode structure 19905 of FIG. 15 that allows for development of a common low impedance energy pathway (not shown) and reference image (not shown) which are not of the differential pathways for portions of the sub-circuit energy pathways to work harmoniously.

In one instant, and simultaneously within the same time, portions of propagating circuit energies will be almost always provided with a energy blocking function of high impedance in one instant for some other opposing and shielded separated portions of energies propagating contained within portions of the AOC with respect to the very same third energy pathway and reference image, while in the very same instant this high impedance-low impedance switching phenomena is occurring in yet a diametrically opposing manner, at the same instant, and occurring for energies propagating relative to the portions of energies located oppositely to one another in a complementary manner, but along opposite sides of the same shared larger universal shielding electrode structure in an electrically harmonious manner.

This would include for example, a plurality of generally planar layers designated as species as shown in FIG. 14 and FIG. 15 for embodiment 19905. These generally planar layers shown in FIG. 15 comprise and/or can be characterized by for example, a ceramic material having predetermined properties 801, with a 799G conductive material applied or deposited during manufacturing. The principal electrode surfaces of the shielding, electrode layers (too numerous to number) are situated generally parallel to the principal material having predetermined properties 801 surfaces (both not shown in FIG. 15) of the embodiment layering 19905.

As shown in FIG. 15, in order to allow for the best possible magnetic field coupling cancellation between the various opposing differential energy pathways within universal grouped, cage-like shield architecture with stacked conductive hierarchy progression, generally, paired and only a minimal distance from one another should separate operationally opposing differential conductors, as a rule. There can be certain exceptions. However, by operating in a generally opposing or out of phase fashion, mutual coupling of the oppositely positioned pair of energy pathways, 855BB and 865BB, along with 855BT and 865BT enhances mutual cancellation of their respectively opposing magnetic fields while co-acting simultaneously with one another in utilization of the electrostatic or Faraday shielding effects that are also occurring to portions of energies propagating along the various circuitry portions of the same, oppositely positioned pair of energy pathways within an typical embodiment AOC.

It should also be noted that by positioning the two differential conductive pathways as just described with the generally equally spacing of the deposited or applied materials having predetermined properties 801 or insulating medium material, with the predetermined elements of the universal shielding electrode architecture, the resulting typical embodiment structure will yield beneficial energy conditioning to portions of circuit energies located along the differential conductive pathways within the AOC as just described. The paired and opposing differential conductive pathways as just described, also maintain an energized relationship that is electrically complementary in some ways yet also simultaneously electrically opposite to one another, regardless of the generalized direction of portions of the propagating energies residing along each of the respectively paired differential energy pathways 855BB and 865BB, along with 855BT and 865BT.

Such a configuration as shown in FIG. 15 comprising for example 855BB and 865BB, along with 855BT and 865BT, respectively will yield one of the two respective differential energy pathways each, 855BT and 865BT electrically located as energy pathways that are in this case, electrically located between a energy source and a energy-utilizing load separated by the 800-IMC central common conductive shield element and others, while the remaining respective differential energy pathways, 855BB and 865BB will also be considered electrically located as energy pathways positioned between an energy-utilizing load that is conductively coupled back to it's energy source originator that initiated portions in some form or another of the portions of energies propagating along with a defined circuitry that could be considered from the source of the energy propagations that began at the initial time of circuit energization. That is, one of two respective, adjacent but shielded and separated differential energy pathways or differential electrodes 855B and 865BB for example exist in an energized state in a mutually co-active relationship to one another but between the shielded architecture both physically and electrically yet the actual physical separations maintained are in a range anywhere from between less than 50 mms to some smaller number that is still larger than (>)0 mms or greater, as long each handles propagation of portions of circuit energies with respect to the other.

Conductive coupling of the joined common conductive and enveloping, multiple common shield pathways, respectively with a common centrally located shielding, energy pathway 800'X'-IMC will almost always become like the extension of external, conducive element 6803, as shown in FIG. 15, for example, and will almost always be interposed in such a multiple parallel manner that said common conductive elements will almost always have microns of distance separation or 'loop area' with respect to the complimentary, phased differential electrodes that are sandwiched themselves and yet are separated from the extension of external common conductive energy pathway or area 6803, shown in FIG. 15, for example by a distance comprising a materials having predetermined properties 801 or insulating medium.

This enables the electrical or conductive extension of external common conductive energy pathway or area 6803 shown in FIG. 15 to aid in performance of the electrostatic shielding functions, among others, that the energized combination as just described will almost always enhance and produce efficient, simultaneous conditioning upon the energy propagating on or along said portions of shielding electrode assembly 900A's outer differential conductors 865BB and 865BT. The internal and external parallel arrangement groupings of a combined common conductive 900A will almost always also cancel or suppress unwanted parasitics and electromagnetic emissions that can escape from or enter upon portions of said differential conductors differential conductors 855BT and 855BB used by said portions of energy as it propagates along a conductive pathways (not shown) to active assembly load(s) not shown in FIG. 15.

Note that although not shown at all, a variant embodiment(s) can be derived by way of an 911'X' extension portion(s) or even direct conductive coupling of any portion of the outer, partially shielded, energy pathway 865BT and 865BB, respectively to their respective 912"X" conductive portions or conductive termination portions or conductive coupling means (all not shown), although conductively isolated, the various complementary energy pathways 865BT and 865BB, respectively, could also be selectively timed to be switched 'on' bias and 'off' bias depending upon a specific application. Thus, an energized, bias activation and/or bias non-activation for a typical, new embodiments could also change the behavior and electrical performance characteristics normally expected from non-configured, non-bias operable embodiments for example, as well as the various energy conditioning effects of portions of energies utilizing the separate and contained circuit pathways within the AOC of a typical, new embodiment or device. It is important to note that this type of energy pathway arrangement utilizing for example, 911"X" extension portions is not relegated to just the outer, partially shielded, energy pathway 865BT and 865BB, and it is contemplated that almost any predetermined energized, bias activation of the shielded, energy pathways through the utilization of coupling isolated outer electrode portions or outer energy pathway portions like a 912"X" is fully contemplated by the applicant.

Certain energy pathways like those shown and marked (#-IM'X') are additionally placed shielding energy pathways located outside and sandwiching in close proximity the balance of the energy pathways of a typical, new embodiment, are for an additional purpose other than the purpose of adding capacitance. Shielding arrangements having an odd integer number of equal-sized and equal shaped, electrodes can also include as well, any optional shield electrodes (not always shown) for image plane shield electrodes designated –IMI"X" and/or –IMO"X", disclosed earlier. Furthermore, it is now disclosed that a cage-like effect or electrostatic shielding effect function with electrically charged containment of internally generated energy parasitics shielded from the complementary energy pathway main-body portion 80*s*. Electrostatic shielding provides a protection to prevent escaping of internally generated energy parasitics to a complementary conductive energy pathway. Electrostatic shielding function also aids in a minimization of energy parasitics attributed to the energized complementary energy pathways by the almost total immuring or almost total physical shielding envelopment of inset complementary circuit portions within the area, main-body electrode portion 81*s*, or portion footprint of a sandwiching shielding energy pathway(s).

The interposition of conductive and non-conductive material portions that include but is not limited by such shielding as conductive material for electrodes that are shielding electrodes or material 801 shielding functions that are utilized despite a very small distance of separation of oppositely phased electrically complementary operations that are contained within common energy pathways in a controlled manner. Optimal operations occur when coupling to a common conductive portion has been made such that simultaneously, energy portions utilizing various electrically opposing equally-sized energy pathways opposites are operable interact in an electrically parallel manner balanced between the opposite sides of a common conductive shield structure.

Exceptional mutual energy flux cancellation of various portions of energy propagating in a manner along paired and electrically opposing conductive energy pathways which are spaced-apart from one another by a very small distance(s) of either or both direct and indirect separation (in-direct=loop area) of oppositely phased electrically complementary operations with a simultaneous stray parasitic suppression and containment functions operating in tandem enhance functionality of a typical, new embodiment. H-field field flux propagates by the right-hand rule (Ampere's law) along a transmission pathway, trace, line or conductor or conductive layer portion. Bring an energy-in pathway and an energy-return pathway very close to each other, almost directly adjacent and parallel with minimal separation by only at least two portions of material 801 and a shielding energy pathway, corresponding complementary energy field portions will be combined for mutual cancellation or minimization of the separate individual effect. The closer the complementary symmetrical pathways are brought together, the better the mutual cancellation effect.

In most embodiments whether shown or not, the number of pathways, both common energy pathway electrodes and equally-sized differentially charged bypass and/or feedthru conductive energy pathway electrodes, can be multiplied in a predetermined manner to create a number of conductive energy pathway element combinations in a generally physical parallel relationship that also be considered electrically parallel in relationship with respect to these same elements physically as well as electrically parallel with respect to energized positioning between a circuit energy source(s) and circuit energy-utilizing load(s). This configuration will also thereby add to create increased capacitance values.

A common "0" voltage or simple common voltage reference is created for complementary circuit systems that share the shielding, energy pathways or electrodes when they are and are not coupled to a common conductive portion beyond the shielding, energy pathway or electrodes. Additional shielding energy pathways (almost, but not totally), surrounding the combination of a shared centrally positioned shielding energy can be employed to provide an increased inherent ground and optimized cage-like or cage-like electrostatic shielding function along with an increased surge dissipation area or portion. It is also fully contemplated by the applicant that a plurality of isolated circuits portions can utilize jointly shared relative, electrode shielding grouping that is conductively coupled to the same common energy pathway to share and provide a common voltage and/or circuit voltage reference between the at least two isolated sources and the at least isolated two loads. Additional shielding common conductors can be employed with almost any embodiment, among others to provide an increased common pathway condition of low impedance for both and/or multiple circuits either shown and is fully contemplated by applicant.

It should also be noted specifically that sustained, electrostatic shielding becomes an energized-only shielding function when a typical embodiment is energized for a period of time. Thus, thus almost any new typical embodiment and/or new typical embodiment circuit arrangement, multiple or not, is operable to be utilized for sustained, electrostatic shielding of energy propagations.

Thus, discrete or non-discreet typical, new embodiment utilizing a common conductive shield structure and outer conductive attachment elements as disclosed, and utilizing materials having predetermined properties 801*s* that have been categorized primarily for a certain electrical conditioning function or results that includes almost any possible layered application that uses non-discreet capacitive or inductive structures or electrodes that can incorporate a variation of an embodiment within a manufactured non-discrete integrated circuit die and the like, for example, or a super capacitor application or even an nano-sized energy-conditioning structure. Additionally, almost any shape, thickness and/or size may be built of a specific embodiment, among others and varied depending on the electrical application. A typical embodiment, shown or not could easily be fabricated directly and incorporated into integrated circuit microprocessor circuitry or chip wafers. Integrated circuits are already being made and integrated with passive conditioners etched within the die area, which allows this new architecture, among others to readily be incorporated with that technology, as it is available.

Figure 16:
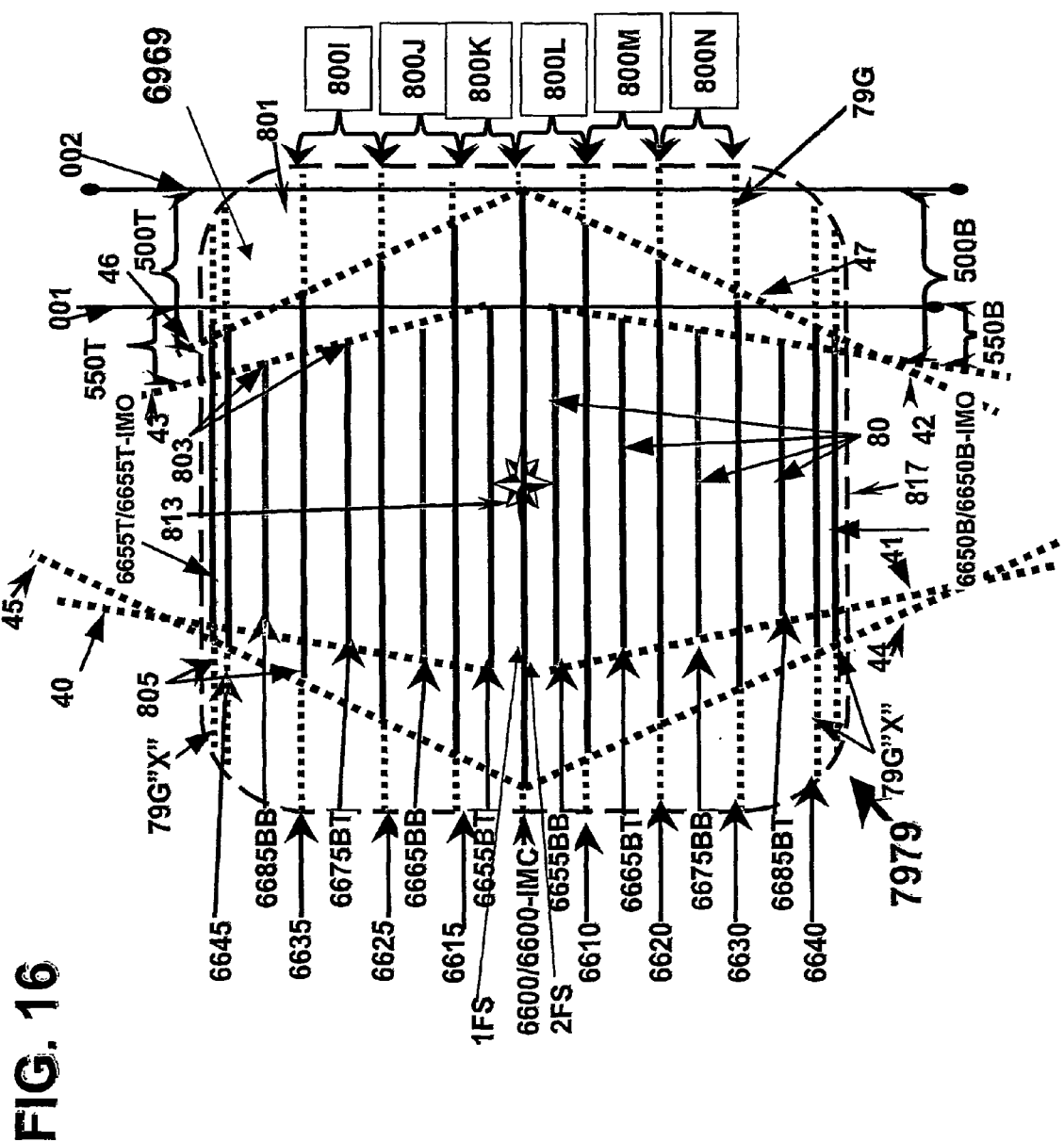
FIG. 16 shows portion of an alternate embodiment 7979 in a cross-sectional view that comprises a 6969 example arrangement of various complementary shielded, energy pathways and shielding, energy pathways configured in accordance with the present configurations, among others.

Before turning to FIG. 16, a complementary-symmetrical and balanced energy pathway arrangement idea using relative symmetry balancing of energy pathways and energy pathway pluralities is discussed As long as the various relative pairings of the complementary energy pathways (not necessarily shown) are complementary-symmetrically paired for predetermined alignment, either as superposed and/or complementary aligned in reverse-mirror like manner, and as long as the various pathways are maintained operable relative to the shielding, energy pathways, as well as any predetermined distance relationships, element offsets, and/or setbacks, a typical new embodiment (as shown or not) or as generally depicted in FIG. 16, for example, a typical new embodiment will normally be operable and/or at the very least, practicable to be operable for predetermined electrical conditioning with respect to various predetermined, energy conditioning functions required by the user.

All functions occurring are actual dynamic performances dependent of course, in-part, upon a final circuit system(s) coupling(s) and/or predetermined arrangement(s) of a specific, predetermined, circuit system energy conditioning requirement that might need to be performed.

Relative balancing, and/or relative pairing, and/or (in some cases) relative complementary pairing and/or (other examples) reverse, "mirror-like" element match-off(s) and/or relative and reverse oriented, shielded, complementary pair(s) energy pathway balanced arrangement(s), for example, will also be viable as shielded energy pathways as long as an electrostatic shielding function (not shown) of a universal conductive shielding, energy pathway arrangement and/or architecture that has a stacked conductive progression that is also comprising balanced energy pathway arrangement(s) is operable for allowing for dynamically opposing and/or complementary energy propagations (relative to one another). This means that a typical new amalgam (not necessarily, shown) is not compromised by lack of a predetermined, relative physical positioning of predetermined energy pathways which are in-turn, relative to one another such that this that a predetermined, relative physical positioning of predetermined energy pathways would prevent dynamic electrostatic shielding from occurring during dynamic operation.

Relative balancing, and/or relative pairing, and/or (in some cases) relative complementary pairing and/or (other examples) reverse, "mirror-like" element match-off(s) and/or relative and reverse oriented, shielded, complementary pair(s) energy pathway balanced arrangement(s), for example, is normally included for typical new embodiment as generally depicted in FIG. 16, for example. Despite a variation in appearance relative to other co-owned and co-pending disclosures, the utility of the shielding, conductive energy pathways allow many, many possible variants of a typical new embodiment energy conditioner, a few of which will now be disclosed.

A configuration of a variant arrangement (not necessarily, shown) for one example, utilizes at least three isolated, pluralities of energy pathways including a first plurality of energy pathways which can also be a plurality of shield electrodes and/or shielding, energy pathways; a second plurality of energy pathways, which can also be a first plurality of shielded, complementary electrodes and/or shielded, (complementary) energy pathways; and a third plurality of energy pathways, which can also be a second plurality of shielded, complementary electrodes and/or shielded, (complementary) energy pathways.

A variant energy pathway arrangement (not necessarily, shown) can also be operable as a multi-functional energy pathway arrangement(s) and/or conditioner(s) of single and/or multiple circuit energies that are utilizing one or more than one of the various combinations of pluralities that are arranged by predetermined manner with other elements for a another variation of the new family of discrete and/or non-discrete, multi-functional energy pathway arrangement(s), conditioners of circuit energy and/or multi-functional energy conditioners.

Returning specifically to FIG. 16, which shows a typical example of a symmetrical and balanced predetermined and stacked energy pathway arrangement designated 6969. A configuration showing a size change externally to the physical size and/or form factor of an overall discrete component as noted at the edge 817 of a discrete component and along to the surface of the substance and/or material with predetermined properties 801 was disclosed in an earlier, co-owned, U.S. Provisional Application No. 60/255,818, filed Dec. 15, 2000 of which portions is incorporated herein by reference.

As shown in component 7979, an arrangement 6969 is utilizing a variation of the co-owned, concept of two pluralities of energy pathways (one plurality of energy pathways is evenly divided to create a total of three pluralities of energy pathways for a typical arrangement) that are electrically isolated (each plurality) from one another within an electronic discrete or non-discrete component to expand a variation of the electrically isolated, electrode pluralities concept to create another variant of discrete or non-discrete, multi-functional, energy pathway arrangements, conditioners of circuit(s) energy and multi-functional energy conditioners already disclosed.

As noted earlier, a typical, new energy pathway arrangement normally comprises at least two pluralities of energy pathways, with one plurality of energy pathways considered a plurality of shielding, energy pathways, and the remaining plurality of energy pathways considered a plurality of shielded, energy pathways. In all cases, the total amalgamation of predetermined energy pathway portions with other material elements and physical arrangement concepts can be formed to create a new and distinct energy pathway arrangement, and in this case, it will be labeled energy pathway arrangement example 6969.

It should be noted that at least three pluralities of energy pathways could be called out. A first plurality of energy pathways of an energy pathway arrangement example 6969 is shown with common electrode members 6645, 6635, 6625, and 6615, 6600/6600-IMC, 6610, 6620, 6630, and 6640, all of which comprise a main-body electrode portion 81. These shielding, energy pathway members of the first plurality of energy pathways are considered the plurality of shielding, energy pathways of an energy pathway arrangement, example 6969.

The other plurality of energy pathways that are considered to be the plurality of shielded, energy pathways like shown in FIG. 16 and are comprising energy pathways 6685BB, 6685BT, 6675BB, 6675BT, 6665BB, 6665BT, 6655BB, 6655BT. This plurality of energy pathways will be further divided into two pluralities of shielded, energy pathways comprising the same even, integer number energy pathways so that corresponding positioned energy pathways of the arrangement will be subsequently considered paired.

The difference noted to subdivide the plurality of shielded, energy pathways of energy pathway arrangement example 6969 into what will be considered a second plurality of energy pathways of energy pathway arrangement 6969 with energy pathways, 6685BB, 6665BB, 6655BB, and 6675BB, and a third plurality of energy pathways of energy pathway arrangement 6969 with energy pathways, 6675BT, 6655BT, 6665BT, and 6685BT is made.

A typical, new energy pathway arrangement can be manufactured and positioned in a predetermined orientation of the two pluralities of energy pathways comprising the same even integer number energy pathways and the first plurality of energy pathways of energy pathway arrangement example 6969, which are the shielding, energy pathways, for example. The two pluralities of energy pathways comprising the same even integer number energy pathways are also positioned and arranged to be relative to one another as a plurality and to be relative to one each other in a smaller arrangement between two individual, but corresponding energy pathways, (one from each of the two pluralities of energy pathways that were divided of the plurality of shielded, energy pathways) within energy pathway arrangement example 6969. These two pluralities of energy pathways will also be considered a first and a second plurality of shielded, (complementary) energy pathways of energy pathway arrangement example 6969, respectively.

Thus, a first half of the positioned, same even, integer number of shielded, energy pathways that comprise a portion of the plurality of shielded, energy pathways is said to be complementary relative to the remaining, second half of the positioned same even, integer number of shielded, energy pathways that comprise a portion of the plurality of shielded, energy pathways. Selective positioning and orientation of the single plurality of energy pathways that are shielded, in fact now creates, two distinct pluralities of energy pathways that are shielded from one another by the plurality of shielding, energy pathways of energy pathway arrangement example 6969 and operable for interactive dynamic differential or complementary, electrical operations relative to each other as two pluralities of energy pathways that are needed together in a predetermined configuration or energy pathway arrangement for conditioning portions of energy that are propagating or moving along portions of energy pathway arrangement example 6969 in many directions.

Portions of energy that are propagating along portions of energy pathway arrangement example 6969 can be divided to be moving along each of the two distinct pluralities of energy pathways that are electrically isolated from one another, or portions of energy they can be found separated by the plurality of shielding, energy pathways of energy pathway arrangement example 6969 and yet they will also be considered adjacent to one another and so close that these portions of energy can be within a mutual influencing range of one another in many cases. This is due to the selective coupling of each conductively coupled plurality of energy pathways to portions of circuitry or circuit pathways as well as non-circuit conductive portions.

The first half of the positioned, same even integer number energy pathways that comprise a portion of the plurality of shielded, energy pathways will allow propagation of portions of energies said to be complementary relative to other portions of energies found along the remaining, second half of the differently positioned but same even integer number energy pathways that also make up a portion of the plurality of shielded, energy pathways. This configuration of an arrangement allows dynamically operating portions of discrete electronic component 7979 to condition energy of at least one circuit in many ways including filtering, bypassing, surge absorption, as well as for decoupling energy portions serving a load from an energy source and allowing for what appears to be to a user what is considered to be an uninterrupted energy supply to a load despite an actual decoupling of the energy for a fraction of time. This actual decoupling of the energy for a fraction of time can be considered up to the date of this filing priority to be almost impossible to accurately measure due to test instrument limitations.

A typical embodiment like FIG. 16, shown for example, comprises a pluralities of both shielding and the shielded, energy pathways which are decreasing (or in other embodiments increasing) in overall size in a predetermined graduation (and/or stepwise) form both directions outward from the common, symmetrically between positions apart from the centrally positioned, shielding, energy pathway 8"XX"/

8"XX"-IMC for example. Note a centrally positioned, shielding, energy pathway is normally serving as a central balancing point or fulcrum/divider of arrangement symmetry for a typical embodiment. One should also note that shielding electrode containers 800I, 800J, 800K, 800L, 800M, and 800N still appear to almost totally envelope respective, complementary energy pathways to create the groupings of paired conductive shield-like containers 800'X' that will again aid in performing electrostatic shielding function as well as allowing for portions of energy propagation relative to an externally coupled, common conductive area or common energy pathway to allow for creation of voltage image reference that also aids dynamically operating circuit portion(s) comprising a typical embodiment. However, also note that shielding electrode and/or shielding, conductive pathway containers, 800I, 800J, 800K, 800L, 800M, and 800N, respectively are depicted as decreasing (or in other embodiments increasing) in overall relative proportional sizing in an equally sized-paring of 800"X" containers that are also in a symmetrical and balanced predetermined graduation (and/or stepwise) sequence formed in both directions, outward from the centrally positioned, and shielding, energy pathway 6600/6600-IMC for example FIG. 14. Thus, 800K and 800L are uniform but complementary and symmetrically arranged with the centrally positioned, and shielding, energy pathway 6600/6600-IMC found as part of both 800K and 800L to begin a balanced distribution of the 800"X" containers. Thus, again 800J and 800M are paired, as well as 800I and 800N are also complementary paired, and so forth. No longer are the 800"X" conductive containers uniform in size and shape, but are divided evenly in a symmetrical, and sandwiching positioning arrangement scheme of proportionally sized pairings, as depicted in FIG. 16.

All pluralities of common, energy pathways, shielded or not of energy pathway arrangement example 6969 are electrically isolated from one another. Each plurality of energy pathways of the three pluralities of energy pathways is grouping of common, energy pathways members that are conductively coupled to one another and are of substantially the same shape (per each main-body electrode portion 80/81 of respective plurality of energy pathways of the at least three pluralities of energy pathways). A common, electrode member of each plurality of energy pathways of the three pluralities of energy pathways is also Individually electrically isolated from every other one common, electrode member of any one of the at least two remaining pluralities of energy pathways of energy pathway arrangement example 6969.

Electrode 6600/6600-IMC of the first plurality of energy pathways of energy pathway arrangement example 6969 can be considered for this example to be both, the central electrode of energy pathway arrangement example 6969, and the central electrode of the first plurality of energy pathways of energy pathway arrangement example 6969. Commonly coupled, electrode members of the first plurality of energy pathways normally will be shielding the electrode members of both a second plurality of energy pathways of energy pathway arrangement example 6969 and a third plurality of energy pathways of energy pathway arrangement example 6969.

The first plurality of energy pathways can also be considered a plurality of shielding, energy pathways because in substantially all configurations, these shielding, energy pathways each possess as a main-body electrode portion 81 that is normally larger than any one single main-body electrode portion 80 of any one electrode of either the second plurality of energy pathways or the third plurality of energy pathways that is directly neighboring the respective main-body electrode portion 81 in question, as both pluralities of energy pathway are depicted in arrangement example 6969. There is an exception to this in the case; this is where the plurality of shielding, energy pathways are part of a graduated or stepped-sizing in a growing, outward configuration that is not shown in FIG. 16, but fully contemplated by the applicant.

This does not mean in all cases that the shielding, energy pathway is always larger than the shielded, energy pathway, this condition is only for localized 'sandwiched' situations, for example, shielded, energy pathway 6655BB of the second plurality of energy pathways of energy pathway arrangement example 6969 is not sandwiched by (2) shielding, energy pathways 6630 and 6640 within energy pathway arrangement. This condition is not a localized 'sandwiched' situation, and thus, shielded, energy pathway 6655BB could be larger than shielding, energy pathway 6640, however shielded, energy pathway 6655BB is still shielded by larger shielding, energy pathways and their electrode main-body portion 81's of 6600/6600-IMC and 6610 as shown in the configuration. Because component 7979 is showing that all three pluralities of energy pathways are using a 'stepped sized' configuration, this axiom of shielding-to-shielded size relationship is noted.

Note that in other variants of 6969, a shielding/shielded, energy pathway configuration for example, can be made where the shielding plurality is not using a 'stepped sized' configuration for the plurality of shielding, energy pathways, (not shown) and would be found as a plurality of superposed, uniformly configured plurality of shielding, energy pathways, with each of the shielding, energy pathways of this variant of a plurality of shielding, energy pathways possessing a uniform, (within the plurality) main-body electrode portion 81 that is equally larger than any one, single main-body electrode portion 80 of any one electrode of either the second plurality of energy pathways or the third plurality of energy pathways. Thus, only the complementary energy pathway pairings would use a graduating (smaller or larger) 'stepped sized' configuration and not the plurality of shielding, and physically uniform energy pathways for this alternate variant of the arrangement as just set forth.

It should be noted that sandwiching outer, energy pathways or sandwiching outer shield electrodes 6650F/6650F-IMO and 6650/6650-IMO as shown in FIG. 14, but not shown in FIG. 16 are outer, sandwiching shield electrodes and/or outer, sandwiching shielding energy pathways 6650F/6650F-IMO and 6650/6650-IMO which are always contemplated for use but are optional, depending upon needs of a user and/or a manufacturer. Since the multi-functional, energy pathway arrangement example 6969 comprises at least the two paired pluralities of energy pathways that are shielded, it should be noted that these two paired pluralities are complementary relative to each other, both in corresponding and relative positioning as pluralities of energy pathways that are shielded, as well as complementary relative to each other during electrical operation (at the same point in time) within electronic component 7979.

However, individual energy pathway pairs that comprise at least the two paired pluralities of energy pathways that are shielded and are not necessarily adjacent to one another (separated by at least one shielding, energy pathway and/or member of the first plurality of energy pathways.) For example, energy pathway arrangement example 6969 depicts a second plurality of energy pathways of energy pathway arrangement, 6685BB, 6665BB, 6655BB, and 6675BB. Each complementary and/or shielded, (complementary) energy pathway of the second plurality of energy pathways of a typical new, energy pathway arrangement will of always have a corresponding, energy pathway member of a third plurality of energy pathways of a typical new, energy pathway arrangement as its complementary mate. It is logical then to say energy pathway members of the third plurality of energy pathways, 6675BT, 6655BT, 6665BT, and 6685BT are also energy pathway members of a second plurality of (complementary) energy pathways of the energy pathway arrangement and that each energy pathway of the third plurality of energy pathways of the energy pathway arrangement will of always have a corresponding, energy pathway member of the second plurality of energy pathways of the energy pathway arrangement as its complementary mate, as well.

One will note that normally, (appearing from the centrally positioned, and shielding, energy pathway 6600/6600-IMC out,) on either side of centrally positioned, and shielding, energy pathway 6600/6600-IMC, one will find sandwiching the larger, center positioned and shielding, energy pathway 6600/6600-IMC, then a complementary, same-sized and same-shaped, pair of shielded, (complementary) energy pathways comprising 6655BB and 6655BT. Shielded, (complementary) energy pathways, 6655BB, and 6655BT are electrically isolated from each other and are separated by at least a substance and/or material with predetermined properties 801 and the shielding, centrally positioned, energy pathway 6600/6600-IMC. This is normally a situation where paired, corresponding shielded, energy pathways create a situation of a directly adjacent, pair of shielded, (complementary) energy pathways from the at least one complementary pairing of individual energy pathways (or just, conductors) of the two pluralities of same even integer number energy pathways that comprise the single plurality of shielded, energy pathways.

In every other shielded, (complementary) energy pathway pairing, uniformly configured but complementary positioned shielded, energy pathway pairs, like 6665BB and 6665BT, for example, are not directly adjacent to one another within arrangement 6969. In this case, this shielded, (complementary) energy pathway pair 6665BB and 6665BT are still maintaining electrically isolated relationships relative to each other and they are still have maintain at least a substance and/or material with predetermined properties 801 and the shielding, centrally positioned, energy pathway 6600/6600-IMC (as well as others, in other cases) between them.

This shielded, (complementary) energy pathway pair is also in a complementary, relative positioning relationship to each other still corresponding and relative in their respective orientation and position to each other, but also continuing the two equal, spaced-apart distances each finds itself from one side (either a 1FS and/or a 2FS which are at least two, opposite facing sides of any typical energy pathway) of the larger, shielding, centrally positioned, energy pathway 6600/6600-IMC of a typical new, energy pathway arrangement. Thus, these differential, but paired energy pathways will also operate electrically opposite and/or electrically complementary relative to each other during electrical operation (at the same point in time) within electronic component 7979 but also from a predetermined distance relationship from one another.

One of the novel situations created is that a paired and corresponding energy pathways of substantially the same size and shape of the second plurality of energy pathways and a paired and corresponding energy pathway of substantially the same size and shape of the third plurality of energy pathways, will now not normally be neighboring one another. This is with the exception in almost any configuration for any first pairing of shielded, (complementary) energy pathways, like 6655BB, and 6655BT, for example, which are found to be uniform to one another as they sandwich each respective relative side of a shielding, centrally positioned, energy pathway, as shown positioned like 6600/6600-IMC, as shown in example 6969.

Any non-corresponding energy pathway members of shielded paired, second and third pluralities of energy pathways may be substantially of the same shape, but they will not normally be of the same size relative to any neighboring energy pathway. This axiom still allows a distinct and predetermined symmetrical and balanced stacking arrangement to be created among the amalgamation of the at least two pluralities of energy pathways.

In FIG. 16, embodiment 7979 is shown in a minimal cross-section view as a discrete component form factor of the new concept of relative symmetry balancing of energy pathways and energy pathway pluralities. Basically, a typical new embodiment similar to arrangement 6969 comprises a predetermined stacking formation of various energy pathways, energy pathway main-body portions 80 and/or energy pathway patterns 80 from each one of the complementary and/or differential energy pathways with an interposing positioning of the energy pathway main-body portion 81$s$ and/or electrode patterns 81 of the first plurality of energy pathways and/or the first plurality of shielding, energy pathways 6645, 6635, 6625, and 6615, 6600/6600-IMC, 6610, 6620, 6630, and 6640 of the energy pathway arrangement. It should be noted that a main-body electrode portion 80 and/or 81 respectively, is described excluding possible energy pathway extensions like 79G"X" and/or 6611"X" of a main-body energy pathway portion 81 and/or a main-body energy pathway portion 80, respectively.

This relative symmetrical energy pathway arrangement of all of the main-body energy pathway portion 80$s$ and all of the main-body energy pathway portion 81$s$ minus one main-body energy pathway portion 81 is a result of an energy pathway arrangement balanced with respect to the centrally positioned, and shielding, energy pathway 6600/6600-IMC with its main-body energy pathway portion 81 (the minus one main-body energy pathway portion 81 of the simple equation above).

Thus, at least three pluralities of the energy pathways that can also be described or a variant of the embodiment can be increased and/or sub-sectioned as well into homogenously organized groups and individual energy pathways, which are still substantially responsible for a minimal symmetric-complementary energy pathway and shielding energy pathway combination arrangement like 6969, among others. It should also be noted that depicted in FIG. 16 are the at least three pluralities of the energy pathways arranged spaced apart and positioned in a gradually (relative to the centrally positioned, and shielding, energy pathway 6600/6600-IMC and to the first differential energy pathway pair) in a decreasing size (or step-size) arrangement moving from the centrally positioned, and shielding, energy pathway 6600/6600-IMC and the first differential energy pathway pair 6655BB and 6655BT, internally without showing such a size change externally in the size and/or form factor of the overall component 7979.

Energy pathway main-body portions 80 and 81, respectively, of the various energy pathways partially shown herein are formed with the major, and/or main energy pathway areas taken up by the main-body energy pathway portions 80 and 81 respectively, (not shown from above) of the pluralities of the internal energy pathways in a gradually decreasing (or stepwise) fashion going in at least two directions out and away from the centrally positioned, and shielding, energy pathway 6600/6600-IMC in a symmetrical manner as shown between positions separated apart from each other by the larger central shielding, energy pathway and/or centrally positioned, and shielding, energy pathway 6600/6600-IMC.

Centrally positioned, and shielding, energy pathway 6600/6600-IMC is normally serving as the balancing point of the energy pathway arrangement symmetry. The shielded, (complementary) energy pathway pairings in this case, are found divided within the overall component and energy pathway arrangement starting on from either side of 1FS and 2FS main-body energy pathway portion 81 sides of the 6600/6600-IMC central shielding, energy pathway. In other components, for example, the two main-body energy pathway portion 80$s$/81$s$ energy pathway 'surfaces' or 1FS and 2FS of many of the energy pathways can be found laminated substantially surrounded by a material with predetermined properties 801 (not fully shown).

The new form factor internally of overall component 7979 is excluding the relative size differences of the various energy pathway elongations 79G"X"s and/or 6611 "X"s, respectively, that are needed for an example to be operable for the various respective energy pathways to be operable for conductive coupling to a circuit portion(s) located at the edge 817 of a component 7979, for example, when placed to be used in such a circuit(s). This concept of paired energy pathways changing size relative to neighboring, complementary energy pathways while still maintain shielding by the shielding, energy pathways of the first plurality of energy pathways of the energy pathway arrangement will be seen as going in at least two directions out and away from the centrally positioned, and shielding, energy pathway 6600/6600-IMC in a symmetrical manner. The size change could also be different. In one embodiment, the energy pathways of the first plurality of energy pathways of the energy pathway arrangement could stay the same and/or uniform in size and shape, among other physical properties, much like a multi-functional conductive shielding, energy pathway structure which could be similar in uniformity to an embodiment portion 19900 as shown in FIG. 14, for example.

Energies (not shown) propagating simultaneous along paired and shielded, (complementary) energy pathways of the second plurality of energy pathways, 6685BB, 6665BB, 6655BB, and 6675BB, as well as with the third plurality of energy pathways, 6675BT, 6655BT, 6665BT, and 6685BT can be utilizing either a bypass and/or a feed-thru (not shown) energy propagation modes. Thus, a predetermined pattern of uniform and symmetrical complementary paired differential, energy pathways (or just, conductors), and/or uniform and symmetrical complementary paired energy pathways of the second plurality of energy pathways, 6685BB, 6665BB, 6655BB, and 6675BB, as well as with the third plurality of energy pathways and/or shielded, energy pathways, shielded, electrodes (or just, conductors), 6675BT, 6655BT, 6665BT, and 6685BT that are physically parallel to one another respectively, so to be located relative to one another respectively, on opposite sides 1FS and 2FS of the centrally arranged, shielding, energy pathway 6600/6600-IMC.

A setback alignment scheme following alignments designated 40, 41, 42, 43, 44, 45, 46, 47, for example is fully contemplated by the applicant so that 6645, 6635, 6625, and 6615, 6600/6600-IMC, 6610, 6620, 6630, and 6640 and all other shielding, energy pathways, shielding, electrodes (or just, shield conductors) of the first plurality of energy pathways of the energy pathway arrangement, as well as the shielded, (complementary) energy pathways of the second plurality of energy pathways, 6685BB, 6665BB, 6655BB, and 6675BB, as well as with the third plurality of energy pathways, 6675BT, 6655BT, 6665BT, and 6685BT are not necessarily matched in size of the main-body energy pathway portion 80$s$ to the respective neighboring complementary and/or differential main-body energy pathway portion 80$s$ of these shielded, energy pathways, shielded, electrodes (or just, conductors).

In FIG. 16, a (relative to zero-based) O-degree alignment 001 of the perimeter edge 803(s) of the shielded, (complementary) energy pathways, shielded, electrodes (or just, conductors) of the first (complementary) energy pathway pair 6655BB and 6655BT can be determined. This is also the case for a (relative to zero-based) Ø-degree alignment 002 of the common aligned edges 805's of the shielding, energy pathways for the first plurality of shielding, energy pathways of FIG. 1, FIG. 2, or FIG. 14.

In the case of FIG. 16, the relative (relative to zero-based) Ø-degree alignment 002 of the 805 edging of 6600/6600-IMC relative to the (relative to zero-based) Ø-degree alignment 001 of the edges 803 of the shielded, (complementary) energy pathways, shielded, electrodes (or just, conductors) of the first (complementary) energy pathway pair 6655BB and 6655BT. With both of the (relative to zero-based) Ø-degree alignments 001 and 002 established, one can now determine or in most cases see a non-Ø-degree (relative to zero-based), non-parallel alignment relationship shown to exist between the three pluralities of energy pathways with the relative angles of 500T/500B and the 550T/550B noting the now angled relationship of the remaining members of the energy pathways from all of the pluralities of energy pathways still maintain a substantially relative, parallel relationship among one another for all of the three pluralities.

A non-Ø-degree (relative to zero-based), non-parallel alignment relationships also established when compared to the Ø-degree (relative to zero-based) alignment relationship that each the first three energy pathways of the energy pathway arrangement that includes a central shielding, energy pathway 6600/6600-IMC and (complementary) energy pathways of the first shielded, (complementary) energy pathway pair 6655BB and 6655BT. This relative complementary difference on each side of the central shielding, energy pathway 6600/6600-IMC reveals any non-Ø-degree (relative to zero-based) alignment energy pathway edge relationship can vary from a Ø-degree (relative to zero-based) alignment relationship to be always relative to the first three energy pathways of the energy pathway arrangement that includes a central shielding, energy pathway 6600/6600-IMC and shielded, (complementary) energy pathways of the first shielded, (complementary) energy pathway pair 6655BB and 6655BT. Thus the sandwiching together of the central shielding, energy pathway or centrally positioned, and shielding, energy pathway 6600/6600-IMC of the energy pathway arrangement with the first shielded, (complementary) energy pathway pair 6655BB and 6655BT helps to establish the (relative to zero-based) Ø-degree alignment references 001 and 002 that in-turn helps determine the 'after manufacturing' variant of the non-Ø-degree (relative to zero-based) non-parallel alignment relationship now marked 500T/500B and the 550T/550B in FIG. 16 to determine the degree of the off-zero alignment relationship of the energy pathway scheme depicted by alignments 40, 41, 42, 43, 44, 45, 46, 47, for example. It should be noted that repeating shapes and sizes of the various energy pathways within each plurality is always allowable as long as a corresponding, complementary energy pathway is found of a corresponding, complementary plurality of energy pathways.

Thus, a relative pairing concept and a setback or relative common edge alignment concept scheme of all of the pluralities of energy pathways extends even further to include the 6645, 6635, 6625, and 6615, 6600/6600-IMC, 6610, 6620, 6630, and 6640 as seen in FIG. 16, for example which uses common edge 805 alignments 44, 45, 46 and 47 so as long as each energy pathway arrangement example 6969 or embodiment variation in a component like 7979 could comprise certain relative setback areas (814, 814F etc. when needed) still axiomatic to a centered, commonly shared, shielding, electrode pathway 6600/6600-IMC when the energy pathways are manufactured as part of the arrangement 7979. (a layering 6600/6600-IMC could be a functioning starting point relative to any subsequent conductive layerings or conductive deposits, but not necessarily an embodiment manufacturing, first starting point).

In larger energy pathway arrangement stacked ups (not shown) of arrangement 6969 or embodiment, like 7979 of FIG. 16 by looking at a cross-section of an energy pathway arrangement example 6969 or embodiment and observing shielding, energy pathway 6645, 6635, 6625, and 6615, 6600/6600-IMC, 6610, 6620, 6630, and 6640 that are operable for shielding the four energy pathway pairs, 6685BB and 6685BT, 6675BB and 6675BT, 6665BB and 6665BT, 6655BB and 6655BT (all of which could be split-electrodes) that are in place and working out respectively, from the center, common-shared, shielding, electrode pathway 6600/6600-IMC, as one could observe a difference (other material elements of 6969 are omitted in this portion of the disclosure for concept clarity reasons) with a second pairing of same sized complementary shielded, energy pathways 6665BB and 6665BT as opposed to the first pairing of the complementary energy pathways 6655BB and 6655BT as appearance shows in FIG. 16.

Thus, a typical device or typical new embodiment is normally proportionally and symmetrically balanced with proportionally reduced or enlarged same-sized paired complementary energy pathways 6655BB and 6655BT. One sees complementary angles 500B and 500T as just complementary angles of an incline relative to a combined Ø-degree (relative to zero-based) parallel alignment relationship 001 and 002 of the first three energy pathways of the arrangement as represented by two differential energy pathways sandwiching the central shielding, energy pathway or centrally positioned, and shielding, energy pathway 6600/6600-IMC of the energy pathway arrangement, as well.

Since angles 500B and 500T, as well as 550B and 550T enjoy the same, relative but complementary distance spacing as one moves away from the centrally positioned, and shielding, energy pathway 6600/6600-IMC with two or more pairings positioned as part of the arrangement, the setting back or setting forward (not shown) creates the common edge alignments 40, 41, 42, 43, 44, 45, 46, 47 are not necessarily perpendicularly or vertically aligned relative to a Ø-degree (relative to zero-based) alignment relationship of the first three energy pathways of the arrangement as represented by two differential energy pathways sandwiching the central shielding, energy pathway or centrally positioned, and shielding, energy pathway 6600/6600-IMC of the energy pathway arrangement, but they could be.

One is offered an additional energy pathway arrangement example 6969, or variation 7979 that still follows the general principals of a universal multi-functional conductive shielding, energy pathway structure that still uses a faraday-like shielding, energy pathway architecture with stacked conductive hierarchy progression. This concept of relative pairing is included for almost any predetermined energy pathway arrangement or embodiments like 6969 and 7979. This includes predetermined energy pathway arrangement or embodiments that do not use the outer, paired, electrically opposing complementary energy pathways as described in other co-owned and co-pending disclosures or the outer shielding or image energy pathways 6655T/6655T-IMO and 6650B/6650B-IMO as shown in FIG. 14, but not shown in FIG. 16. It should be noted that almost any predetermined energy pathway arrangement or embodiments like 6969 and 7979 or others, could inverse any of the tapering of setback or even 'set-forward' scheme(s) and alignments 40, 41, 42, 43, 44, 45, 46, 47 or any variation of these set back configurations or even opposite configuration. This and many other schemes are all possible and are fully contemplated by the applicant.

As long as the various relative pairings are matched and symmetrically paired for complementary opposed alignment and maintain the other distance relationships and setbacks in a relative paired or relative balancing symmetrical relationship, an energy pathway arrangement example 6969, or embodiment variation in a component like 7979 will operate in a predetermined electrical conditioning manner with respect to various energy conditioning functions required by the user. This relative balancing, relative "twin pairing" and/or relative "mirror-like" pairing and/or relative, reverse- "mirror-like" element paring or match-off and/or relative pair balancing, are all a novel improvement over previous embodiments and an structural energy pathway improvement that will produce many unexpected results and will be viable as long as electrostatic shielding function (not shown) of universal faraday shielding, energy pathway architecture with stacked conductive hierarchy progression comprising the paired, electrically opposing complementary or shielded, (complementary) energy pathways is not compromised.

The total sum of the shielded, (complementary) energy pathways of the first and the second plurality of energy pathways respectively will also normally be separated electrically in an even manner with equal number of pathways used simultaneously but with half the total sum of the individual complementary conductive energy pathways electrically out of phase from the oppositely positioned groupings. Microns or less of a substance 801 or material with predetermined properties 801 such as a dielectric, for example, is normally found as performing an insulating, and/or a separation and/or an interposing function which in almost all cases prevents direct physical conductive coupling between non-member energy pathways of any plurality of energy pathways within a energy pathway arrangement similar to arrangement 6969, for example or, itself or its' AOC.

An energy pathway arrangement similar to arrangement 6969, for example, also provides a means of lowering overall circuit impedance at the portion of the circuit arrangement occupied by a typical new embodiment similar to arrangement 6969, which is facilitated by providing interaction of propagating energies found along portions of the shielded, mutually opposing and paired conductive energy pathways that are maintained in what is essentially, a immured and alignment relationship, respectively, within the shielding, energy pathway architecture. The means of lowering overall circuit impedance at the portion of the circuit arrangement occupied by a typical new embodiment similar to arrangement 6969 is always with respect to each circuits' energy source and each circuit's energy-utilizing load when conductively attached or coupled (conductively) and energized relative to the circuit's voltage reference node or relative shielding, energy pathway which is conductively isolated from the at least paired pluralities of energy pathways that are shielded, yet conductively coupled to the first plurality of energy pathways of a typical new embodiment similar to arrangement 6969 which together in almost any variation used as a portion of the low circuit impedance pathway by portions of propagating energy.

At the same time, a entirely different group of mutually opposing and paired conductive energy pathway elements can be maintained in what is essentially, another alignment relationship respectively to one another and yet be physically parallel and/or perpendicular to the first set of parallel mutually opposing and paired conductive energy pathway elements simultaneously, each circuit set of parallel mutually opposing and paired conductive energy pathway elements working in conjunction but separately with minimal deferential influence upon one another just described.

The user has many options of conductive connections or coupling to an external energy pathway utilized with the first plurality of energy pathways of the energy pathway arrangement. This external energy pathway can be utilized as an alternative energy return path in terms of a third energy pathway or simply for common conductive reference node for an energized circuit(s).

In some applications, it might be desired by the user to externally couple to additional numbers of paired external conductive energy pathways not of the original differential conductive energy pathways to take advantage of the lowering of circuit impedance occurring within the energy pathway arrangement. This low impedance path phenomenon can occur by using alternative or auxiliary circuit return pathways, as well. In many cases, at energization, the various internal and simultaneous functions occurring to create a low impedance energy pathway along the shielding, energy pathways found internal to at least the AOC portion of a typical new embodiment variant which are used by portions of energy propagating along the various differential or shielded, (complementary) energy pathways, simultaneously, in essentially at least an opposite and parallel manner within the shielding, energy pathway architecture and/or arrangement as it normally operates in a position that is normally physically placed in between at least the various conductive energy pathways, running from energy source or sources and the energy-utilizing load loads and back as conductively attached or coupled (conductively) into an energized circuit or circuits.

Each respective differential conductive energy pathway pair can be able utilize a relative circuit "0" Voltage reference image node or "0" Voltage common conductive energy pathway node created along the internal shielding, energy pathway comprising the shielding, energy pathway shields that surround each of the smaller sized differential conductive energy pathways which are almost completely enveloped.

Within normally, but almost any variation of an energy pathway arrangement embodiment, at least three, simultaneous energy conditioning functions are operable to occur as long as the circuit shielding of the active energy pathways within the area footprint of the sandwiching shielding, energy pathways are maintained and contained or substantially contained within the AOC:

1.) A physical shielding cage-like effect or electrostatic shielding effect function with electrically charged containment of internally generated energy parasitics shielded from the active conductive energy pathways as well as providing a physical protection from externally generated energy parasitics coupling to the same active conductive energy pathways as well as a minimization of energy parasitics is normally attributed to the almost total, energized and physical shielding envelopment utilizing the insetting of the active energy pathways within the area foot print of the sandwiching shielding, energy pathways;

2.) The interposition of physical conductive material with portions of material having predetermined properties 801 allows for a very small distance of separation of oppositely charged active conductive energy pathways contained or substantially contained within sandwiching and shielding, energy pathways of influence one another in a controlled manner.

3.) Mutual energy flux field cancellation of various portions of energy portions propagating in a manner along paired and electrically opposing complementary electrode or conductive energy pathways along with simultaneous stray energy parasitic complementary charged suppression and physical shielding and electrical shielding containment because magnetic flux energy travels within a transmission line or line conductor or layer in a manner where if the RF return path is normally parallel and adjacent to its corresponding Source trace, the magnetic flux energy observed in the return path related to the Source path will usually be in the opposing directions. When one combines mutually opposing fields together, a cancellation or minimization effect is normally observed. The closer the mutually opposing or shielded, (complementary) energy pathways are brought together, the better the cancellation effect.

To re-state, a typical embodiment example, comprises relative, balanced, complementary, and symmetrical arrangement of predetermined energy pathways and material portions 801, positioned with respect to having balanced, complementary and symmetrical portions of these elements operable to sandwich a centrally positioned, shielding, energy pathway such as 800/800-IMC, for example.

On opposite sides of a formation of various energy pathways, energy pathway main-body portions, such as energy pathway main-patterns 80 for shielded, complementary electrodes and/or shielded, (complementary) energy pathways and 81 for shield or shielding electrodes, so that main-body energy pathway portions 80 and 81, (excluding energy pathway extensions 79"X" of main-body energy pathway portion 80 and/or energy pathway extensions 79G"X" of main-body energy pathway portion 81 for this portion of the disclosure) are in a relative balanced and complementary-symmetrical positioning with respect to a center shielding, energy pathway which in one case is shield or shielding, energy pathway 6600/6600-IMC, for one example.

A relative balanced and complementary-symmetrical arrangement with respect to the center, energy pathway 8"XX" or 6600/8"XX"-IMC or 6600-IMC, comprises the plurality of the energy pathways as groups and individuals as well as pairs that are positioned to decrease (or in some other variants not shown, increase) in overall size and/or conductive area or portion by graduating, and/or stepped manner (and/or stepwise manner) in a predetermined sequence from a predetermined central portion of a typical embodiment (This description is of a already completed embodiment example and is not to say be taken as a manufacturing sequence (as the arrangement is operable for any manufacturing sequence or manner that will yield the desired end result, per-say), but as described only in appearance to be graduating in a size difference as to appear a distance away in a stacking and/or layered fashion from a predetermined center towards outer boundary portions per a 3-dimensional result using materials 799 in layered combination with portions of a material having properties 801 and/or material portions 801, for example.

From a review of the numerous embodiments it should be apparent that the shape, thickness or size may be varied depending on the electrical application derived from the arrangement of shielding, electrodes and attachment structures to form at least (2) conductive containers that subsequently create at least one larger singly conductive and homogenous cage-like shield structure, which in turn contains portions of either uniform and/or heterogeneously mixed but paired equally-sized electrodes or paired energy pathways in a discrete or non-discreet operating manner within at least one or more than one, energized circuit(s).

As can be seen, just a small selection of the possible energy-conditioning arrangement(s) and variants have been shown and described, and it is clearly conveyed and understood that other modifications and variations may be made thereto by those of ordinary skill in the art without departing from the spirit and scope of a typical energy-conditioning arrangement(s). In closing, it should also be readily understood and appreciate that various aspects and element limitations of the various embodiments and their elements shown may be interchanged either, in whole, and/or in-part, and/or by modification such that the foregoing description is by way of example only, and is not intended to be limitative of the energy-conditioning arrangement(s) in whole or as further described in the appended claims forthcoming.

What is claimed:

1. An energy conditioner characterized by: a plurality of superposed electrodes that are conductively coupled to one another; a plurality of electrodes of uniform shape including at least a first and a second pair of superposed electrodes which are conductively isolated from each other; wherein the first pair of superposed electrodes is larger than the second pair of superposed electrodes; wherein at least each electrode of the first pair of superposed electrodes is arranged conductively isolated from the other; wherein any one electrode of the plurality of superposed electrodes is larger than any one electrode of the plurality of electrodes; and wherein the first and the second pair of superposed electrodes are each arranged shielded and orientated from transverse positions relative to the other.

2. The energy conditioner of claim 1, further characterized by a material having properties; and wherein the plurality of superposed electrodes and the plurality of electrodes are spaced apart from one another by at least the material having properties.

3. The energy conditioner of claim 1, further characterized by at least two outer, superposed electrodes.

4. An energy conditioner characterized by: a plurality of shield electrodes, including a first, a second and a third shield electrode conductively coupled to each other; at least one pair of shielded electrodes including a first and a second shielded electrode arranged complementary and symmetrical in orientation to one another; wherein the plurality of shield electrodes consist of an odd integer number of shield electrodes; wherein the first shielded electrode is arranged above the first shield electrode, and wherein the second shielded electrode is arranged below the first shield electrode, and wherein the second shield electrode is arranged above the first shielded electrode, and the third shield electrode is arranged below the second shielded electrode; wherein each shielded electrode of the one pair of shielded electrodes is smaller than any one shield electrode; and wherein at least one shield electrode of the plurality of shield electrodes is operable for receiving a voltage bias.

5. The energy conditioner of claim 4, wherein the at least one pair of shielded electrodes are conductively isolated from one another; and wherein the at least one pair of shielded electrodes and the plurality of shield electrodes are each spaced apart from one another by at least a material having properties.

6. The energy conditioner of claim 4, further characterized by at least two outer, shield electrodes.

7. An energy conditioner characterized by: a plurality of shielding, electrodes, including a first, a second and a third shielding, electrode that are conductively coupled to each other; at least one pair of electrodes including a first and a second electrode arranged in reverse-mirror, orientation manner relative to one another; wherein the plurality of shielding, electrodes consist of an odd integer number of shielding, electrodes; wherein the first electrode is arranged above the first shielding, electrode, and wherein the second electrode is arranged below the first shielding, electrode, and wherein the second shielding, electrode is arranged above the first electrode, and the third shielding, electrode is arranged below the second electrode; wherein each electrode of the at least one pair of electrodes is smaller than any one shielding, electrode of the energy conditioner; wherein the plurality of shielding, electrodes at least shields the at least one pair of electrodes from one another; and wherein the plurality of shielding, electrodes and the at least one pair of electrodes are annular-shaped.

8. The energy conditioner of claim 7, wherein the one pair of electrodes are conductively isolated from one another; and wherein the at least one pair of electrodes and the plurality of shielding, electrodes are each spaced apart from one another by at least a material having properties.

9. The energy conditioner of claim 7, further characterized by at least two outer, shielding, electrodes.

10. The energy conditioner as in one of claims 2–8, in which the material having properties is selected from the group consisting of a material having dielectric properties, a material having varistor properties, and a material having ferrite properties.

11. An energy conditioner characterized by: a plurality of superposed shielding, electrodes that are conductively coupled to one another; a first plurality of co-planar shielded, electrodes; a second plurality of co-planar shielded, electrodes; and wherein the first and the second plurality of co-planar shielded, electrodes are conductively isolated from one another.

12. The energy conditioner of claim 11, wherein the first and the second plurality of co-planar shielded, electrodes are physically shielded from one another.

13. The energy conditioner as in one of claims 1, 4, 7 or 11, in which the energy conditioner is at least operable as a feedthru capacitor.

14. The energy conditioner as in one of claims 1, 4, 7 or 11, in which the energy conditioner is at least operable as a voltage divider.

15. The energy conditioner as in one of claims 1, 4, 7 or 11, in which the energy conditioner is at least coupled to a component selected from the group of components consisting of a substrate, a motor, and a circuit.

16. The energy conditioner as in one of claims 1, 4, 7 or 11, in which the energy conditioner prevents escape of portions of near field electrical flux from within the energy conditioner.

17. The energy conditioner as in one of claims 1, 4, 7 or 11, in which the energy conditioner is operable to be utilized for sustained, electrostatic shielding.

18. The energy conditioner as in one of claims 1, 4, 7 or 11, in which the energy conditioner is annular shaped.

19. The energy conditioner as in one of claims 1, 4, 7 or 11, in which the energy conditioner is annular shaped and operable for electrostatic shielding.

20. The energy conditioner as in one of claims 1, 4, 7 or 11, in which the energy conditioner is annular shaped; and wherein the energy conditioner further comprises at least one conductive aperture.

21. The energy conditioner as in one of claims 1, 4, 7 or 11, in which the any one electrode of the energy conditioner is a split electrode.

22. The energy conditioner as in one of claims 1, 4, 7 or 11, in which the energy conditioner is energized.

23. The energy conditioner as in one of claims 1, 4, 7 or 11, in which the energy conditioner is operable as a portion of a sensor.

24. The energy conditioner as in one of claims 1, 4, 7 or 11, in which the energy conditioner is operable as a portion of an operational amplifier.

25. The energy conditioner as in one of claims 1, 4, 7 or 11, in which the energy conditioner is at least operable as a bypass capacitor.

\* \* \* \* \*

UNITED STATES PATENT AND TRADEMARK OFFICE
Certificate

Patent No. 7,274,549                                                       Patented: September 25, 2007

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: William M. Anthony, Erie, PA (US); and Anthony A. Anthony, Erie, PA (US).

Signed and Sealed this Eighth Day of May 2012.

*JINHEE J. LEE*
*Supervisory Patent Examiner*
*Art Unit 2835*
*Technology Center 2800*

UNITED STATES PATENT AND TRADEMARK OFFICE
Certificate

Patent No. 7,274,549 B2            Patented: September 25, 2007

On petition requesting issuance of a certificate for correction of inventorship pursuant to 35 U.S.C. 256, it has been found that the above identified patent, through error and without any deceptive intent, improperly sets forth the inventorship.
  Accordingly, it is hereby certified that the correct inventorship of this patent is: William M. Anthony, Erie, PA (US); and Anthony A. Anthony, Erie, PA (US)

Signed and Sealed this Twenty-ninth Day of May 2012.

<div style="text-align:right">

JINHEE J. LEE
*Supervisory Patent Examiner*
Art Unit 2835
Technology Center 2800

</div>